United States Patent [19]

Yoshida

[11] Patent Number: 5,991,902
[45] Date of Patent: Nov. 23, 1999

[54] MEMORY APPARATUS AND DATA PROCESSOR USING THE SAME

[75] Inventor: Toyohiko Yoshida, Itami, Japan

[73] Assignee: Mitsubishi Denki Kabushiki Kaisha, Japan

[21] Appl. No.: 08/812,464

[22] Filed: Mar. 6, 1997

Related U.S. Application Data

[62] Division of application No. 08/403,558, Mar. 13, 1995, Pat. No. 5,644,699, which is a continuation of application No. 07/883,582, May 14, 1992, abandoned.

[30] Foreign Application Priority Data

Aug. 7, 1991 [JP] Japan .................................. 3-197688

[51] Int. Cl.[6] .................................................. G11C 29/00
[52] U.S. Cl. ........................... 714/710; 711/145; 711/113
[58] Field of Search .............................. 371/21.1, 21.2, 371/40.1, 10.2, 10.3, 21.6; 364/247.3, 245.5, 245.9, 365.3, 243.41, 964.2, 243.4, 243.7, 245.3, 246.3, 268.3, 268.5, 943.91, 944, 944.2, 944.3, 966.4, 970.1; 395/182.13, 182.19, 183.01, 183.05, 183.18, 184.01, 185.02, 185.07, 185.06, 182.03; 711/3, 111, 112, 113, 129, 133, 134, 144, 158

[56] References Cited

U.S. PATENT DOCUMENTS

| | | | |
|---|---|---|---|
| 4,357,656 | 11/1982 | Saltz et al. | 395/465 |
| 4,648,075 | 3/1987 | Segawa et al. | 365/200 |
| 4,733,394 | 3/1988 | Giebel | 365/201 |
| 4,736,373 | 4/1988 | Schmidt | 371/21.6 |
| 4,757,474 | 7/1988 | Fakushi et al. | 365/189 |
| 4,827,452 | 5/1989 | Toyama et al. | 365/200 |
| 5,019,971 | 5/1991 | Lefsky et al. | 395/182.03 |
| 5,157,664 | 10/1992 | Waite | 371/21.2 |
| 5,206,831 | 4/1993 | Wakamatsu | 365/200 |
| 5,231,604 | 7/1993 | Watanabe | 364/189.05 |
| 5,267,242 | 11/1993 | Lavallee et al. | 395/182.05 |
| 5,278,839 | 1/1994 | Matsumoto et al. | 371/21.2 |
| 5,293,386 | 3/1994 | Muhmenthaler et al. | 371/21.1 |
| 5,353,253 | 10/1994 | Nakajima | 364/491 |
| 5,471,415 | 11/1995 | McClure | 364/253 |
| 5,509,132 | 4/1996 | Matsuda et al. | 395/403 |
| 5,550,974 | 8/1996 | Pennington et al. | 395/183.18 |

FOREIGN PATENT DOCUMENTS

| | | |
|---|---|---|
| 59-127286 | 7/1984 | Japan . |
| 62-38599 | 2/1987 | Japan . |
| 62-250599 | 10/1987 | Japan . |
| 1-177656 | 7/1989 | Japan . |
| 3160696 | 7/1991 | Japan . |
| 3160697 | 7/1991 | Japan . |
| 3160698 | 7/1991 | Japan . |
| 3162798 | 7/1991 | Japan . |

OTHER PUBLICATIONS

"System, Process and Design Implications of a Reduced Supply voltage Microprocessor," R. Allmon, et al., ISCC Digest of Technical Papers, pp. 48–49, Feb. 1990 (vol. 33).

Primary Examiner—Trinh L. Tu
Attorney, Agent, or Firm—Townsend and Townsend and Crew LLP

[57] ABSTRACT

A memory apparatus and a data processor using the same comprises, a memory mechanism, having a signal input terminal into which a predetermined signal is inputted, a memory unit consisting of first, second and third memories, a fourth memory and a control unit which replaces the first or second memory with the third memory by switching electrical connections between the memories of the memory unit according to information written into the fourth memory, and furthermore, an operation unit which diagnoses failures in the memory mechanism in case the predetermined signal is inputted from the signal input terminal, in case the failure is diagnosed in the first memory allows the control unit to replace the first memory with the third memory by writing a first value into the fourth memory, and in case the failure is diagnosed in the second memory allows the control unit to replace the second memory with the third memory by writing a second value into the fourth memory. Since the failure in the memory array unit can be relieved, manufacturing yields of the memory apparatus and the data processor including the same are improved.

4 Claims, 32 Drawing Sheets

Fig. 4

BYTE: 0      1      2  ------  N+2-1

| --- | RR | Ea | EXTENSION PART OF Ea |

· BASIC FORMAT

· FORMAT OF ADDRESSING MODE
        EXTENSION PART

MEMORY APPARATUS AND DATA PROCESSOR USING THE SAME

This is a Divisional of application Ser. No. 08/403,558, filed Mar. 13, 1995, now U.S. Pat. No. 5,644,699, which is a Continuation of application Ser. No. 07/883,582, filed May 14, 1992, now abandoned.

BACKGROUND OF THE INVENTION

1. Field of the Invention

The present invention relates to a memory apparatus and a data processor including the same, or more particularly, relates to a memory apparatus and a data processor using the same which is capable of relieving partial failures by including a spare circuit.

2. Description of the Related Art

In recent years, such a problem was encountered that the probability of defects in a data processor due to failures in a memory increases, as the highly efficient and functional data processor is realized and thereby the capacity of memory of the data processor becomes larger. Particularly, in the data processor such as a microcomputer in which an operation unit, a control unit and a memory unit of the data processor are installed on a single LSI chip, or a cache memory incorporating microprocessor in which the high speed cache memory is installed on the same LSI as the operation unit, since yield of the memory unit controls yield of the whole LSI as the memory capacity installed on the same LSI increases, as far as the memory yield is not improved the yield of the whole LSI is not improved.

In order to prevent deterioration in yields of the memory unit of the LSI, a technique which incorporates a redundant memory circuit in the LSI as a spare circuit, and replaces a defective circuit with the spare circuit by disconnecting wirings by a polysilicone fuse or laser has been proposed. In a non-volatile memory, a technique which replaces a defective circuit with the spare circuit by setting replacement information in a non-volatile latch without disconnecting the wirings by the polysilicone fuse or laser has been proposed, for example, as "Non-volatile Semiconductor Memory", Japanese Patent Application Laid-Open No. 3-162798 (1991).

Meanwhile, a memory which incorporates a diagnosis circuit for diagnosing failures of the memory and a replacement circuit for replacing the defective portion with a spare circuit in the above-mentioned non-volatile semiconductor memory, operates the chip under a self-testing mode for diagnosis and relieves the defective circuit by the operation of the chip element by setting replacement information in the non-volatile latch is also proposed, for example, as "Non-volatile Semiconductor Memory", Japanese Patent Application Laid-Open No. 3-160696 (1991), "Non-volatile Semiconductor Memory", Japanese Patent Application Laid-Open No. 3-160697 (1991) and "Non-volatile Semiconductor Memory", Japanese Patent Application Laid-Open No. 3-160698 (1991).

A process which includes a spare circuit in a built-in cache of a microprocessor and relieves the defective circuit of the cache by disconnecting the fuse by laser has also been proposed already, and is particularly described, for example, in "System, Process, and Design Implications of Reduced Supply Voltage Microprocessor" by R. Allmonn etc. DIGEST OF TECHNICAL PAPERS, 1990 IEEE ISSCC, February 1990.

In the case of replacing the defective circuit with the spare circuit by the physical processing such as disconnecting the wirings by the polysilicone fuse and laser, the physical processing which is not executed as the usual system operation is necessitated after testing the possibility of relief of the system determined as defects. Also, in case of replacing the defective circuit with the spare circuit by setting replacement information in a non-volatile latch, though an additional cost is low when the non-volatile latch can be constituted as same as the other circuit as disclosed in "Non-volatile Semiconductor Memory" Japanese Patent Application Laid-Open No. 3-162798 (1991), in a system in which the non-volatile memory is not used in a usual operation, the non-volatile memory must be added just for the purpose of relieving the defective circuit. Particularly, when manufacturing a non-volatile memory or a data processor installed on a single LSI, a special process for installing the non-volatile latch must be added.

In a conventional process of replacing the defective circuit with the spare circuit by the physical processing, it was necessary to take treatment externally other than the usual operation for diagnosing the failures and replacing the defecting circuit with the spare circuit. In the case of using the non-volatile latch, since replacing information of the non-volatile latch for replacing the defective circuit with the spare circuit is also erased when rewriting data stored in the non-volatile latch by irradiating ultraviolet rays, it is always necessary to switch to a self-testing mode for the diagnostic operation and failure relief operation after erasing the memory content. And hence, a system with no failure at all and a system in which the defective circuit is relieved by the spare circuit must be treated somewhat differently in the manufacturing process or in use, and the two systems could not be treated equally.

SUMMARY OF THE INVENTION

The present invention has been devised in view of such circumstances, therefore, it is a primary object thereof to provide a memory apparatus and a data processor using the same, which is capable of diagnosing a volatile memory in reset sequences and switching electrical connections of a circuit to replace with a spare circuit when there is a defective portion.

It is also an object of the present invention to relieve failures in a memory unit of a memory apparatus or a data processor using the same and to improve manufacturing yields.

A first invention of a memory apparatus and a data processor of the present invention comprises, a reset input pin; a data buffer consisting of a memory unit having a first row, a second row and a spare row, and a row decoding unit which decides electrically connecting relationship of the memory unit with a row address by a significant designation bit and a row address associative memory of the rows; and an integer operation unit connected to the data buffer and the reset input pin, having a register, ALU etc., writing data into and reading data from the data buffer and executing comparison operation of the data written into the data buffer and the data read from the data buffer.

In the first invention of the memory apparatus and the data processor of the present invention, when a reset interruption is inputted from the rest input pin, the integer operation unit diagnoses failures in the rows of the data buffer, writes "0" into the first row access significant designation bit and "1" into a spare row access significant designation bit in the case of failure in the first row, and further, replaces the first row with the spare row by writing a first row address into the row address associative memory, writes "0" into a second row access significant designation bit and "1" into the spare row access significant designation bit in the case of failure in the second row, and further, relieves the failure in the data buffer by writing the second row address into the row address associative memory and replacing the second row with the spare row.

A second invention of the memory apparatus and the data processor of the present invention comprises, a reset input pin; a clock input pin;, a data buffer consisting of a memory unit having a first row, a second row and a spare row, and a row decoding unit which decides electrically connecting relationship of the memory unit with a row address by a significant designation bit and a row address associative memory of the rows; and an integer operation unit connected to the data buffer, the clock input pin and the reset input pin, having a register, ALU etc., writing data into the data buffer, reading data from the data buffer and executing comparison operation of the data written into the data buffer and the data read from the data buffer.

In the second invention of the memory apparatus and the data processor of the present invention, when a reset interruption is inputted from the reset input pin, the integer operation unit operates in synchronism with a clock signal inputted from the clock input pin, diagnoses failures in the data buffer, writes "0" into the first row access significant designation bit and "1" into the spare row access significant designation bit in the case of failure in the first row, and further, replaces the first row with the spare row by writing the first row address into a row address associative memory, writes "0" into the second row access significant designation bit and "1" into the spare row access significant designation bit in the case of failure in the second row, and further, replaces the second row with the spare row by writing the second row address into the row address associative memory to relieve the failure and initialize the data buffer, writes "1" into the first row and second row access significant designation bits and "0" into the spare row access significant designation bit in the case of failure in neither the first row nor the second row to initialize the data buffer without relieving the failure, thereby the failure diagnosis and initialization are completed always at a constant clock number regardless of the location and execution of the failure relief.

A third invention of a memory apparatus and a data processor of the present invention comprises, at an integer operation unit, a general purpose register which holds relief operation results of the data buffer at resetting.

In the third invention of the memory apparatus and the data processor of the present invention, by writing the number of failures in the memory unit of the data buffer, a column address and a row address whose failure are relieved into the general purpose register, the reset interruption processing result is held so as to be informed after the reset processing.

A fourth invention of the memory apparatus and the data processor of the present invention comprises, an IROM unit which is connected to the reset input pin, clock input pin and integer operation unit, and includes a ROM holding a $\mu$-program to control the operation of the integer operation unit, and a counter which is connected to the IROM unit and counts the number of clocks required for executing the $\mu$-program.

In the fourth invention of the memory apparatus and the data processor of the present invention, when operating the reset routine stored in the ROM unit for initialization which is associated by the failure diagnosis and failure relief of the data buffer at the reset interruption processing, by constituting such that a maximum clock number necessary for executing the reset routine is inputted to the counter, and at the time point when counted value is decremented to zero in synchronism with the clock the reset sequence is finished, and execution time of the reset routine for the initialization which is associated by the failure diagnosis and failure relief is fixed.

A fifth invention of the memory apparatus and the data processor of the present invention comprises, a memory unit consisting of a plurality of entries constituted by a valid bit, a tag field and a data field, and an access significant designation bit which is connected to the memory unit and responds to the entries of the memory unit, and further comprises, a data cache which judges hit/miss from values of the valid bit and the tag field when accessing the entry in which access validity is indicated by the access significant designation bit, and always judges miss when accessing the entry in which access invalidity is indicated by the access significant designation bit, and an integer operation unit which is connected to the data cache, includes an register, ALU etc., writes data into the data cache, reads data from the data cache and executes comparison operation of the data written into the data cache and the data read from the data cache.

In the fifth invention of the memory apparatus and the data processor of the present invention, the integer operation unit diagnoses failures in the entries of the memory unit used as the data cache, and the integer operation unit, by writing "0" into the access significant designation bit responding to the defective entry and writing "1" into the access significant designation bit defective entry and cuts off the defective portion in the memory unit to relieve the failure in the data cache.

A sixth invention of the memory apparatus and the data processor of the present invention comprises, a reset input pin; a memory unit consisting of a main array of plural rows and a spare row; a row decoding unit having a row address decoding circuit, an associative memory and an access significant designation bit; and an integer operation unit which is connected to the memory unit, row decoding unit and reset input pin.

In the sixth invention of the memory apparatus and the data processor of the present invention, when a reset interruption is inputted from the reset input pin, the integer operation unit writes data into and reads data from buffer to diagnose the memory unit, writes "0" into the access significant designation bit responding to a defective row in the case of failure in a certain row of the main array, writes "1" into the access significant designation bit responding to a non-defective row and the spare row, and writes the row address of the defective row into the associative memory, and the row decoding unit accesses the spare row in lieu of the defective row according to the defective row address and replaces the defective row with the spare row to relieve the failure in the memory unit.

A seventh invention of the memory apparatus and the data processor of the present invention comprises, a reset input pin; a memory unit consisting of a main array of plural columns and a spare column; a data input/output unit which is connected to the memory unit and includes a column address register, a column address decoding circuit and a column multiplexer; and an integer operation unit which is connected to the data input/output unit and the reset input pin.

In the seventh invention of the memory apparatus and the data processor of the present invention, when a reset interruption is inputted from the reset input pin, the integer operation unit writes data into and reads data from the data buffer to diagnose the memory unit, and in the case of failure in a certain column of the main array, writes a column address of a defective column into the column address register, the column address decoding circuit decodes an address of the defective column, the column multiplexer replaces a bit line of the defective column with a spare column bit line and the data input/output unit replaces the defective column with the spare column to relieve the failure in the memory unit.

The above and further objects and features of the invention will more fully be apparent from the following detailed description with accompanying drawings.

BRIEF DESCRIPTION OF THE DRAWINGS

Figure 4:
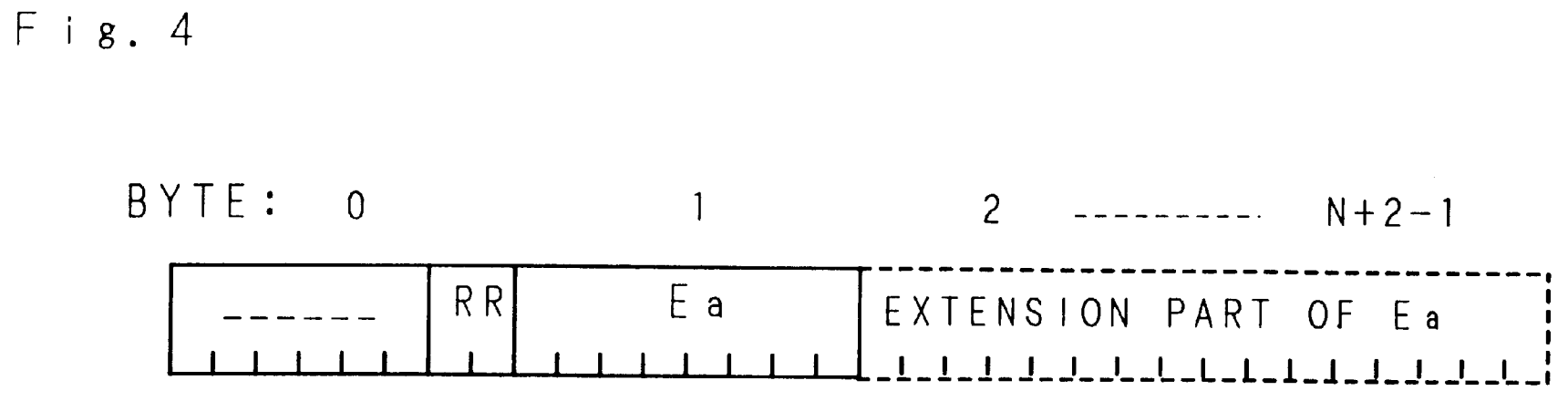

FIG. 4 is a schematic view showing an instruction format of a data processor of the present invention.

DETAILED DESCRIPTION OF THE PREFERRED EMBODIMENTS

In the following, the present invention will be particularly described with reference to the drawings showing its embodiments.

(1) "Configuration of a System using a Data Processor of the Present Invention"

Figure 1:
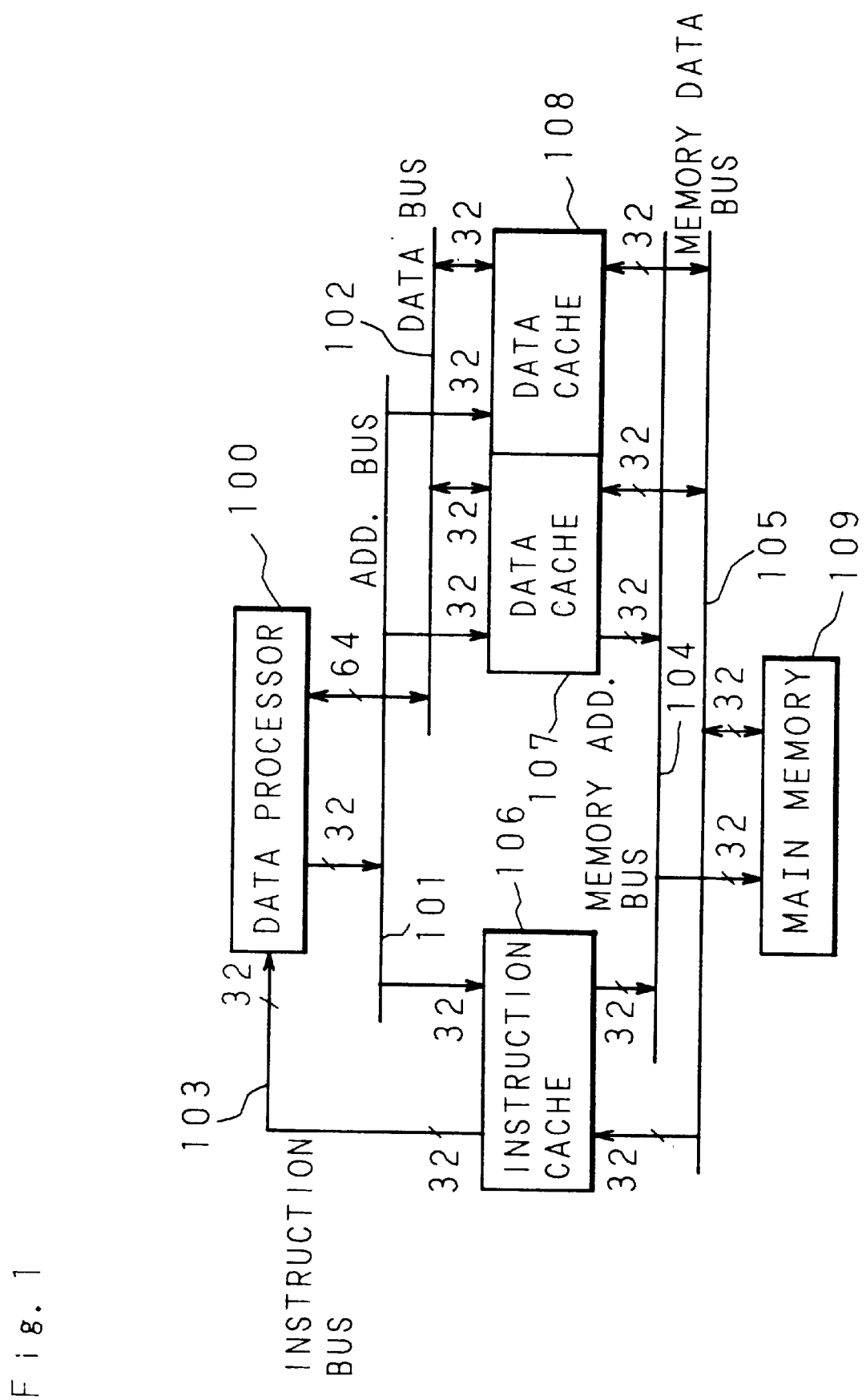
FIG. 1 is a block diagram showing an embodiment of a system configuration using a data processor of the present invention.

FIG. 1 shows a configuration of a system using a data processor of the present invention.

In this configuration, a data processor 100 of the present invention, an instruction cache 106, data caches 107 and 108 and a main memory 109 are connected by an address bus 101, a data bus 102, an instruction bus 103, a memory address bus 104 and a memory data bus 105.

The address bus 101 inputs the address outputted from the data processor 100 of the present invention into the instruction cache 106 and the data caches 107, 108. The instruction bus 103 transfers the instruction code outputted from the instruction cache 106 to the data processor 100 of the present invention. The data bus 102 transfers data outputted from the data processor 100 of the present invention to the data caches 107, 108, or data outputted from the data caches 107, 108 to the data processor 100 of the present invention. The memory address bus 104 transfers the address outputted from the instruction cache 106 or the data caches 107, 108 to the main memory 109. The memory data bus 105 transfers the instruction or data between the main memory 109 and the instruction cache 106 or the data caches 107, 108.

When the instruction cache 106 and the data caches 107, 108 made a miss, the respective cache 106 or 107 arbitrates the bus authority of the memory address bus 104 and the memory data bus 105 to access the main memory 109.

In the data caches 107, 108, on the side of the data processor 100 of the present invention, both the data caches 107 and 108 are operated in cooperation with each other to associate with a 64-bit bus. For each of the 64-bit data, the data cache 107 treats the high-order 32-bit data and the data cache 108 treats the low-order 32-bit data.

The data processor of the present invention can also access an exterior memories by two kinds of single bus mode in which instruction and data are simultaneously accessed by 8-byte data bus or 4-byte data bus, besides dual bus mode shown in FIG. 1 in which the instruction bus and data bus are separately provided.

In the following, an instruction system, a processing mechanism and a built-in memory having a failure relief mechanism of the data processor 100 of the present invention will be explained in detail.

(2) "Instruction of the Data Processor of the Present Invention"

(2.1) "Instruction Format"

An instruction of a data processor of the present invention is formed on a 16-bit unit basis, being variable in length. No instruction with an odd number of bytes is used herein.

The data processor 100 of the present invention has an instruction format system specifically devised for the purpose of highly frequent instructions in a short format. For example, as to a two-operand instruction, two formats are provided; a general format which has basically a configuration of "four bytes+extension part(s)" and allows the utilization of all addressing modes and a short format allowing only the use of a highly frequent instruction and an addressing mode.

FIG. 2, FIG. 3, FIG. 4 and FIG. 5 are schematic views of the instruction format of the data processor 100 of the present invention. The meanings of symbols appearing in the drawings are as follows:

- -: Field wherein operation code is put.
- Ea: Field for generating an operand in a general type 8-bit addressing mode.
- Sh: Field for specifying an operand in a short type 6-bit addressing mode.
- Rn: Field for specifying an operand in a register by the register number.

Figure 2:
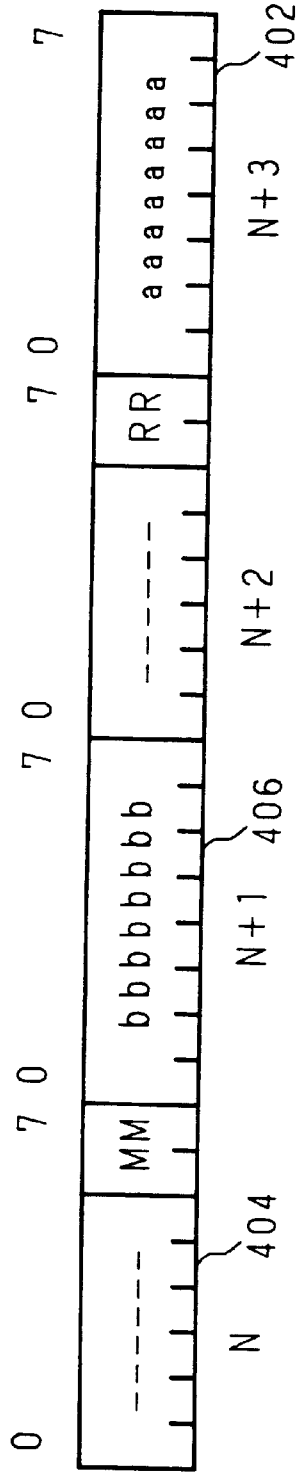
FIG. 2 is a schematic view showing an instruction format of a data processor of the present invention.
Figure 3:
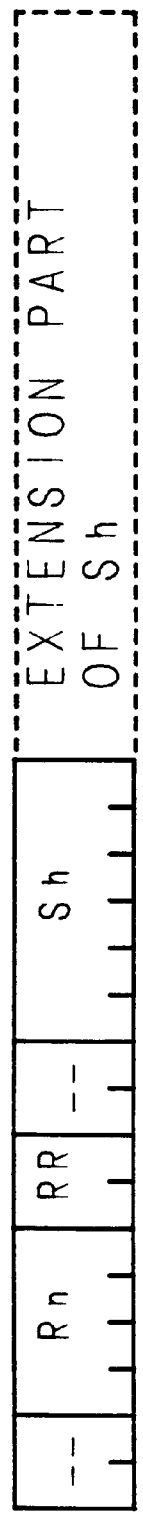
FIG. 3 is a schematic view showing an instruction format of a data processor of the present invention.
Figure 5:
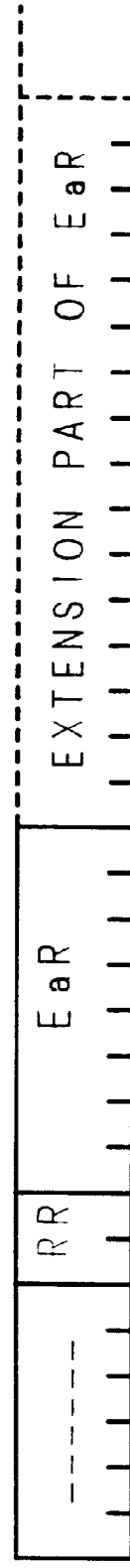
FIG. 5 is a schematic view showing an instruction format of a data processor of the present invention.
Figure 5:
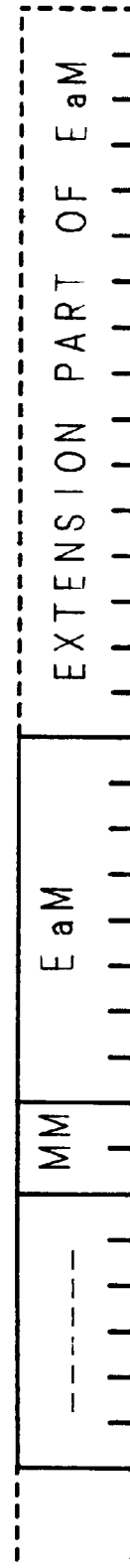

In the format, as shown in FIG. 2, the right side 402 is the LSB side and is high address. The instruction format can be discriminated only after an address N 404 and an address N+1 406 are checked. As described above, this is because of a premise that the instruction is fetched and decoded on a 16-bit (half word) unit basis without fail.

In the data processor 100 of the present invention, in the case with any format, the extension part of Ea or Sh of each operand is sure to be positioned immediately after 16 bits (half word) comprising the basic part of that Ea or Sh. This takes precedence over the immediate data specified implicitly by the instruction or the extension part of the instruction. Accordingly, as to an instruction of four or more bytes, there are cases where the operation code of the instruction is divided by the extension part of Ea.

In addition, the instruction format of the data processor 100 of the present invention is detailed description in Japanese Patent Application Laid-Open No. 64-91253 (1989).

(2.2) "Addressing Mode"

The methods of specifying the addressing mode of the data processor of the present invention include the short type specified by six bits including the register and the general type specified by eight bits.

Where an undefined addressing mode has been specified, or where a combination of addressing modes obviously unsuitable has been specified, a reserved instruction exception is generated, likewise, the case where the undefined instruction has been executed, and exception processing is started. Examples of these cases are the case where the destination is the immediate mode and the case where the immediate mode is used in the specifying field of the addressing mode to be accompanied by address calculation.

The data processor 100 of the present invention supports various addressing modes. Among them, the basic addressing modes supported by the data processor of the present invention include a register direct mode, a register indirect mode, a register relative indirect mode, an immediate mode, an absolute mode, a Program Counter (PC) relative indirect mode, a stack pop mode and a stack push mode.

The register direct mode takes the content of a register intact as an operand.

The register indirect mode takes as an operand the content of the memory whose address is the content of a register.

The register relative indirect mode includes two kinds (16 bits and 32 bits) of the displacement value. Each of them takes as an operand the content of the memory whose address is the value of the content of the register added to the displacement value of 16 bits or 32 bits. The displacement value is handled with a signed binary number.

The immediate mode takes as an operand the bit pattern specified in the instruction code while assuming it intact as a binary number. The size of imm_data is specified in the instruction as the operand size.

The absolute mode includes two kinds of field (16 bits and 32 bits) for showing the address value. Each kind takes as an operand the content of the memory whose address is the bit pattern of 16 bits or 32 bits specified in the instruction code. When the address is shown by 16 bits, the specified address value is sign-extended to 32 bits.

The PC relative indirect mode includes two kinds of field (16 bits and 32) for bits of the displacement value. Each takes as an operand the content of the memory whose address is the value of the content of a program counter whereto the displacement value of 16 bits or 32 bits is added. The displacement value is handled with a signed binary number.

The stack pop mode takes as an operand the content of the memory whose address is the content of a stack pointer (SP). After operand access, the SP is incremented by the operand size. For example, where 32-bit data is handled, the SP is renewed (incremented) by +4 after the operand access. Designating of the stack pop mode for operands of sizes of 8 bits, 16 bits and 64 bits can also be performed, and the SP is renewed (incremented) by +1, +2 and +8, respectively.

The stack push mode takes as an operand the content of the memory whose address is the content of the SP decremented by the operand size. In the stack push mode, the SP is decremented before operand access. For example, when handling 32-bit data, the SP is renewed (decremented) by −4 before operand access. It is also possible to specify the stack push mode for operands of sizes of 8 bits, 16 bits and 64 bits, and the SP is renewed (decremented) by −1, −2 and −8, respectively.

The chained addressing mode is an addressing mode which makes a general purpose register or program counter (PC) value the base address, and adds an index register value or displacement value to the base address to generate address, or execute the memory indirect addressing based on the address.

In addition, the instruction addressing mode of the data processor 100 of the present invention is detailed description in Japanese Patent Application Laid-Open No. 64-91253 (1989) as well as the instruction format.

(3) "Memory Space and Context Switch"

The data processor 100 of the present invention supports two memory spaces, such as a logical space which is the memory space to store program and data and a control space which is the space for various kinds of registers and the memory space to store the data to be operated by some instructions.

The logical space of the data processor 100 of the present invention is the same as the memory space to store programs and data in the conventional data processor.

In the control space of the data processor 100 of the present invention, data can be written/read by a control space operation instruction, and there are two areas as a register area in which various kinds of registers are mapped by the byte address and a data area to store data. Incidentally, the data area of the control space is accessable also by a context switch instruction.

Such an art as to support the logical space and the control space and to hold the context in the control space by the method similar to the data processor of the present invention is disclosed in detail in Japanese Paten Application Laid-Open No. 64-91253 (1989), for example.

(3.1) "Context Block Format"

Figure 6:
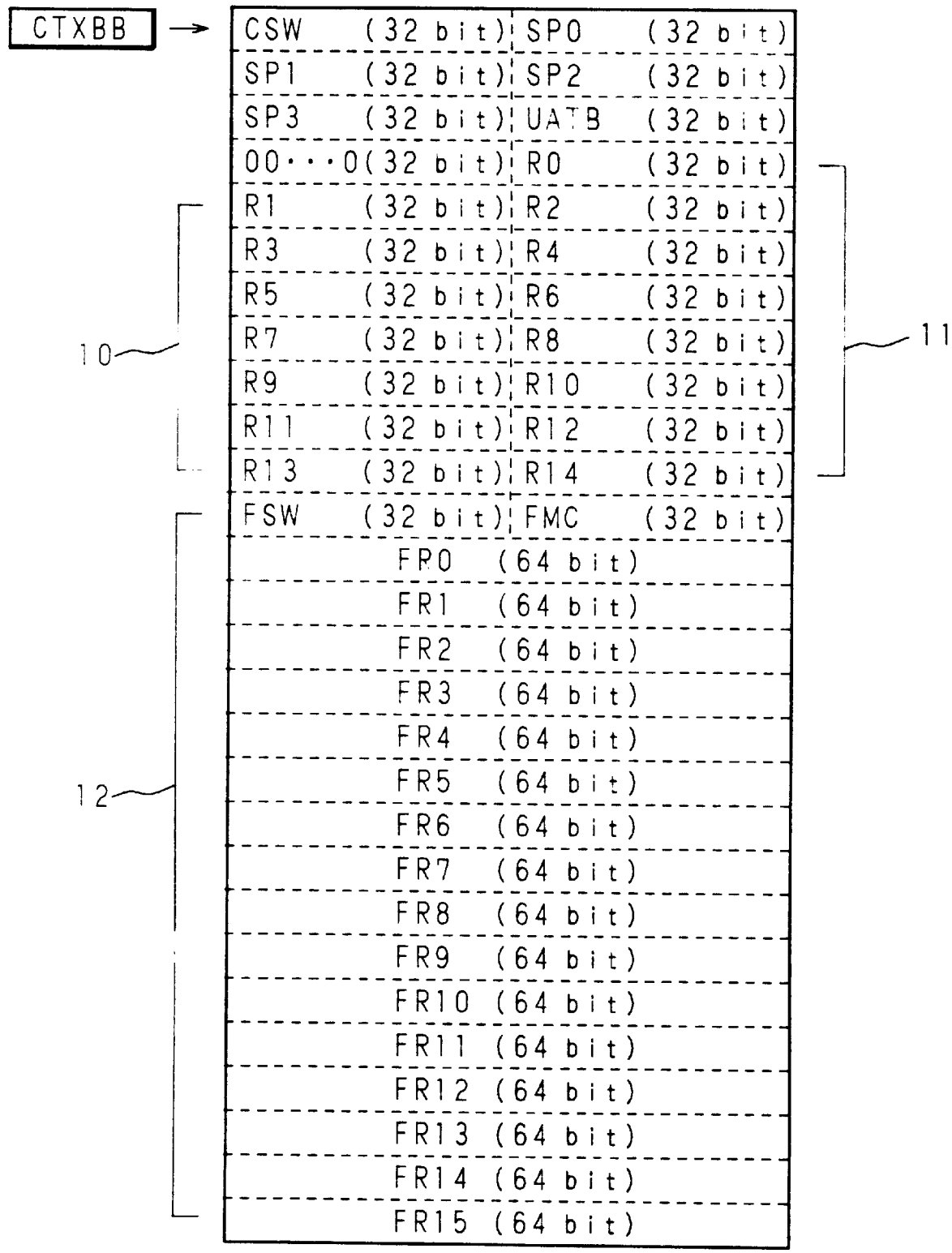
FIG. 6 is a schematic view showing a format of a context block operated by an LDCTX instruction and an STCTX instruction which are a context switch instruction of a data processor of the present invention.

FIG. 6 is a schematic view to illustrate a format of the context block to be operated by an LDCTX instruction and an STCTX instruction which are the context switching instructions of the data processor of the present invention. The start address of the context block is held in a CTXBB register.

Figure 7:
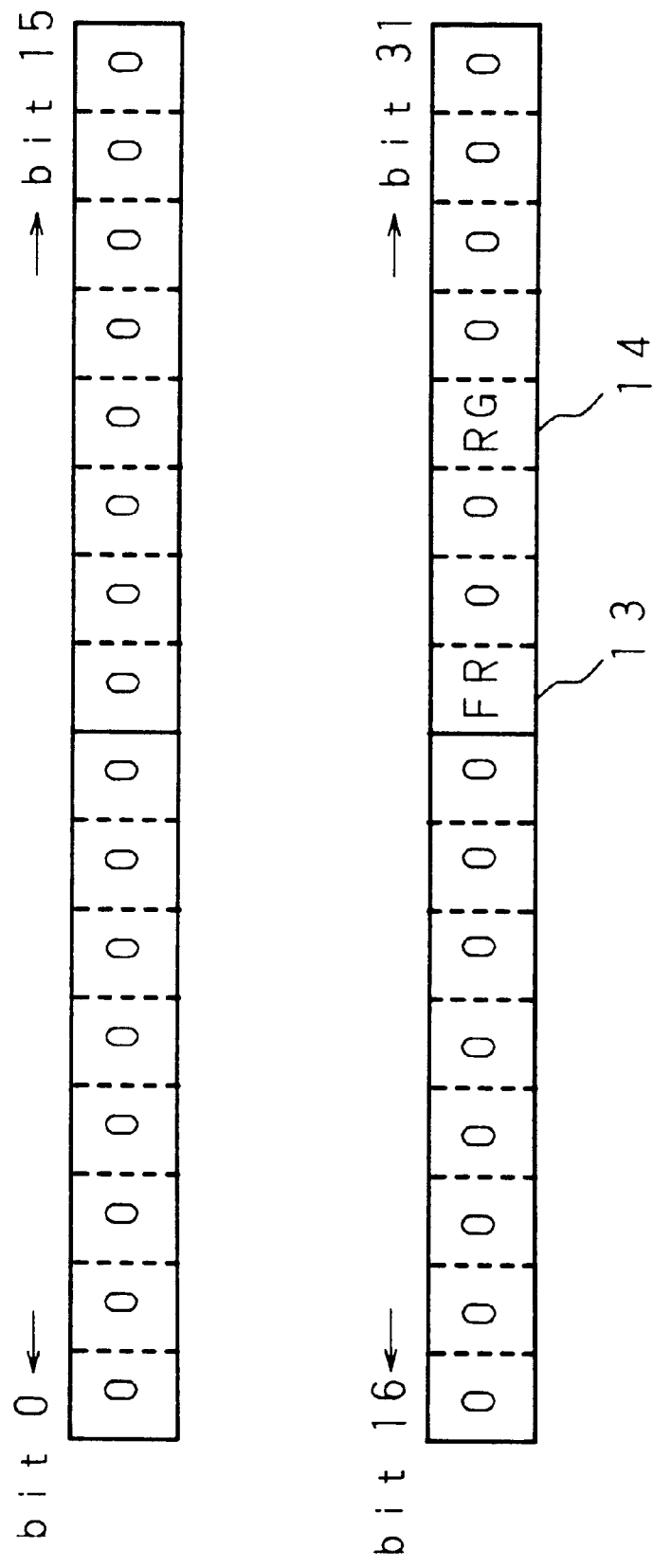
FIG. 7 is a schematic view showing a configuration of a CSW register designating a format of a context block which is operated by an LDCTX instruction and an STCTX instruction.

The format of the context block to be operated by the LDCTX instruction and the STCTX instruction is specified by a CSW register whose constriction is shown in a schematic view of FIG. 7. In the case where an FR bit 13 and an RG bit 14 of the CSW register are both "1", the context block becomes the format shown in FIG. 6.

In the case where the FR bit 13 is "0" and the RG bit 14 is "1", the floating-pint register 12 shown in FIG. 6 is not to be by the LDCTX instruction and the STCTX instruction.

In the case where the FR bit 13 and RG bit 14 are both "0", the floating-point register 12 and the general purpose registers 10 and 11 shown in FIG. 6 are not to be operated by the LDCTX instruction and the STCTX instruction. In this case, the CSW register, four stack pointers SPI (SP0, SP1, SP2 and SP3), and a UATB register showing an address translation table base are to be operated.

(3.2) "Context Switching Instruction"

Figure 8:
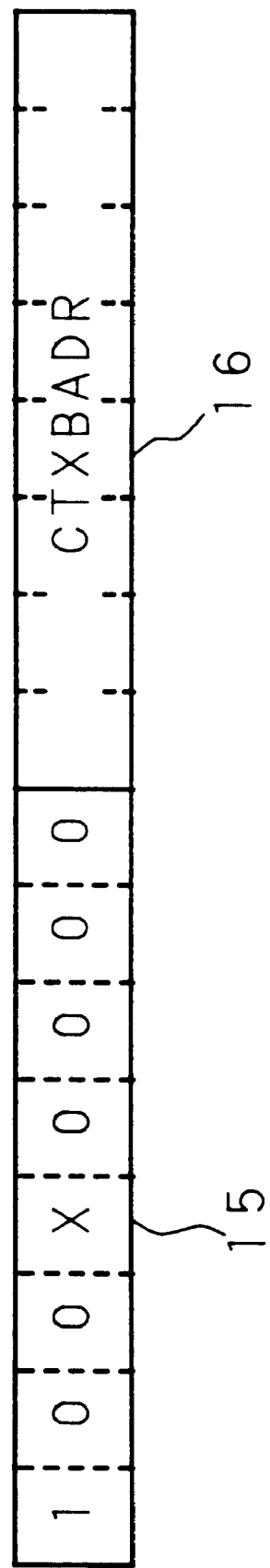
FIG. 8 is a schematic view showing a bit pattern of an LDCTX instruction.

A bit pattern of the LDCTX instruction is shown in a schematic view of FIG. 8.

A CTXBADR field 16 of the LDCTX instruction is the field to specify the start address of the context block to be loaded by the general-type addressing mode of 8 bits. An X bit 15 shows that the context block to be loaded is located in either the logical space or the control space. In the case where the X bit 15 is "0", it shows that the context block is located in the logical space, and in the case where the x bit 15 is "1", it shows that the context block 15 is located in the control space, respectively.

In the case where the LDCTX instruction is executed, the address specified by the CTXBADR field 16 is loaded in the CTXBB register, and the context block to be operated which is located in the address specified by the CTXBADR field 16 in the space specified by the X bit 15 as well as which is of the format specified by the CSW value of the head of the context block is loaded in is corresponding register.

Figure 9:
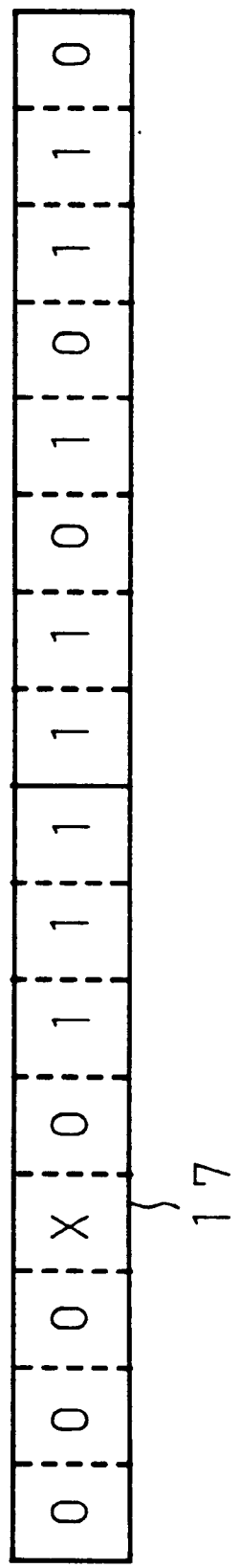
FIG. 9 is a schematic view showing a bit pattern of an STCTX instruction.

A bit pattern of the STCTX instruction is shown in a schematic view of FIG. 9.

An X bit of the STCTX instruction specifies the space in which the context block is stored. In the case where the X bit 17 of the STCTX instruction is "0", it is specified to store the context block in the logical space, and in the case where the X bit 17 is "1", it is specified to store the context block in the control space. The memory address to be stored is specified by the CTXBB register.

When the STCTX instruction is executed, the content of the register included in the context block of the format specified by the CSW register is saved in the address specified by the CTXBB register in the space specified by the X bit 17.

(4) "Functional block of Data Processor of the Present Invention"

Figure 10:
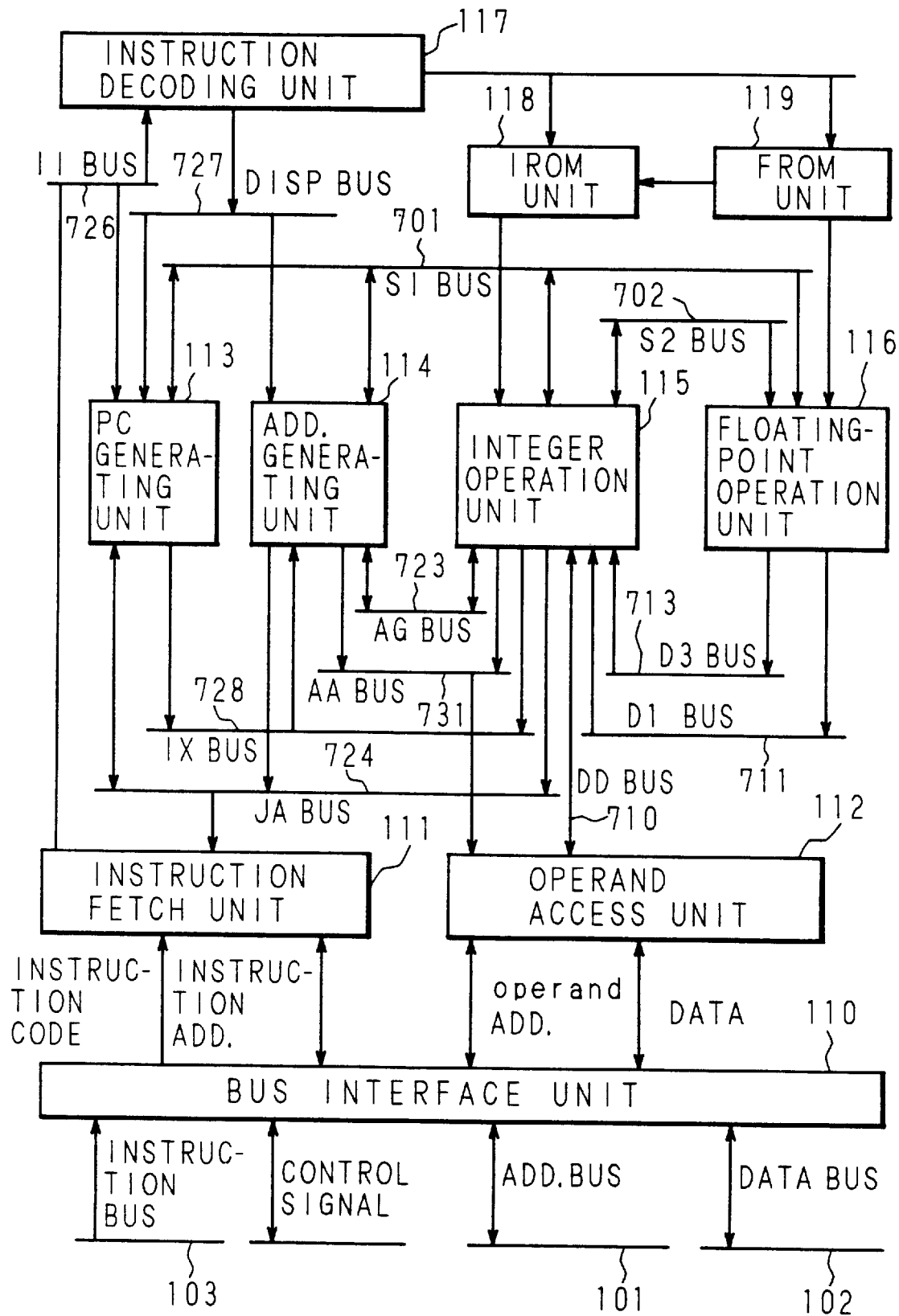
FIG. 10 is a block diagram showing a functional configuration of a data processor of the present invention.

FIG. 10 is a block diagram showing a functional configuration of a data processor 100 of the present invention.

When roughly dividing the internal units of the data processor 100 of the present invention functionally, it can be divided into an instruction fetch unit (IFU) 111, an instruction decoding unit (DU) 117, an IROM unit (IRU) 118, an FROM unit (FRU) 119, an address generating unit (AGU) 114, a PC generating unit (PCU) 113, an integer operation unit (IU) 115, a floating-point operation unit (FPU) 116, an operand access unit (OAU) 112 and a bus interface unit (BIU) 110. The bus interface unit 110 is connected to the outside by various control signals through an address bus (A00:31), a data bus (D00:63) and an instruction bus (I00:31).

The instruction fetch unit 111 fetches the instructions from the built-in instruction cache 51 or the external memories. The instruction decoding unit 117 decodes the instruction transferred from the instruction fetch unit 111 through an II bus 726. The IROM unit 118 controls the integer operation according to the $\mu$-program. The FROM unit 119 controls the floating-point operation by a $\mu$-program which is independent of the integer operation. The PC generating unit 113 calculates a PC value of the instruction. The address generating unit 114 calculates an operand address. The operands access unit 112 fetches the operand from the built-in data caches 107 and 108 or the external memories and processes to store the operand in the external memories.

Instructions are fetched in from the instruction fetch unit 111 and decoded in the instruction decoding unit 117, then executed in the integer operation unit 115 or the floating-point operation unit 116 by the $\mu$-program control of the IROM unit 118 or the FROM unit 119. Calculation of the PC value of instruction, operand address calculation and operand access are carried out by the hard-wired control in a block which is independent of the integer operation and the floating-point operation.

Instruction address and data addresses are transferred to the instruction fetch unit 111 and the operand access unit 112 from respective units by a JA bus 724 or an AA bus 731. Operands between respective units and the operand access unit 112 are transferred by a DD bus 710.

(4.1) "Bus interface unit"

The bus interface unit 110 accesses the external memories according to the request of the instruction fetch unit 111 or the operand access unit 112. Memory access of the data processor 100 of the present invention is carried out by a clock synchronous protocol. At least two clock cycles are necessary for one memory access cycle. In a read cycle, there are standard access in which the instruction code or data is fetched one by one, and block access in which the instruction code or data is continuously fetched four times. Furthermore, in the block access there are burst transferring in which the instruction code or data is continuously fetched four times by outputting the address once, and quad transferring in which the instruction code or data is continuously fetched four times by outputting the address four times. As a write cycle there is only standard write access in which the address is once outputted and data is once outputted.

The data processor 100 of the present invention is block access and write access is not executed. Control of the memory cycles and input/output of various signals are accomplished by the hard-wired control at the bus interface.

Figure 11:
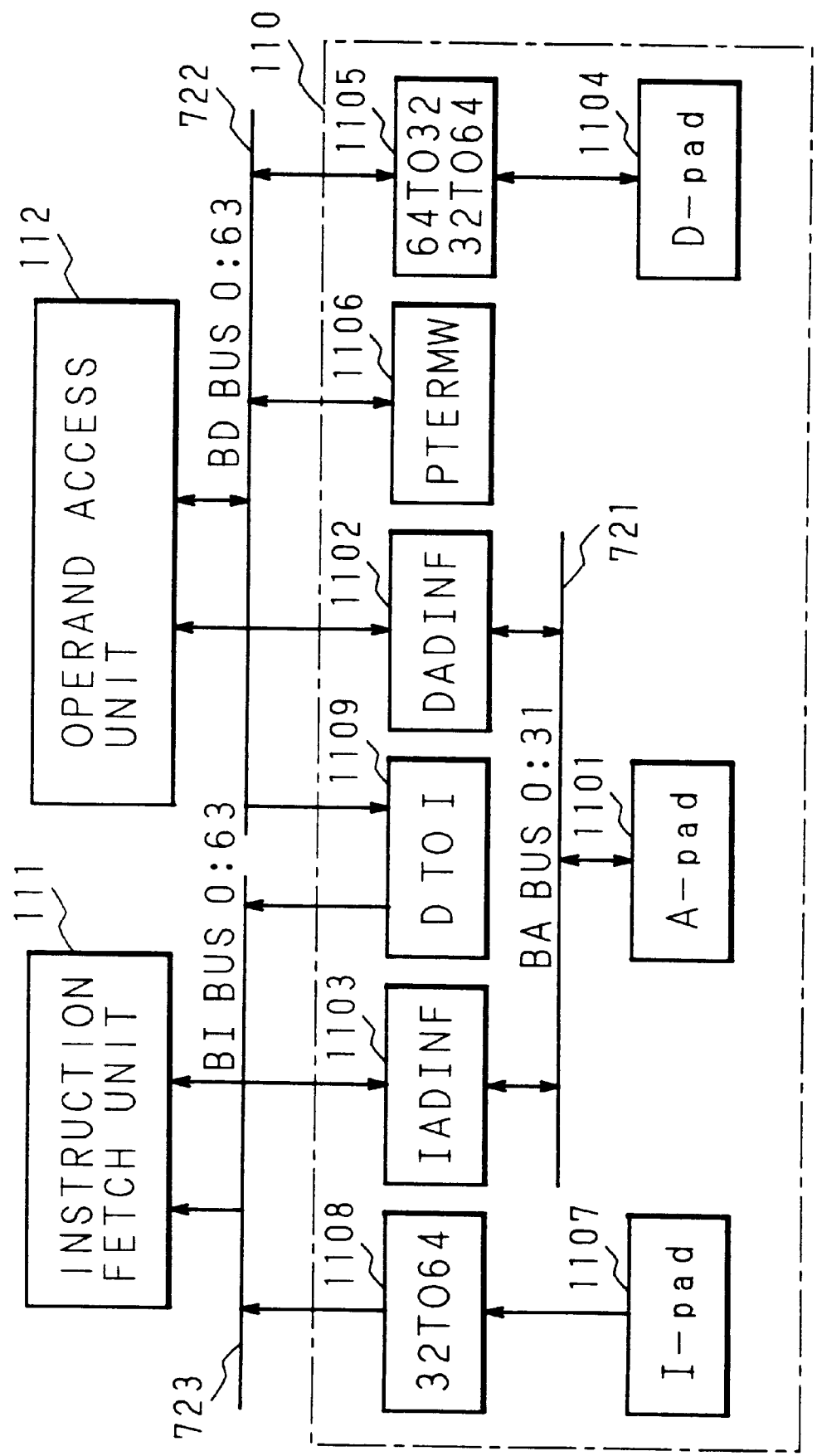
FIG. 11 is a block diagram showing a configuration of a bus interface unit.

A configuration of the bus interface unit 110 is shown in a block diagram of FIG. 11.

The operand access unit 112 and the instruction fetch unit 111 and an address pad (A-pad) 1101 are connected by a BA bus 721. A DADINF 1102 and an IADINF 1103 are, respectively, circuits for incrementing the address at block transferring of data or instructions.

A data pad (D-pad) 1104 and the operand access unit 112 are connected by a BD bus 722. Between the data pad (D-pad) 1104 and the BD bus 722, a bus width conversion circuit (64TO32-32TO64) 1105 which converts the bus width of an external 32-bit data bus and 64-bit BD bus 722 at a 32-bit single bus mode is disposed.

Since a latest TLB value is always rewritten into the memory in the data processor 100 of the present invention, a page table entry modifying circuit (PTERMW) 1106 for executing read-modify-write in the case of updating a reference status flag and a modified status flag of a page table entry when accessing a page table is connected to the BD bus 722.

An instruction pad (I-pad) 1107 and the instruction fetch unit 111 are connected by a BI bus 723. Between the instruction pad (I-pad) 1107 and the BI bus 723, a bus-width conversion circuit (32TO64) 1108 which converts the bus width of an external 32-bit instruction bus and the 64-bit BI bus 723 at a dual bus mode is disposed. Between the BI bus 723 and the BD bus 722, an interface circuit (D TO I) 1109 for transferring an instruction code inputted to the BD bus 722 from an external data bus at a single bus mode to the instruction fetch unit 111 via the BI bus 723 is disposed.

There are two kinds of access request from the operand access unit 112 to the bus interface unit 110, data access and address translation table access at miss in the TLB.

At data read, data is fetched from the data bus according to the address outputted to the address bus from the operand access unit 112 through the BA bus 721, and transferred to the operand access unit 112 through the BD but 722.

At this time, at a 32-bit bus mode, 32-bit data on the data bus is outputted to both the higher 32 bits and the lower 32 bits of the BD bus 722 by the bus width conversion circuit (64TO32-32TO64) 1105. When the data cache misses and data is fetched by block access, one address is outputted from the operand access unit 112 and the remaining three addresses are outputted after lower bits being wrapped around in the DADINF circuit 1102.

At data write, the address is outputted to the address bus from the operand access unit 112 through the BA bus 721, and data is outputted to the data bus through the BD bus 722. At this time, at the 32-bit bus mode, data of the higher 32 bits or the lower 32 bits of the BD bus 722 which is designated is outputted to the data bus by the bus width conversion circuit (64TO32-32TO64) 1105.

At address translation table access for tranlating the data address, the address translation table is accessed through the data bus. In the case of reading the address translation table entry, a table entry is fetched from the data bus according to the address outputted to the address bus from the operand access unit 112 through the BA bus 721, and transferred to the operand access unit 112 through the BD bus 722. In the case of read-modify-write of the page table entry, a table entry is fetched from the data bus according to the address outputted to the address bus from the operand access unit 112 through the BA bus 721, and transferred to the operand access unit 112 through the BD bus 722, simultaneously, a copy of the page table entry is held in the PTERMW circuit 1106, in which the page table entry is modified. Accordingly, when rewriting the page table entry is modified, address is outputted to the address bus from the operand access unit 112 through the BA bus 721, and the page table entry is outputted to the external data bus from the PTERMW circuit through the BD bus 722.

There are two kinds of access request from the instruction fetch unit Ill to the bus interface unit 110, an instruction fetch and address translation table access at miss in the TLB.

In the case of instruction fetch at a dual bus mode, the instruction code is fetched from the instruction bus according to the address outputted to the address bus from the instruction fetch unit 111 through the BA bus 721, and transferred to the instruction fetch unit 111 through the BI bus 723. At this time, the 32-bit instruction code is outputted to both the higher 32 bits and the lower 32 bits of the BI bus 723 through the bus-width conversion circuit (32TO64) 1108.

In the case of instruction fetch at a single bus mode, the instruction code is fetched from the data bus according to the address outputted to the address bus from the instruction fetch unit 111 through the BA bus 721, and transferred to the instruction fetch unit 111 through the BD bus 722, D TO I circuit 1109 and BI bus 723.

In the 32-bit signal bus mode, 32-bit instruction code inputted from data bus is outputted to the higher 32 bits and lower 32 bits of the BD bus 722 through the bus width conversion circuit (64TO32-32TO64) 1105. When the instruction cache 106 misses and instruction code is fetched by block access, one address is outputted from the instruction fetch unit 111 and the rest three addresses are outputted after lower bits being wrapped around in the IADINF circuit 1103.

In address translation table access for translating instruction address, the address translation table is accessed through the data bus in both the dual bus mode and the single bus mode.

At reading of the address translation table entry, a table entry is fetched according to the address outputted from the instruction fetch unit 111 to the address bus through the BA bus 721, and transferred to the instruction fetch unit 111 through the BD bus 722, D TO I circuit 1109 and BI bus 723.

In the case of read-modify-write of the page table entry, a table entry is fetched from the data bus according to the address outputted to the address bus from the instruction fetch unit 111 through the BA bus 721, and transferred to the instruction fetch unit 111 through the BD bus 722, D TO I circuit 1109 and BI bus 723, simultaneously, a copy of the page table entry is held in the PTERMW circuit 1106, in which the page table entry is modified. Accordingly, in the case of rewriting the page table entry, address is outputted to the address bus from the instruction fetch unit 111 through the BA bus 721, and the page table entry is outputted to the external data bus from the PTERMW circuit 1106 through the BD bus 722.

The bus interface unit 110 accepts an external interruption and controls an bus arbitration besides memory access.

In the case wherein external devices other than the data processor 100 of the present invention are the bus masters and the data processor 100 of the present invention is in the bus snooping operation, the address outputted on the address bus when data write is executed by the external devices is taken in, and transferred to the instruction fetch unit 111 and the operand access unit 112 through the BA bus 721. The address take-in operation in the bus snooping operation is executed when a DS# signal is asserted in a data write cycle (clock non-synchronous, edge sense), and when an MS# signal is asserted during assertion of a MREQ# signal (clock synchronous, level sense).

(4.2) "Instruction fetch unit"

Figure 12:
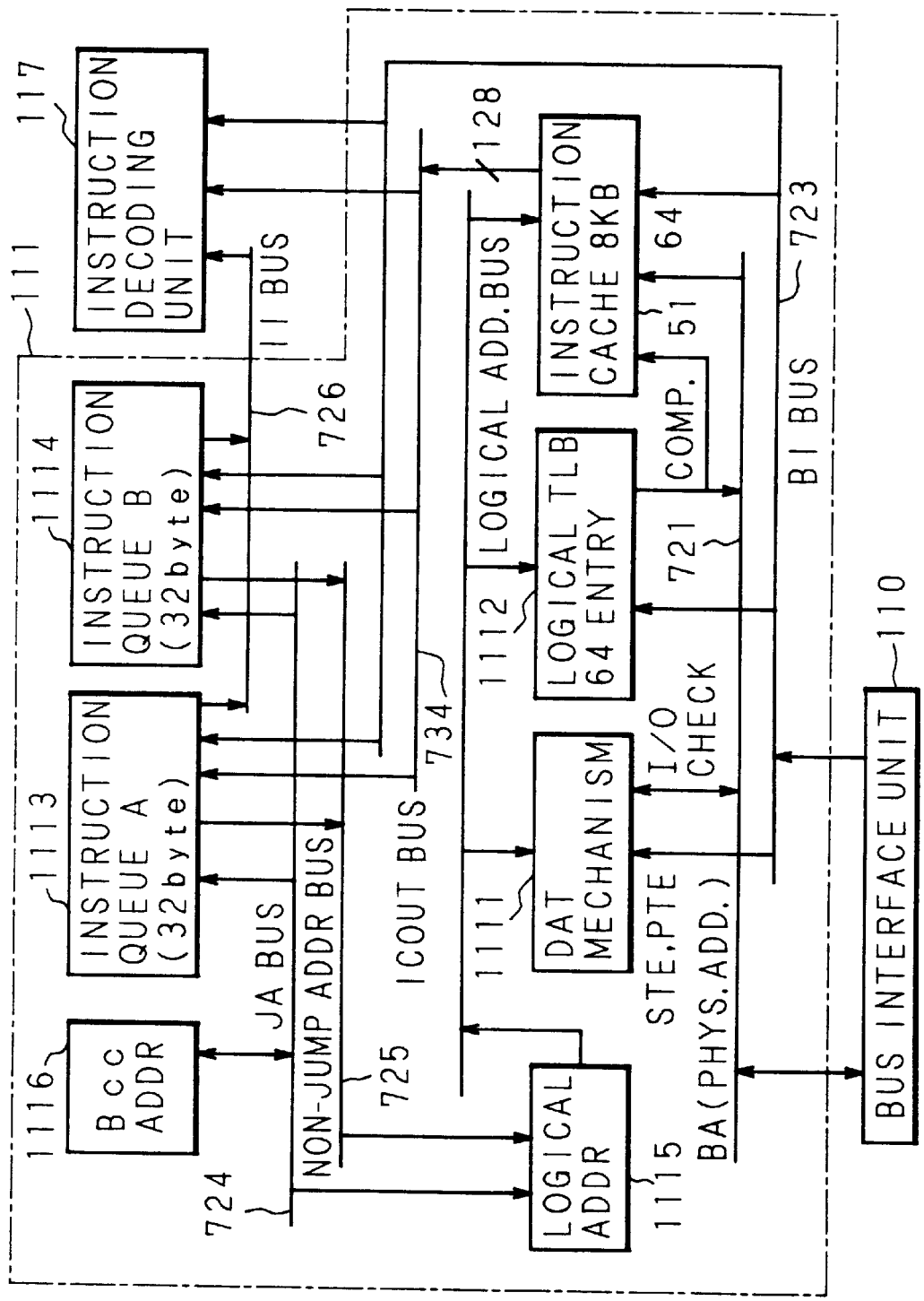
FIG. 12 is a block diagram showing a configuration of an instruction fetch unit.

A configuration of the instruction fetch unit 111 is shown in a block diagram of FIG. 12.

In the instruction fetch unit 111, there are an address translation mechanism (DAT mechanism) 1111 of the instruction address, an 8 KB built-in instruction cache 51, a 64-entry instructing TLB 1112, two 32-byte instruction queues 1113, 1114 and their control units. A logical address of the instruction to be fetched next is converted into a physical address by the TLB 1112, and the instruction code is fetched from the built-in instruction cache 51 and transferred to the instruction decoding unit 117 via the instruction queues 1113 and 1114.

The bus interface unit 110 and the built-in instruction cache 51 are connected by a 32-bit address bus (BA bus 721) and a 64-bit instruction bus (BI bus 723), and the built-in instruction cache 51 and the instruction queues 1113, 1114 are connected by a 128-bit ICOUT bus 734. The instruction outputted from the bus interface unit 110 sometimes bypasses the built-in instruction cache 51 and is transferred to either of the two instruction queues 1113, 1114 or further bypasses the instruction queues 1113, 1114 and is transferred directly to the instruction decoding unit 117, besides being transferred to the built-in instruction cache 51.

The instruction TLB 1112 always takes the form of 16 entry×4 way irrespective of an operation bus mode. The instruction TLB 1113 outputs a TLB address tag and a physical address according to the lower bits of a logical address (pre-translation address) transferred from a JA bus 724 or a non-jump address bus 725 via a logical ADDR 1115. Coincidence of the TLB address tag and the higher bits of the logical address means hit of the TLB 1112, thus the outputted physical address is valid. When the TLB address tag and the higher bits of the logical address are not coincided, the TLB 1112 misses and the outputted physical address is invalid. When the TLB 1112 misses, paging is executed by the DAT mechanism 1111 for address translation to update entry of the TLB 1112.

The built-in instruction cache 51 operates in the form of 16 bytes×128 entry×4 way in the case of fetching the instruction code from the instruction bus, and in the case of operating the data bus at a 32-bit width to fetch the instruction code, and operates in the form of 32 byte×128 entry×2 way in the case of operating the data bus at a 64-bit width to fetch the instruction code.

The built-in instruction cache 51 outputs a cache address tag and an instruction code according to a logical address (pre-translation address) transferred from the JA bus 724 or the non-jump address bus 725 via the logical ADDR 1115. The cache address tag is compared with a physical address outputted from the TLB 1112, and when the TLB 1112 is hit and the physical address outputted from the TLB 1112 is valid and as same value as the address tag, the built-in instruction cache 51 is hit, and the instruction code is transferred to the instruction queues 1113, 1114 or the instruction decoding unit 117 via the ICOUT bus 734. When the TLB 1112 misses or the physical address outputted from the TLB 1112 and the cache address tag are not coincided, it is the instruction cache miss. When the TLB 1112 hits and the built-in instruction cache 51 misses, the physical address is outputted to the bus interface unit 110 and by block accessing the external memory the instruction code is fetched, and entry of the built-in instruction cache is updated. The TLB 1112 as well as the cache are miss, the cache entry is not updated and the cache is accessed again after updating entry of the TLB 1112.

In the DAT mechanism 1111, there are copies of LSID SATB, UATB, IOADDR and IOMASK, whereby address translation by the paging in the case of miss of the instructing TLB 1112, check of the memory access exception or page absence exception and updating of the instructing TLB 1112 are executed, and further, it is checked whether the physical address of instruction access to the external memory is in an I/O regions or not.

One of the two instruction queues 1113, 1114 prefetches the instruction code following the conditional branch instruction for queuing, and the other one prefetches the branched instruction code of the conditional branch instruction for queuing. The branch destination address in the case of further decoding the conditional branch instruction in the state where both of the two instruction queues 1113, 1114 have fetched the instruction, is held in a branch destination address register (Bcc ADDR) 1116, and the instruction is newly fetched from the address after the preceding conditional branch instruction is executed and either the instruction queue 1113 or 1114 is cleared.

The logical address of the instruction other than the jump destination is calculated by an exclusive counter of the instruction queues 1113, 1114. When a jump occurs, the logical address of a new instruction is loaded to the counter of the instruction queues 1113, 1114 from the address generating unit 114, PC generating unit 113 or integer operation unit 115 by the JA bus 724.

During the bus snooping operation of the data processor 100 of the present invention, the bus interface unit 110 monitors the address on the external address bus 101, and transfers to the built-in instruction cache 51 by the physical address bus (BA bus) 721 shown in FIG. 12. The bus interface unit 110 also transfers the memory address which is written by the data processor 100 itself of the present invention to the built-in instruction cache 51.

(4.3) "Instruction decoding unit"

Figure 13:
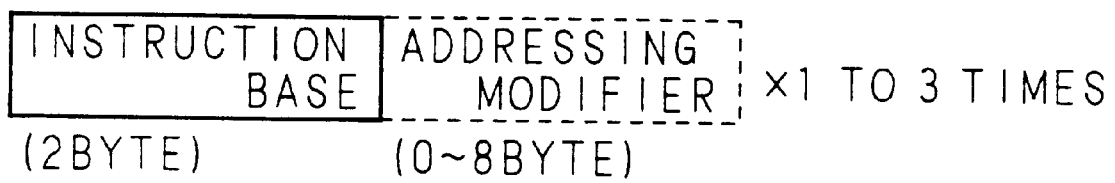
FIG. 13 is a schematic view showing instruction and addressing mode formats of a data processor of the present invention.
Figure 13:
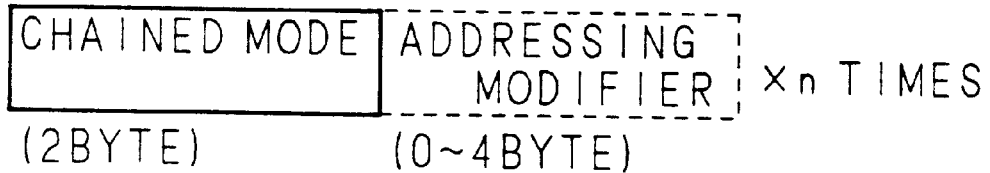

Instruction of the data processor of the present invention is the variable length instruction of a 2-byte unit as shown in a schematic view of FIG. 13, and basically, the instruction is constituted by repeating "2-byte instruction base+0 to 4-byte addressing modifier" one to three times. An eight-byte addressing modifier is used only when an immediate double precision is designated by the floating-point instruction.

There are an operation coding unit and an addressing mode designating unit in the instruction base, and when index addressing or indirect memory addressing is necessary, in place of the addressing modifier "2-byte chained addressing mode designation unit+0 to 4-byte addressing modifier" is extended as much as necessary. There is also a case where an extension peculiar to the 2 or 4-byte instruction is added to the end depending upon the instruction.

In the data processor 100 of the present invention, for processing the aforementioned variable length format instruction efficiently, one instruction is decomposed into one or plural processing units (step code) in an instruction decoding stage. Basically, the decoded result of "2-byte instruction base+0 to 4-byte addressing modifier" or "chained addressing mode designating unit+addressing modifier" is one step code, and an instruction decoder outputs one step code at one clock. However, in the instruction in which there is no addressing modifier in the first operand, or in the instruction in which there is no operand designator in the head instruction base, two instruction bases (32-bit length) are decoded at one clock.

In the data processor 100 or the present invention, a part of the inter-register operation instruction is decoded in parallel to the preceding instruction, thus the two instructions can be decoded at a time.

Figure 14:
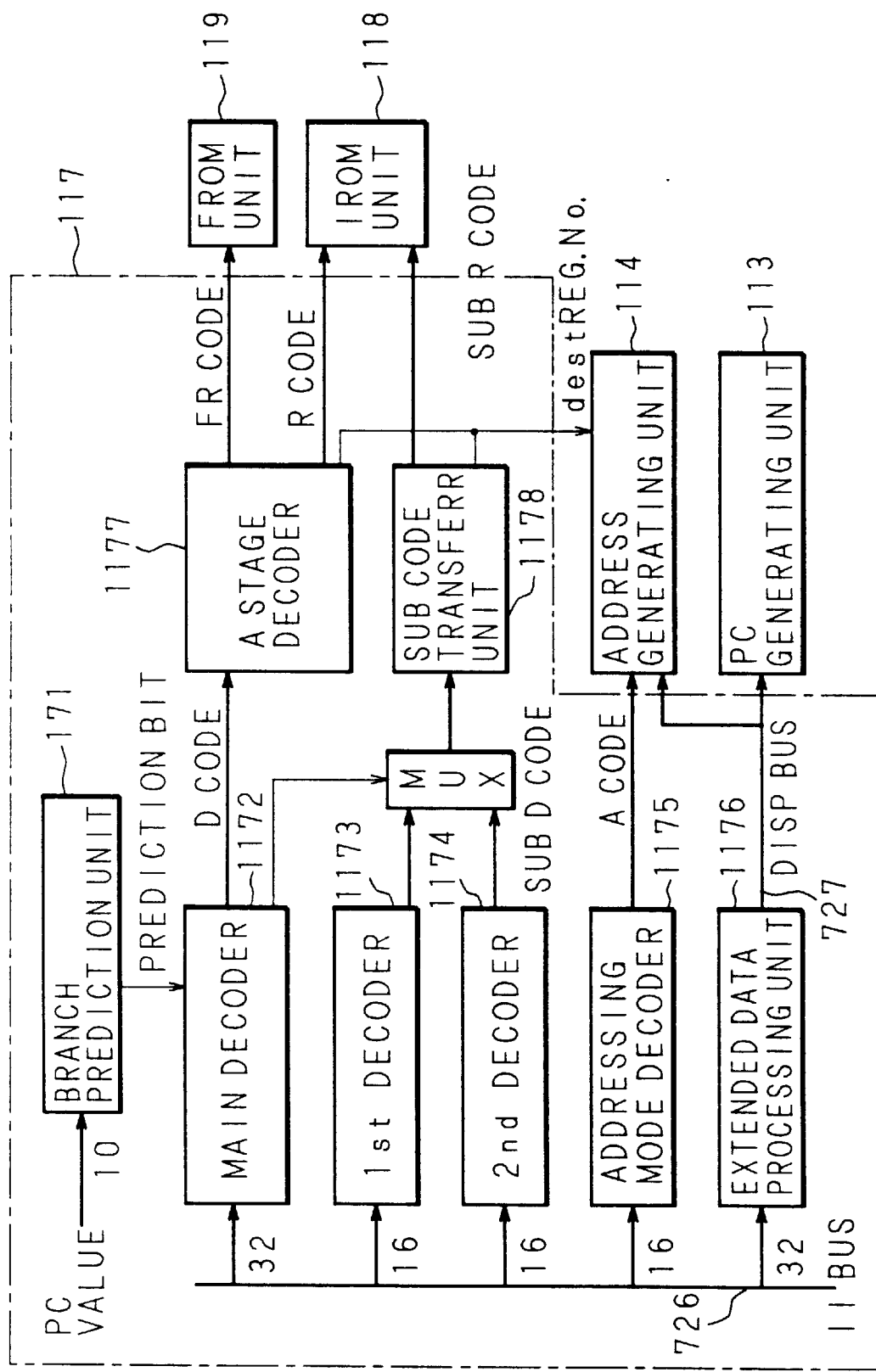
FIG. 14 is a block diagram showing a configuration of an instruction decoding unit of a data processor of the present invention.

A configuration of the instruction decoding unit 117 of the data processor 100 of the present invention is shown in a block diagram of FIG. 14.

The instruction decoding unit 117 operates in two pipeline stage, an instruction decoding state (D stage) 32 and an operand address generating stage (A stage) 33 following the D stage 32.

Instruction decoding blocks operate in the D stage 32 are a branch prediction unit 1171, a main decoder 1172, a first sub-decoder 1173, a second sub-decoder 1174, an addressing mode decoder 1175 and an extended data processing unit 1176. Instruction decoding blocks operate in the A stage 33 are an A stage decoder 1177 and a sub-code transfer unit 1178.

The branch prediction unit 1171 holds a branch history of 1 bit×1K entry conditional branch instruction, and outputs a branch prediction bit according to the lower address of an instruction PC value which is decoded immediately before the conditional branch instruction.

The main decoder 1172 decodes the max. 4-byte instruction base and 1-bit branch prediction bit. Output (D code) of the main decoder 1172 is transferred to the A-stage decoder 1177.

The first sub-decoder 1173 and the second sub-decoder 1174 decode the 16-bit register-register operation instruction following the instruction decoded by the main decoder 1172. The first sub-decoder 1173 decodes the third byte and fourth byte of the II bus 726 assuming that the length of the instruction decoded by the main decoder 1172 is 16 bits. The second sub-decoder 1174 decodes the fifth byte and sixth byte of the 11 bus 725 assuming that the length of the instruction decoded by the main decoder 1172 is 32 bits. When the instruction decoded by the main decoder 1172 and the instruction decoded by the sub-decoder 1173, 1174 satisfy the parallel decoding conditions, either of the outputs of the sub-decoders 1173, 1174 is transferred to the sub-decode transfer unit 1178.

The addressing mode decoder 1175 decodes an addressing mode filed of the instruction designated by the 8-bit operand designation of the multistage indirect mode, and outputs an A code which controls the address generating unit 114.

The extended data processing unit 1176 takes out an addressing modifier such as a displacement or an immediate value from the instruction code, and transfers to the address generating unit 114 or PC generating unit 113 through the DISP bus 727. Since the extended data processing unit 1176 can handle 4-byte data at once at the maximum, the 8-byte immediate value is transferred in twice.

The A-stage decoder 1177 decodes a D code which is the intermediate decoded result of the instruction outputted from the main decoder 1172 in detail, and outputs the entry address and parameter of the µ-program to the FROM unit 119 and the IROM unit 118. Only the decoded result (FR code) of the floating-point operation instruction is transferred to the FROM unit 119, and the decoded result of all instructions including the floating-point instruction is transferred to the IROM unit 118. A priority encoder is included in the A-stage decoder 1177, whereby the instruction for transferring a plurality of operands between the register and the memory according to a register list such as an LDM, STM etc., is decomposed into a plurality of memory-register transfer instruction which transfer data of 8 bytes or less at once.

The sub-code transfer unit 1178 transfers the decoded result outputted from the sub-decoders 1173, 1174 to the IROM unit 118 in synchronism with the instruction being decoded by the A-stage decoder 1177.

From the A-stage decoder 1177 and the sub-code transfer unit 1178, the number of register into which operands are written is transferred to a scoreboard register of the address generating unit 114, and by a pipeline interlock mechanism it is controlled such that, the following instruction uses a register value or a memory value, in which the writing is not finished, in operand address calculation to prevent a RAW data hazard (Read-after-write data hazard).

(4.4) "PC generating unit"

Figure 15:
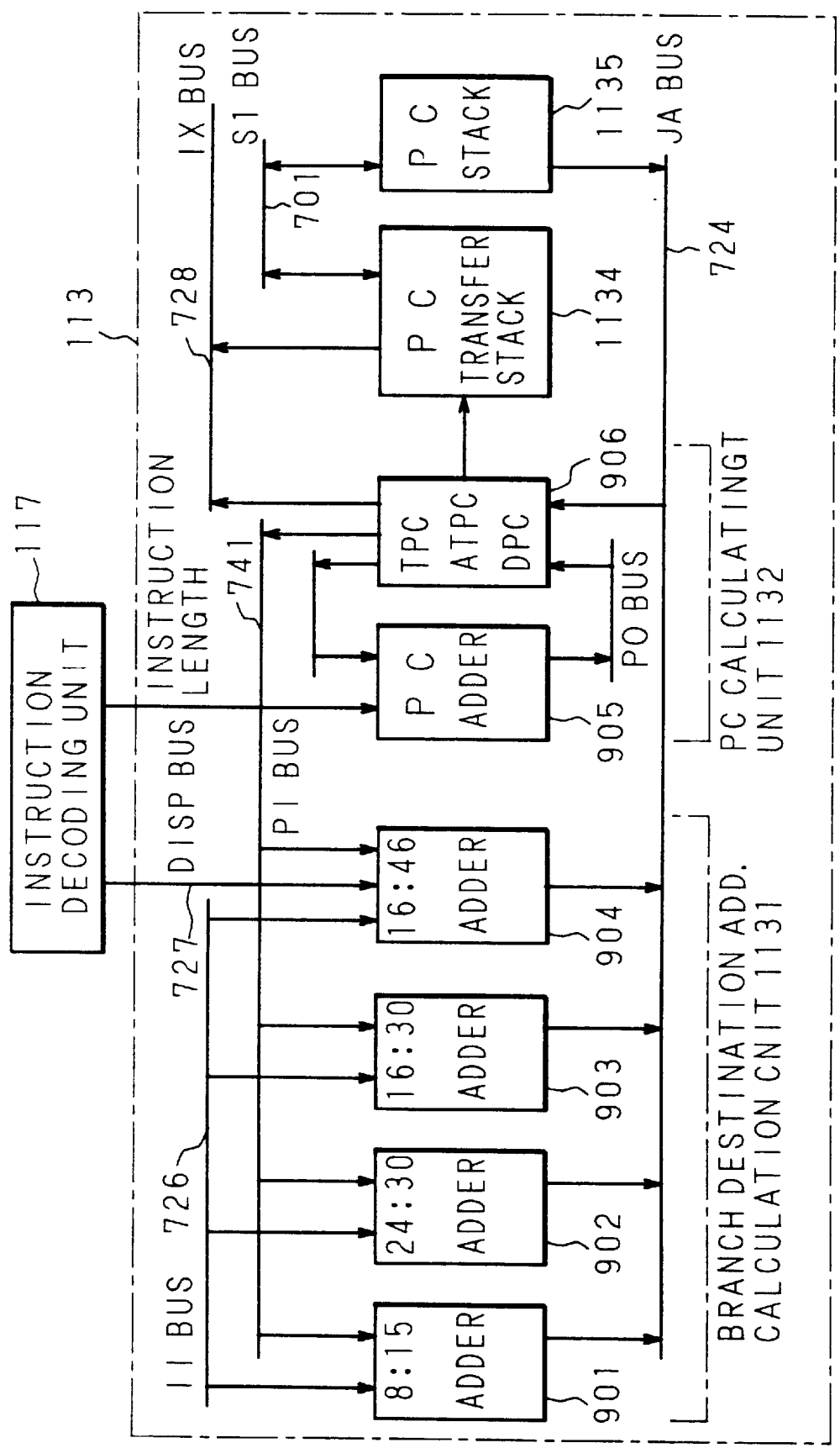
FIG. 15 is a block diagram showing a configuration of a PC generating unit of a data processor of the present invention.

A configuration of the PC generating unit 113 is shown in a block diagram of FIG. 15.

The PC generating unit 113 comprises, a branch destination address calculation unit 1131 which calculates a prejump destination address in the instruction decoding stage 32, a PC calculating unit 1132 which calculates a PC value of the decoded instruction, a PC transfer unit 1134 which transfers the PC value in synchronism with the flow of instruction processed in the pipeline, and a PC stack 1135 which manages a pre-return destination address from the sub-routine.

The branch destination calculation unit 1131 calculates the jump destination instruction address when a PC relative jump or an absolute address jump is generated in the instruction decoding stage 32. There are four adders 901, 902, 903 and 904 which are connected to the II bus 726 and the PI bus 741 in the branch destination address calculation unit 1131, which adds four kinds of fields (bits of 8:15, 24:30, 16:30, 16:46) which are able to become branch displacement fields of the II bus 726 and the decode start instruction address transferred from the PI bus 741 in parallel with the instruction decoding.

In case the decoded instruction is the instructions (BRA, BSR, Bcc predicted to branch, JMP @(disp, PC), JSR @(disp, PC)) which execute the PC relative jump or the instructions (JMP @abs, JSR @abs) which execute the absolute address jump, the branch destination address calculation unit 1131 selects one correct jump destination address from the added results of the four adders 901, 902, 903, 904 and the code extended results of the three fields (bits of 24:30, 16:30, 16:46) which are able to become absolute addresses transferred from the II bus 725, and outputs to the JA bus 724. For the part of branch instructions (ACB, SCB, FBcc predicted to branch) which branch to other addresses than the four jump destination addresses and are implemented simultaneously with the instruction decoding, the branch destination address calculation unit 1131 adds the branch displacement transferred newly from the DISP bus 727 and the PC value by one of the adders 901, 902, 903 or 904 after the instruction decoding to obtain the jump destination address, which is outputted to the JA bus 724.

The PC stack 1135 holds a copy of return destination address from the subroutine jump instruction (BSR, JSR) in a 16-entry stack, and outputs the return destination address to the JA bus 724 in case the subroutine return instruction (RTS, EXITD) is decoded. In the PC stack 1135, when the subroutine jump instruction is executed, the return destination address is transferred from the SI bus 701 and is pushed. When the stack is switched by a task switch or a subroutine nesting of 16 levels or more is generated, the return destination address outputted to the JA but 724 from the PC stack 1135 is not the correct return destination address any more. Therefore, at the time point when the subroutine return instruction has reached the instruction execution stage 35 of the pipeline, the correct return destination address and the pre-return address which is read to the JA bus 724 from the PC stack 1135 are read again to the SI bus 701 and compared.

The PC calculation unit 1132 is consisting of a PC adder 905 and working registers (TPC, ATPC, DPC) 906 and calculates a PC value of the instruction to be decoded in the instruction decoding unit 117. PC value calculation is implemented by adding an instruction code length consumed in the instruction decoding unit 117 to the instruction address decoded one cycle before. In case the instruction execution sequence is changed by the jump instruction or EIT (exception, interruption and trap), the jump destination instruction address is transferred from the JA bus 724. The calculation result of the PC calculation unit 1132 is besides being outputted to the PC transfer unit 1134 together with the instruction decoded result in synchronism with the flow of pipeline, transferred to the address generating unit 114 from the IX bus 728 for PC relative address calculation, and to the branch destination address calculation unit 1131 from the PI bus 741 for instruction address calculation.

In the PC transfer unit 1134, there are a number of PC holding registers corresponding to the each pipeline stage of the data processor 100 of the present invention. A PC value which is a head address of the instruction calculated in the PC calculation unit 1132 is transferred in the register of the PC transfer unit 1134, together with the step code which is processed in the pipeline stage of the data processor 100 of the present invention. In the PC transfer unit 1134, for the instruction address break for debug support or for starting the tracing operation, the PC value being transferred and an instruction breakpoint address (IBAO, IBAI) value or a trigger start instruction address (TGIA) value are compared.

(4.5) "Address Generating Unit"

The address generating unit 114 is hard-wired controlled by control information related to the address generation of the operand outputted from an addressing mode decoder 1175 of the instruction decoding unit 117, and calculates the operand address. In the instruction decoding unit 117, pre-jump processing by the jump instruction of the register indirect addressing or the memory indirect addressing which do not pre-jump, and further, the branch destination address calculation of the conditional jump instruction which is predicted not to branch and the return destination address calculation of the subroutine jump instruction are executed.

Figure 16:
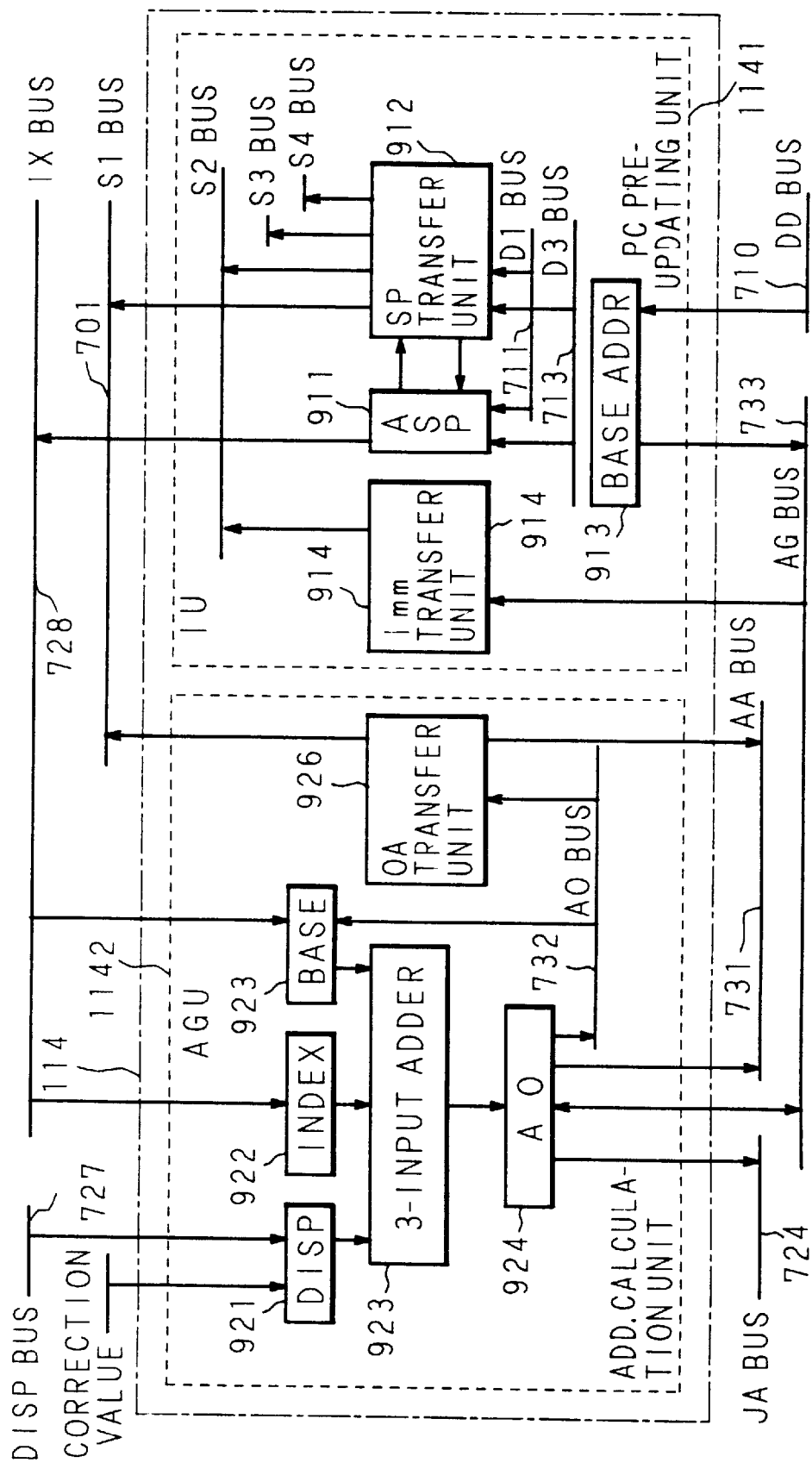
FIG. 16 is a block diagram showing a configuration of an address generating unit of a data processor of the present invention.

FIG. 16 is a block diagram showing a configuration of the address generating unit 114 of the data processor 100 of the present invention.

The address generating unit 114 includes, an SP pre-updating unit 1141 consisting of an operand address generating unit exclusive stack pointer (ASP) 911 for processing the instruction without generating a pipeline interlock even when the stack-pop addressing (@SP+) and the stack-push addressing (@-SP) are generated continuously, and a register group (SP transfer unit) 912 which transfers an SP value updated in the operand access stage in the pipeline in synchronism with the flow of instruction, and an address calculation unit 1142 which calculated operand address by a 3-input adder 923 according to an addressing mode other than @SP+or @-SP.

In FIG. 10, a portion designated by AGU in FIG. 16 is in the address generating unit 114, and a portion designated by IU in FIG. 16 is in the integer operation unit 115.

A displacement value designated in the addressing mode is transferred to the address calculation unit 1142 from the instruction decoding unit 117 by the DISP bus 727 and held in a DISP register 921. For calculating a return destination address of the subroutine jump instruction or a nonbranch side instruction address of the conditional branch instruction which is predicted to branch, an instruction code length (correction value) transferred from the instruction decoding unit 117 may be inputted to the DISP register 921.

For the scaled index addressing, a value transferred from the register of the integer operation unit 115 by the IX bus 728 is inputted to and held in an INDEX register 922. In the INDEX register 922, 1, 2, 4 and 8 times of the inputted value can be outputted to the 3-input adder 923.

In case the address calculation result till a pre-stage addressing mode is used as the base address of the next chained addressing mode by the chained addressing, the output of the 3-input adder 923 is transferred to a BASE register 925 from an AO register 924.

In the register relative mode, PC relative mode, register base chained addressing mode and PC base chained addressing mode, a general purpose register or PC value designated as the base address is loaded to the BASE register 925 from the IX bus 728. By outputting the address calculation result by the 3-input adder 923 to the AA bus 731 from the AO register 924 at memory indirect addressing, the address is fetched into a BASE ADDR 913 from the operand access unit 112 through the DD bus 710, and an object address is fetched into the AO register 924 via the AG bus 733. Three values respectively held in the DISP register 921, INDEX register 922 and BASE register 925 are added by the 3-input adder 923 and outputted to the AO register 924.

The address calculation result is outputted to the AA bus 731 from the AO register 924 and used as the address for accessing the operand. The operand address itself outputted from the AO register 924 is given to an OA transfer unit 926 and managed by the OA transfer unit 26 in synchronism with the flow of instruction in the pipeline. Immediate values below 4 bytes are also inputted to the OA transfer unit 926 from the instruction decoding unit 117 via the DISP register 921, 3-input adder 923 and AO register 924 in order, and managed by the OA transfer unit 926 in synchronism with the flow of instruction in the pipeline as same as the operand address.

In case of using the 64-bit immediate value in the floating-point operation instruction, its higher 32 bits are inputted to an Imm transfer unit 914 from the AO register 924 and managed in a pair with the lower 32 bits of the OA transfer unit 926.

The jump destination address calculation result of the jump instruction other than the PC relative addressing and absolute addressing is outputted to the JA bus 724 from the AO bus 733, and is used in pre-jump in an address generating stage which is a third stage of the pipeline. Calculation results of the branch destination address of the conditional branch instruction which is predicted not to branch or the non-branch destination address of the conditional branch instruction which is predicted to branch are outputted to the JA bus 724 from the AO bus 733, and is used as the instruction pre-fetch destination address of a back-up instruction queue in case the branch prediction was wrong.

The SP pre-updating unit updates the SP value for the addressing modes of @SP+ and @-SP by an ASP 911 which is an exclusive working stack pointer, and manages the updated SP value in the SP transfer unit 912 in synchronism with the flow of instruction in the pipeline. Accordingly, the ASP 911 includes incrementing and decrementing functions of 1, 2, 4 and 8. In the @SP+ addressing mode, the value of ASP 911 is outputted to the AA bus 731 via the IX bus 728, BASE register 925, 3-input adder 923 and AO register 924 in order to access an operand. At the referring the SP value by the address calculation unit 1142, the value of ASP 911 is referred to via the IX bus 728.

Accordingly, in the data processor 100 of the present invention, in the @SP+ or @-SP addressing mode, the instruction following the instruction which updates the SP value can execute the address calculation using the SP value without the pipeline stall. In the case of writing into the SP in the instruction execution stage, simultaneously, the value to be updated is written into an instruction execution stage working stack pointer (CSP) of the ASP 911 and SP transfer unit 912 from the D1 bus 711 or the D3 bus 713. In case the jump is generated in the instruction execution stage and the pipeline is cleared, the CSP value is transferred to the ASP 911.

(4.6) "Operand Access Unit"

Figure 17:
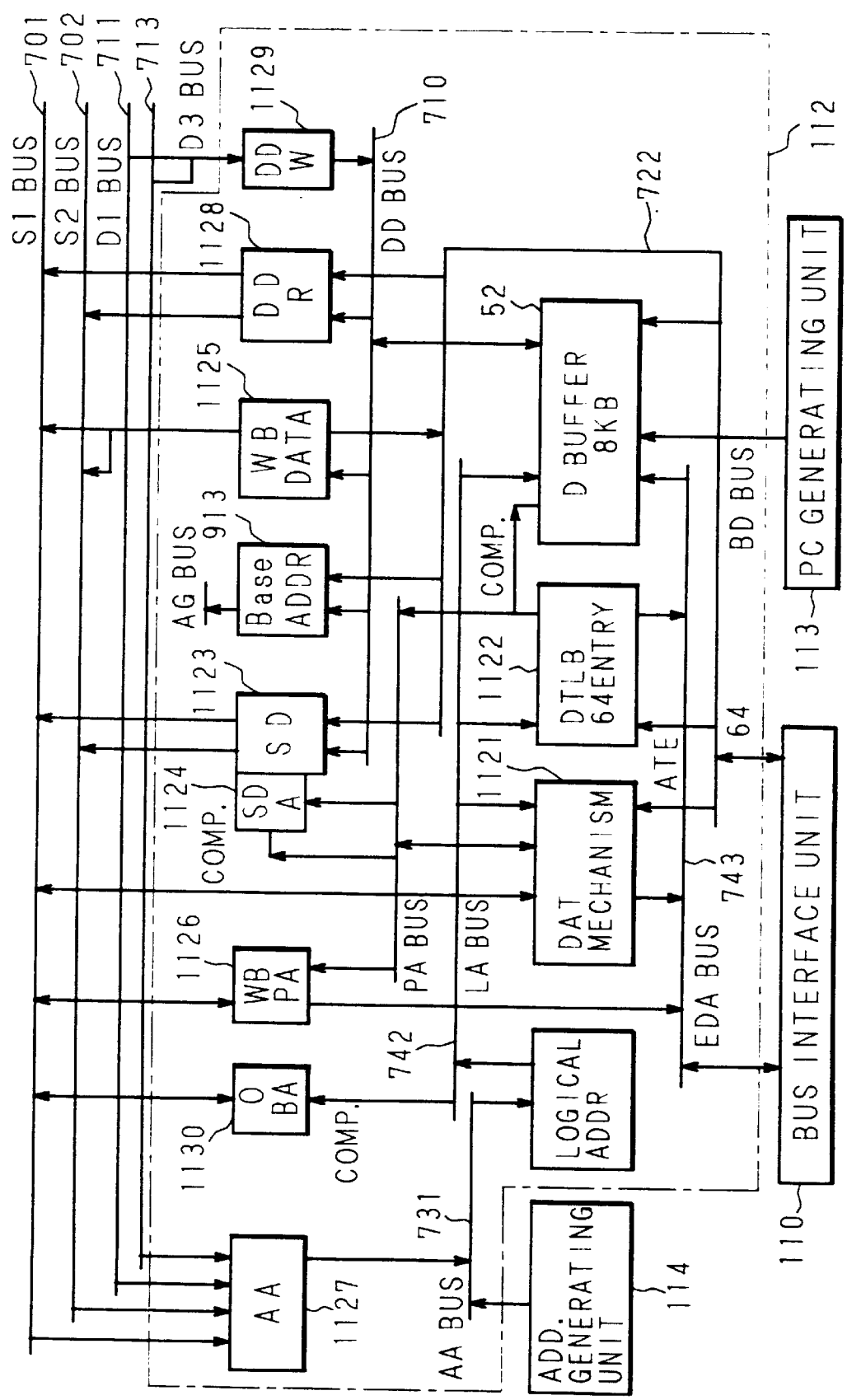
FIG. 17 is a block diagram showing a configuration of an operand access unit of a data processor of the present invention.

A configuration of the operand access unit 112 is shown in a block diagram of FIG. 17.

The operand access unit 112 is constituted by an address translation mechanism (DAT mechanism) 1121 of the operand address, an 8 KB data buffer 52, a 64-entry data TLB 1122, 2-entry operand pre-fetch queues (SD, SDA) 1123, 1124, 3-entry store buffers (WBDATA, WBPA) 1125, 1126, interface circuits (AA, DDR, DDW) 1127, 1128, 1129 with the integer operation unit 115, an operand break check circuit (OBA) 1130 etc.

The AA register 1127 is the register for the integer operation unit 115 to output the address. The DDR register 1128 is the register for transferring read data to the integer operation unit 115. The DDW 1129 is the register for the integer operations unit 115 to output write data. A BaseADDR register 913 is the register for transferring the memory indirect address to the operand address generating unit 114.

A configuration of the data TLB (DTLB) 1122 is 16 entries×4 ways.

Three are registers LSID, SATB, UATB, IOADDR and IOMASK in the DAT mechanism 1121, which executes address translation by paging when the data TLB 1122 misses, checks the EIT related to memory access and updates the data TLB 1122. Whether the memory access is in I/O regions or not is also checked.

The data buffer 52 operates as a built-in data cache of 32 bytes×64 entries×4 ways or as either of the 8 KB context saving memories by switching the modes.

In the reading operation of data, the logical address of data to be read outputted from the operand address generating unit 114 or an AA unit which is the address register of the integer operation unit 115 is translated into the physical address by the TLB 1122, and data is fetched from the data cache through the DD bus 710 and transferred to the BaseADDR register 913 or the SD register 1123 and the DDR register 1128. In case of fetching data into the SD register 1123, the physical addresses of every 8-byte boundary of the fetched data are transferred to be held in the SDA register 1124 for checking overlapping with the store operand.

The data cache outputs a cache address tag and data according to the lower 11 bits (same as the lower 11 bits of the physical address) of the logical address (pre-translation address) transferred from the AA bus 731. The cache address tag is compared with the physical address outputted from the TLB 1122, and when the TLB 1122 is hit and the physical address outputted from the TLB 1122 is effective and the both are the same value, the data cache is hit. When the TLB 1122 misses or the physical address outputted from the TLB 1122 and the cache address tag do not coincide, it is the data cache miss.

In case the TLB 1122 is hit and the data cache is miss, the physical address is outputted to the bus interface unit 110 and the external memory is block-accessed to fetch data and to update the data cache entry.

In an 8-byte data bus mode, 32-byte data is fetched by one block-read to register in the cache. In a 4-byte data bus mode, 16-byte block-read is executed twice to fetch 32-byte data and to register in the cache. The block-read is executed by wrapping around the address in ascending order from data necessary as the operand, and data necessary as the operand is transferred to the BaseADDR register 913, SD register 1123 or DDR register 1128 in parallel to registering into the data cache.

When both the TLB 1122 and the cache are miss, the cache entry is not updated and the cache is accessed again after updating the entry of the TLB 1122.

In the data storing operation, the logical address of data to be stored outputted from the AA register 1127 is translated into the physical address in the TLB 1122, the physical address is transferred to the bus interface unit 110 via the store buffer address unit (WBPA) 1126, and data outputted from the DDW 1129 is transferred to the bus interface unit 110 via the store buffer data unit (WBD) 1125.

When the TLB 1122 misses, after operating the DAT mechanism 1121 and updating the entry of the data TLB 1122, which is accessed again. When the TLB 1122 hits and data which overlaps with the store data is held in the SD 1123 or the data cache at transmission to the store buffer from the DDW 1129, the content is rewritten.

Overlap check of the SD 1123 and overlap check of the data cache are executed respectively in the SDA 1124 and the tag in the cache based upon the physical address. The data cache is a write-through type, thus the content of cache is not changed when the writing operation is missed (no overlapping).

When the TLB 1122 misses, the DAT mechanism 1121 outputs the physical address and accesses the section table entry or the page table entry for address translation. In the TLB 1122, when the M flags (change state) of the entries are changed by hit of the data write access, the M flag in the memory is changed instantly.

Even during transferring of the address and data to the bus interface from the store buffer, the data cache accepts read access or write access of the operand access unit 112 and others. Accordingly, even when unprocessed data is present in the store buffer, the operand access unit 112 can continue the following processings as far as the TLB 1122 and cache hit.

Reading and writing of the operand, reading for memory indirect addressing and reading and writing due to the TLB miss are all checked whether they are in the I/O regions or not. Memory indirect access for the I/O regions is the address translation exception. Operand pre-fetch from the I/O regions is restrained until the preceding instruction in the pipeline has been all executed. In case the TLB 1122 or cache misses, memory access for the operand pre-fetch of the instruction following the conditional branch instructions (Bcc, ACB, SCB) is also restrained until the preceding conditional branch instruction has been executed.

During the bus snooping operation of the data processor 100 of the present invention, the physical address of data to be invalidated is transferred to the operand access unit 112 from the bus interface unit 110. The data cache invalidates all of the 32-byte data which are hit by the address.

(4.7) "IROM Unit"

In the IROM unit 118, a μ-ROM (IROM) storing various μ-program routines controlling the integer operation unit 115, a μ-sequencer and a μ-instruction decoder are included. In the IROM unit 118, the operation of the integer operation unit 115 is controlled by the μ-program decoding unit 117. The μ-sequencer accepts exception, interruption and trap (EIT) and executes sequence processing of the μ-programs corresponding to the EIT, besides the sequence processing for executing the μ-program related to the instruction execution.

Figure 18:
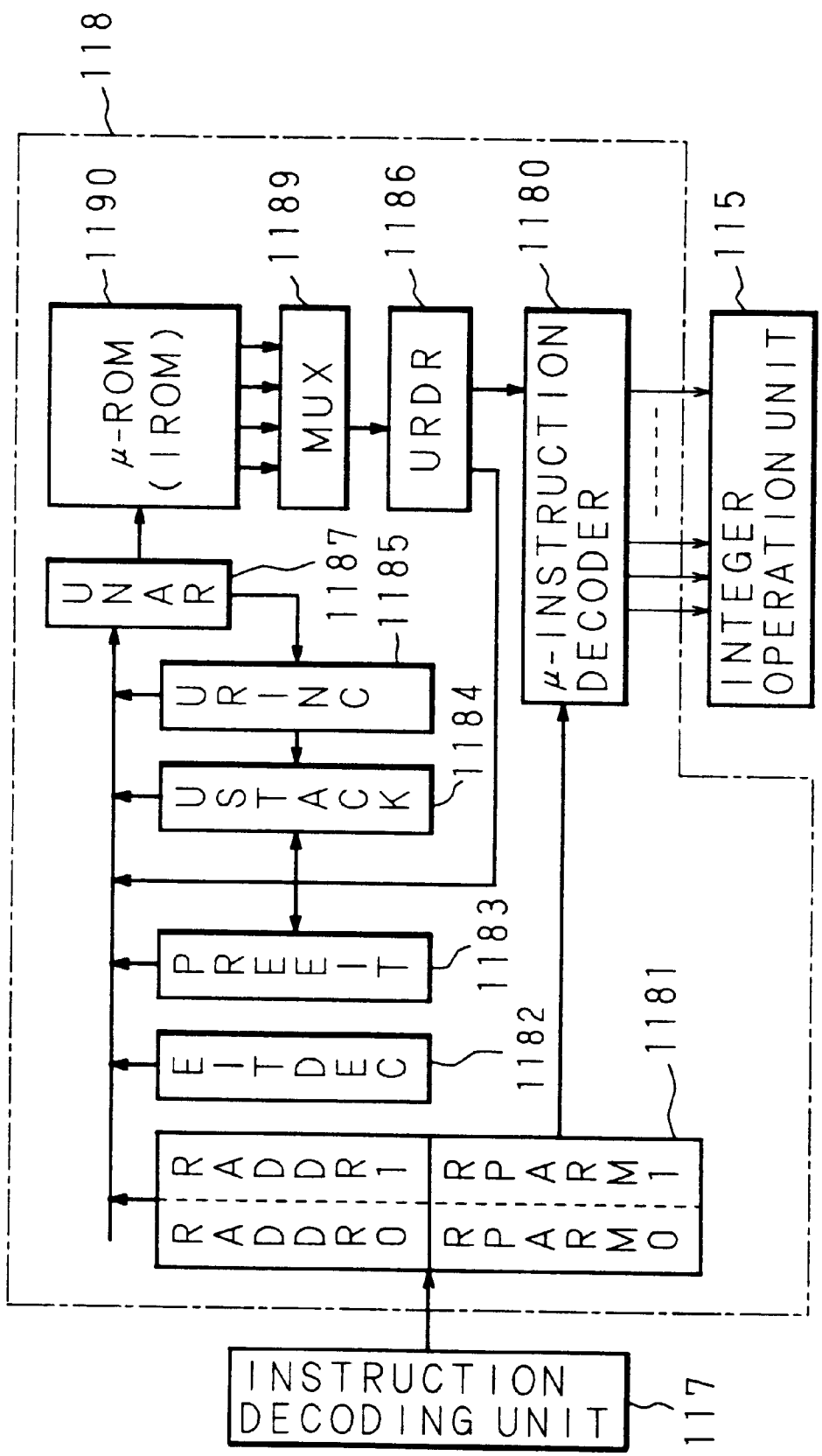
FIG. 18 is a block diagram showing a configuration of an IROM unit of a data processor of the present invention.

A configuration of the IROM unit 118 is shown in a block diagram of FIG. 18.

An input latch 1181 of the R code is constituted by a μ-entry address (RADDR0:1) and a parameter (RPARM0:1) and assumes a 2-entry queue. The sub-R code is treated as a part of parameter of the R code.

An EITDEC 1182 is a decoder which outputs an entry address of the μ-program routine responsive to the kinds of EIT.

A PREEIT 1183 is a register for holding an entry address of the μ-program routine which executes the EIT preprocessing depending on the instruction when the EIT is accepted while executing the instruction, and the instruction dependent address is set when executing the instruction accepting the EIT while executing the instruction such as the arbitrary length bit field instruction or the storing operation instruction.

A USTAC 1184 is a stack for μ-program and holds a return destination address from the μ-program subroutine. As the return destination address, a next address of the subroutine call instruction set from a URINC 1185 and an address set distinctly from a URDR 1186 by the μ-program are possible.

A UNAR 1187 is a μ-program counter. The URINC 1185 is an incrementer which increments a value of the UNAR 1187. The URDR 1186 is an output latch of the μ-instruction. For executing conditional jump without a delay slot, four words are read out from the μ-ROM at a time at the μ-program jump, and one out of four words is selected by the MUX 1189.

A μ-ROM (IROM) 1190 is ROM of 155 bits×4K words. A μ-instruction decoder 1180 decodes the μ-instruction outputted from the URDR 1186 and a parameter outputted from RPARM0:1 of the input latch 1181, and outputs the control signal of the integer operation unit 115.

In case two instructions are decoded simultaneously in the instruction decoding unit 117, the decoded result of the preceding instruction thereof is outputted as the R code, and the decoded result of the following instruction is included in the RPARM held in the input latch 1181 as the sub-R code and inputted to the μ-instruction decoder. The sub-R code is decoded by the μ-instruction decoder together with the final μ-instruction of the preceding instruction, and executed in a sub-ALU or a sub-barrel shifter.

The μ-instruction is read out from the μ-ROM 1190 once at every one clock, and one register-register operation is executed by one μ-instruction. Accordingly, the basic instructions of transferring, comparison, addition, subtraction and logical operation are completed at one clock. In case the sub-R code is included in the basic instruction parameter (RPARM), the basic instruction for the R code and the register-register operation instruction for the sub-R code are executed at one clock, thus the instruction execution speed is 2 instructions/clock.

In case the EIT is accepted during execution of the instruction, a value of the PREEIT 1183 is transferred to the UNAR 1187, and the μ-program jumps to a μ-address held in the PREEIT 1183 for pre-processing of the EIT, and thereafter jumps to the processing routine of the EIT outputted from the EITDEC 1182. In case the EIT is accepted at the completion of the instruction, the PREEIT 1183 is not used, jumps directly to the EIT processing routine outputted from the EITDEC 1182.

(4.8) "FROM Unit"

In the FROM unit 119, a μ-ROM (FROM) storing various μ-program routines which control the floating-point operation unit 116, a μ-sequencer and a μ-instruction decoder are included. In the FROM unit 119, besides the floating-point operation, the operations (MUL, MULU, MULX, DIV, DIVU, DIVX, REM, REMU instructions) of integer multiplication, integer division and integer remainder are executed in cooperation with the IROM unit 118, and further, the instruction for operating the register of the floating-point operation unit 116 such as the context switch instruction is executed.

In case of the floating-point operation instruction is decoded in the instruction decoding unit 117, the decoded result is outputted simultaneously to the IROM unit 118 and the FROM unit 119, and at a first μ-step the integer operation unit 115 and the floating-point operation unit 116 operate in cooperation with each other. After a second μ-step, the μ-sequencer of the FROM unit 119 and the μ-sequencer of the IROM unit 118 are controlled independently, and the two operation units operate in parallel so that the floating-point operation unit 116 executes the following processing and integer operation unit 115 executes the next integer operation instruction. In case the integer operation instruction using the floating-point operation unit 116 or the context switch instruction is decoded, the decoded result is outputted simultaneously to the IROM unit 118 and the FROM unit 119, and the integer operation unit 115 and the floating-point operation unit 116 operate in cooperation with each other in all steps.

Figure 19:
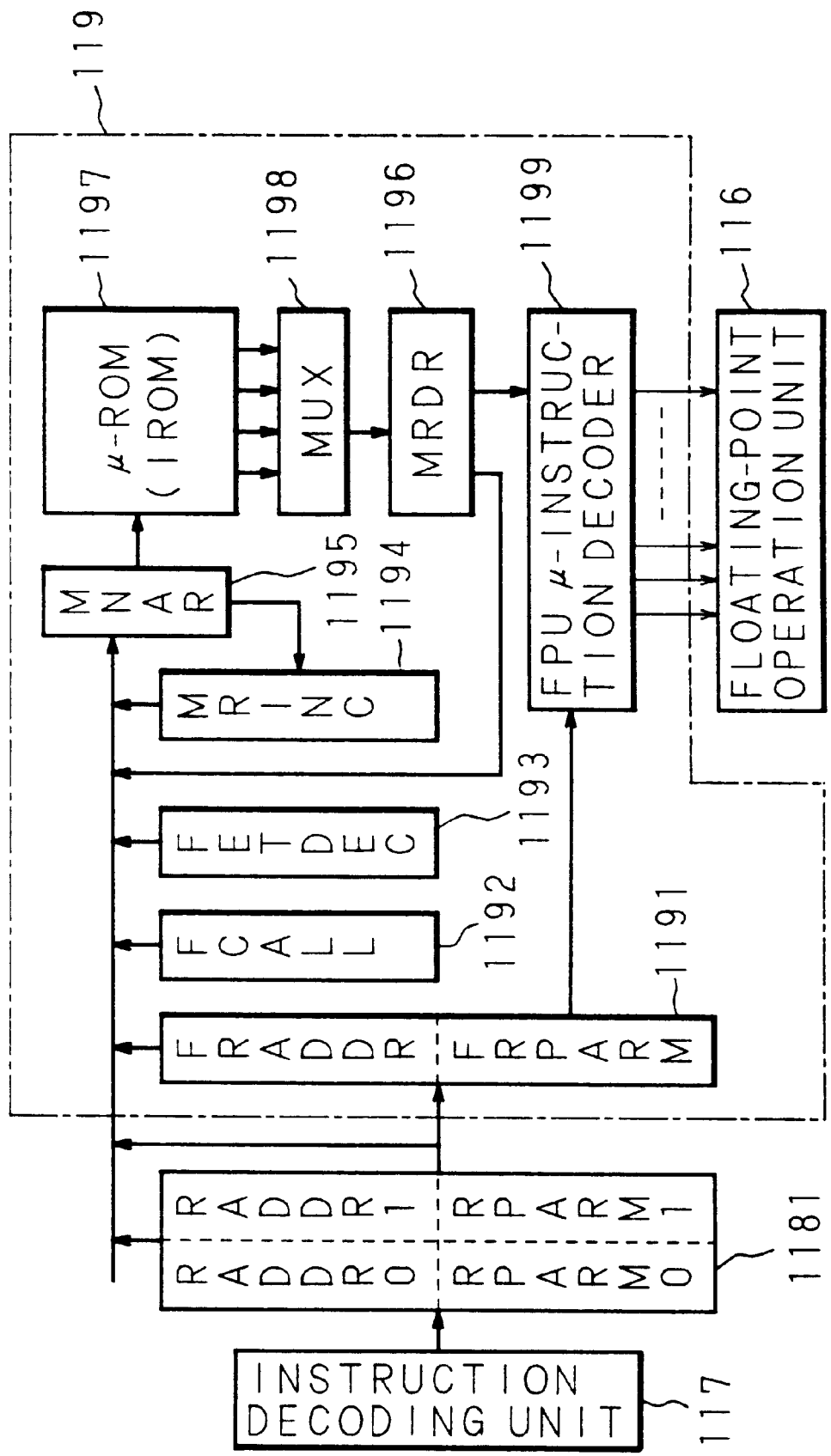
FIG. 19 is a block diagram showing a configuration of an FROM unit of a data processor of the present invention.

A configuration of the FROM unit 119 is shown in a block diagram of FIG. 19. An FR code is inputted to FRADDR and FRPARM of a latch 1191 from RADDR0:1 and RPARM0:1 of an input latch 1181 of the IROM unit 118. The FRADDR and FRPARM are a latch 1191 for saving an entry address of the μ-program and its parameter temporarily, in case a non-normalized number is inputted to the operand of the floating-point operation instruction or a floating-point operation trap (FET) is detected.

An FETDEC 1193 is, when an FET is generated, a decoder which outputs an entry address of the corresponding μ-program routine responsive to its kinds.

An FCALL 1192 is a register which stores the entry address for the IROM unit 118 to start the FROM unit 119 and to operate the floating-point operation unit 116, in case the EIT processing for the FET is started.

An MNAR 1195 is a μ-program counter. An MRINC 1194 is an incrementer for incrementing a value of the MNAR 1195. An MRDR 1196 is an output latch of the μ-instruction. It is so designed that four words are read out from the μ-ROM 1197 at once and one out of which is selected by an MUX 1198 at jump of the μ-program, for executing the conditional jump of the μ-instruction without delay slots. The MNAR 1195, MRINC 1194 and MRDR 1196 correspond respectively to the UNAR 1187, URINC 1185 and URDR 1186 of the IROM unit 118.

A μ-ROM (FROM) 1197 is a ROM of 50 bits×1K words. A μ-instruction decoder 1199 decodes the μ-instruction outputted from the MRDR 1196 and a parameter outputted from the FRPARM of the latch 1191 to output a control signal of the floating-point operation unit 116.

The μ-instruction is read out once at every one clock from the μ-ROM 1197, and one floating-point operation is completed by, at least, two μ-instructions. A μ-sequencer also processes the trap related to the floating-point operation, besides the sequence processing indicated by the μ-program. In case the FET is detected, an entry address of the FET processing routine corresponding to the kind of FET is outputted from the FETDEC 1193, and is transferred to the MNAR 1195. For the masked FET, the default processing is executed in the FET processing routine and the EIT is not started. Meanwhile, for the unmasked FET, the FET processing routine requests the EIT processing to the IROM unit 118. When the EIT processing for the FET is requested from the FROM unit 119, the IROM unit 118 starts the EIT instantly at intervals of the instruction according to the FE-bit value of the PSW, or starts the EIT just before the next floating-point operation instruction.

(4.9) "Integer Operation Unit"

The integer operation unit 115 is controlled by the μ-program stored in the μ-ROM 1190 of the IROM unit 118, and the operation necessary for realizing the functions of integer operation instructions is executed by a register file and an operator in the integer operation unit 115.

Figure 20:
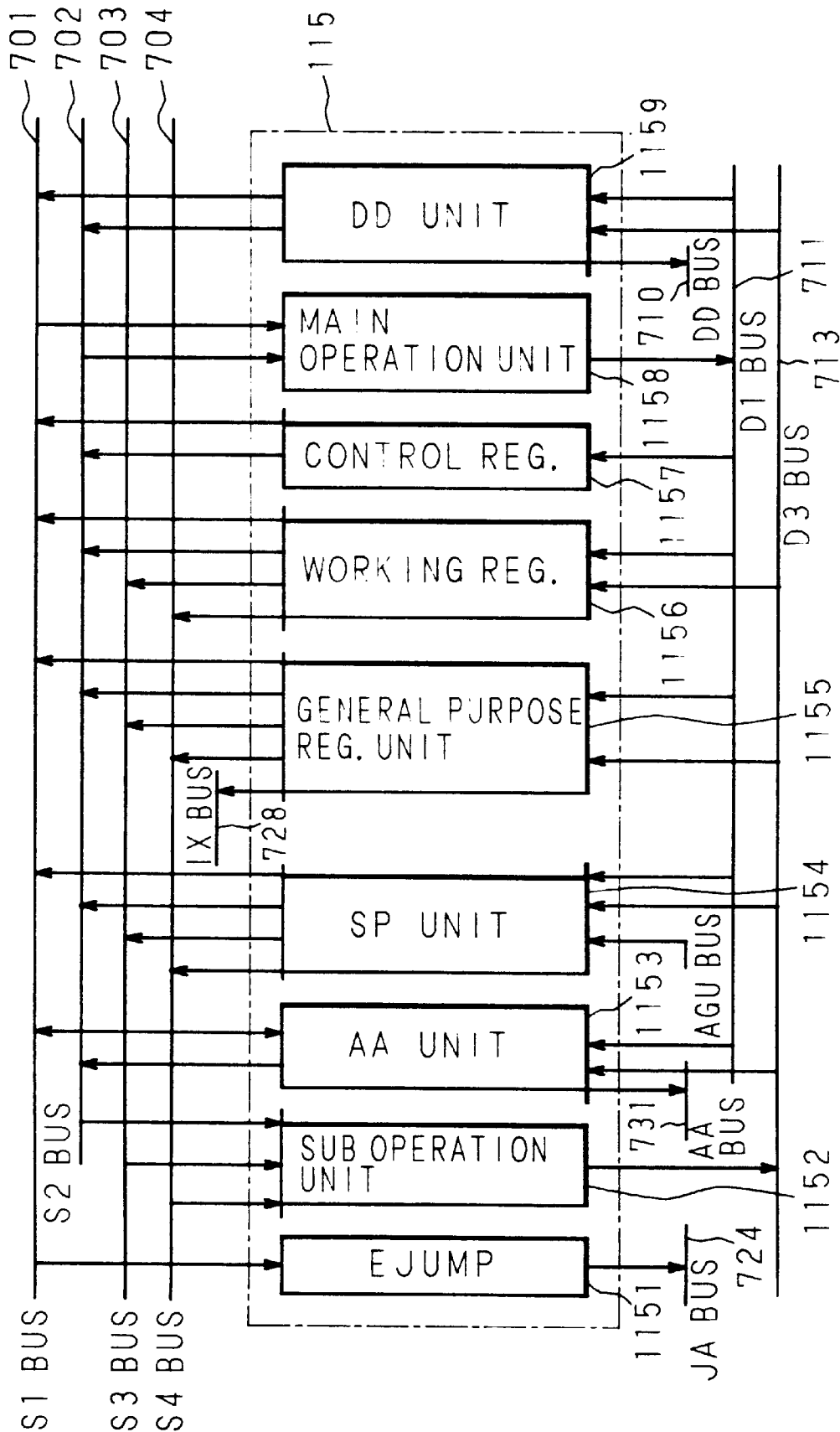
FIG. 20 is a block diagram showing a configuration of an integer operation unit of a data processor of the present invention.

FIG. 20 is a block diagram showing configuration of the integer operation unit 115.

An EJUMP 1151 is register which stores a jump destination address when executing the jump in the instruction execution stage 35 of the pipeline. In case the EIT is detected or the conditional branch instruction whose branch prediction is failed is executed, the execution stage jump is executed after inputting the jump destination address to the register by the μ-program. Since the pipeline is flushed at the execution stage jump, a waste time of three to four clocks is generated to refill the pipeline.

A sub-operation unit 1152 includes a sub-ALU and a sub-barrel shifter, and a main operation unit 1158 includes a main ALU, a main barrel shifter, a priority encoder and a counter. The sub-operation unit 1152 and the main operation unit 1158 are connected to a general purpose register and a working register through three 32-bit buses, and are capable of executing tow register-register operations at a time.

Buses S1 701, S2 702 and D1 711 are for the main operation unit 1158, and buses S3 703, S4 704 and D3 713 are for the sub-operation unit 1152. Two instructions which are decoded simultaneously in the instruction decoding unit 117 are executed simultaneously by the sub-operation unit 1152 and the main operation unit 1158. By operating the sub-operation unit 1152 and the main operation unit 1158 in parallel by the μ-program when executing the high functional instruction, it is also possible to process 8-byte data at a time or execute two operations in parallel.

An AA unit 1153 and a DD unit 1154 are registers for the integer operation unit 115 to communicate with the operand access unit 112, the AA unit 1153 dealing with the address and the DD unit 1154 dealing with data. The AA unit 1153 includes two address registers with increment/decrement function and a bit address calculation circuit which calculates the byte address of bits to be operated from the base address and bit offset. The DD unit 1154 includes a 8-byte data register, thereby data is given to and taken from the operand access unit 112 at a 8-byte unit by the DD bus 710.

An SP unit 1154 includes a working stack pointer for the instruction execution stage 35 and stack pointers (SPI, SP0, SP1, SP2, SP3) for every rings. An SP value of the instruction execution stage 35 is transferred from the address generating unit (AGU) 114 through the pipeline in synchronism with the instruction.

A control register 1157 includes various control registers such as PSW and DMC and a constant ROM.

A general purpose register unit 1155 includes 14 general purpose registers other than an R15 which is a stack pointer. The general purpose register outputs each two data simultaneously to the main operation unit 1158 and the sub-operation unit 1152, and includes four output ports and two input ports for writing two operation results simultaneously. Furthermore, the general purpose register includes one more output port connected to an IX bus 728 for transferring data to the address generating unit 114 for operand address calculation.

There are 16 working registers 1156 all together, and four output ports and two input ports are provided for connection to the main operation unit 1158 and the sub-operation unit 1152 as same as the general purpose register.

Figure 21:
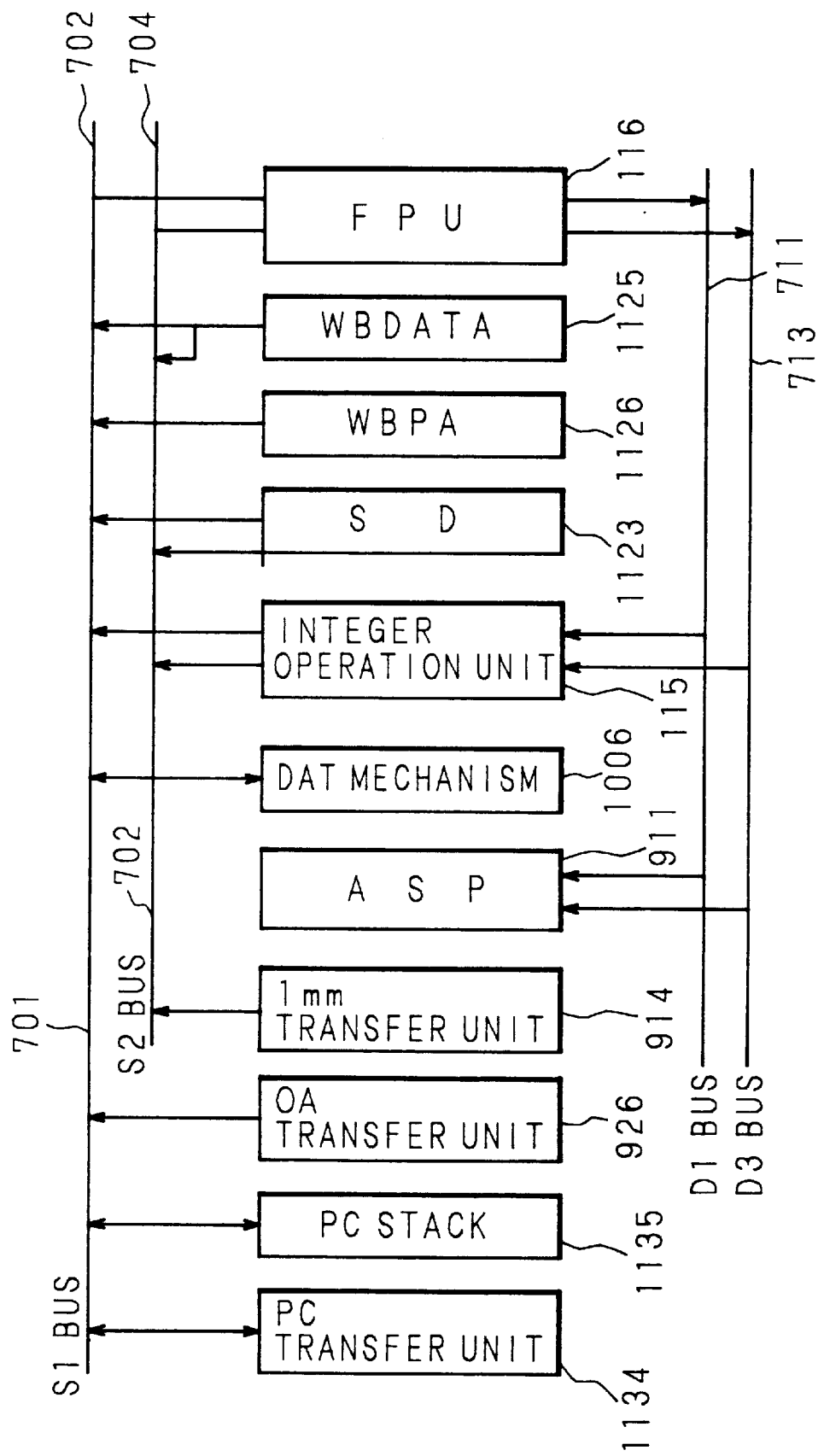
FIG. 21 is a block diagram showing a peripheral configuration of an integer operation unit which is operated by a $\mu$-program of an IROM unit of a data processor of the present invention.

FIG. 21 is block diagram showing a peripheral configuration of the integer operation unit 115 which is operated by the μ-program of the IROM unit 118.

In the integer operation unit 115, the instruction is executed or peripheral blocks are accessed through the S1 bus 701, S2 bus 702, D1 bus 711 and D3 bus 713 for the EIT processings.

From a PC transfer unit 1134 an instruction PC value is transferred. When the PC value of the instruction under execution or the next instruction is required by the EIT, those values are read out from the PC transfer unit 1134.

When executing the RTS, EXITD instructions, a PC stack 1135 reads out a pre-return address to compare with a true return destination address fetched from the memory, and checks whether the pre-return is made to the right address or not.

From an OA transfer unit 926, an operand address or an immediate value calculated in the address generating unit 114 is read out. From an Imm transfer unit 914, the higher 32 bits of a double precision floating-point immediate operand are read out and transferred to the FPU. An ASP 911 is a working stack pointer of the operand generating unit, and is rewritten together with the stack pointer of the SP unit 1154 in FIG. 20, when the stack pointer is rewritten by execution of the instruction or the EIT processing.

A DAT mechanism 1006 includes a DAT mechanism of the instruction fetch unit 111 and the operand access unit 112. The DAT mechanism 1006 includes registers (LSID, SATB, UATB, IOADDR, IOMASK) related to memory access, these registers are accessed by the μ-program.

A pre-fetch operand is outputted from an SD 1123. The pre-fetch operand of 32 bits or less can be outputted to either the S1 bus 701 or S2 bus 702. When outputting the 64-bit pre-fetch operand, the S1 bus 701 and the S2 bus 702 are used in concatenated.

A WBPA 1126 and a WBDATA 1125 are registers which hold the address and data of a store buffer, and when the EIT is generated in the store buffer its content is read by the μ-program.

(4.10) "Floating-point Operation Unit"

The floating-point operation unit 116 is controlled by the μ-program stored in the μ-ROM of the FROM unit 119, and executes the operation necessary for realizing the function of floating-point operation instructions by a register file and an operation unit provided therein. When the floating-point operation unit 116 operates to store the operation result in the floating-point operation register, it operates independently of the integer operation unit 115 by control of the FROM unit 119. In the floating-point operation unit 116, integer multiplication, integer division and integer remainder operations are executed besides the floating-point operation.

Figure 22:
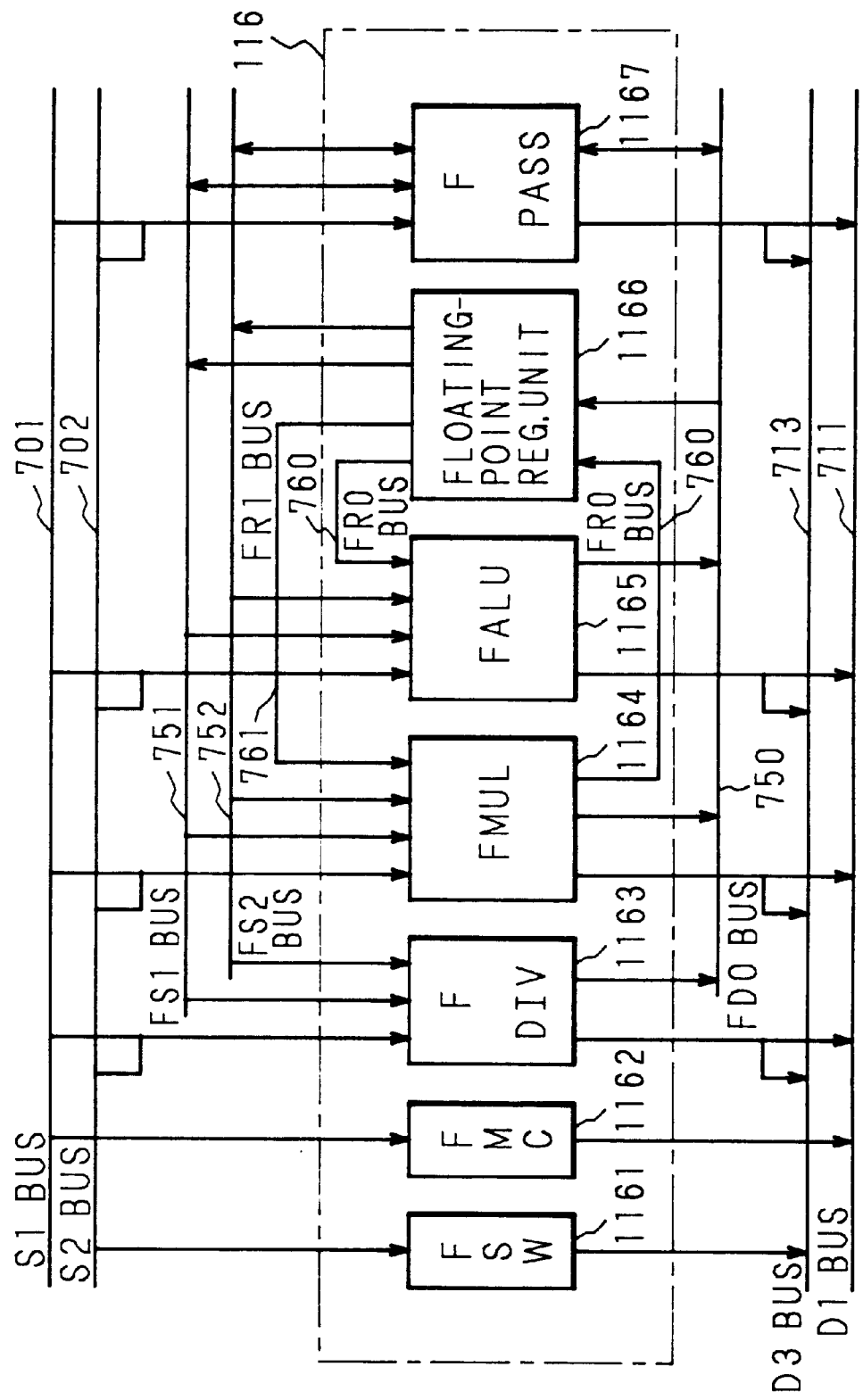
FIG. 22 is a block diagram showing a configuration of a floating-point operation unit of a data processor of the present invention.

FIG. 22 is a block diagram showing a configuration of the floating-point operation unit 116.

The floating-point operation unit 116 includes operation unit of a floating-point ALU (FALU) 1165, a multiplication circuit (FMUL) 1164 and a division circuit (FDIV) 1163, which are connected to a floating-point register unit 1166 by three 64 bit buses FS1, FS2 and FD0.

The FALU 1165 and the FMUL 1164 are connected to an FR0 bus 760 or an FR1 bus 761 by the exclusive 64-bit bus besides the FS1 bus 751, FS2 bus 752 and FD0 bus 750, for executing the addition and multiplication in parallel when executing the FMAC instruction.

An FPASS 1167 includes a function to bypass data between the buses without passing through the operation unit, and checks whether the input operand to the operation units is the non-normalized number, qNaN, sNaN and ±∞ or not. The FPASS 1167 also operates to hold a copy of input operand to the operation units, in preparation for the case wherein a floating-point operation trap (FET) is generated to start the EIT as the result of operation in the operation units.

An FSW 1161 and an FMC 1162 are connected respectively to the integer operation unit 115 by the S2 bus 702 and D3 bus 713 or the S1 bus 701 and D1 bus 711, and are accessed from the integer operation unit 115 when executing the LDC, STC or FSTFSW instructions.

The FDIV 1163, FMUL 1164, FALU 1165 and FPASS 1167 includes input paths from the S1 bus 701 and S2 bus 702 for transferring one input operand from the operand access unit 112, general purpose register or immediate holding register (OA transfer unit 926, Imm transfer unit 914), and includes output paths to the D1 bus 711 and D3 bus 713 for transferring the operation result to the operand access unit 112 or the general purpose register. In the case of transferring 64-bit data, the S1 bus 701, S2 bus 702 and the D1 bus 711, D3 bus 713 respectively operate with concatenating to become a bus of 32 bits×2=64 bits. In case the floating-point operation unit 116 inputs and outputs the memory operand to and from the operand access unit 112, the operands are all transferred via the DD unit 1159 of the integer operation unit 115. Address are all outputted by the integer operation unit 115.

The floating-point operation unit 116 and the integer operation unit 115 can be respectively controlled by the separate μ-programs to execute the instructions independently. However, in case the data processor 100 of the present invention executes the floating-point operation instruction, in a first μ-step for the floating-point operation instruction, the μ-instruction is outputted respectively from the IROM unit 118 and the FROM unit 119, and the integer operation unit 115 and the floating-point operation unit 116 operate in cooperation with each other according to the μ-program. At this time, in the integer operation unit 115, saving of the PC value for the floating-point operation instruction into the exclusive register, and when necessary updating of the stack pointer or transferring of the immediate value and memory operand by the S1 bus 701 and S2 bus 702 are executed. Therefore, during execution of the integer operation by the integer operation unit 115, even when the floating-point operation unit 116 is possible to start execution of the next floating-point operation instruction, until the integer operation unit 115 finishes the integer operation, execution of the next floating-point operation instruction is not started.

In the case of writing the floating-point operation result into the floating-point register, from a second μ-step the floating-point operation unit 116 and the integer operation unit 115 operate independently, the floating-point operation unit 116 continuing execution of the floating-point instruction and the integer operation unit 115 executing the next integer operation. However, in the case of writing the floating-point operation result into the general purpose register or the memory, the integer operation unit 115 operates in cooperation with the floating-point operation unit 116 even after the second μ-step and does not execute the next instruction until the completion of execution of the floating-point operation instruction. Even when the integer operation unit 115 writes the result into the general purpose register and the memory by using the operator of the floating-point operation unit 116 at the integer multiplication instruction and the integer division instruction, the integer operation unit 115 and the floating-point operation unit 116 operate in cooperation with each other to execute the instruction successively.

(5) "Pipeline Processing"

Figure 23:
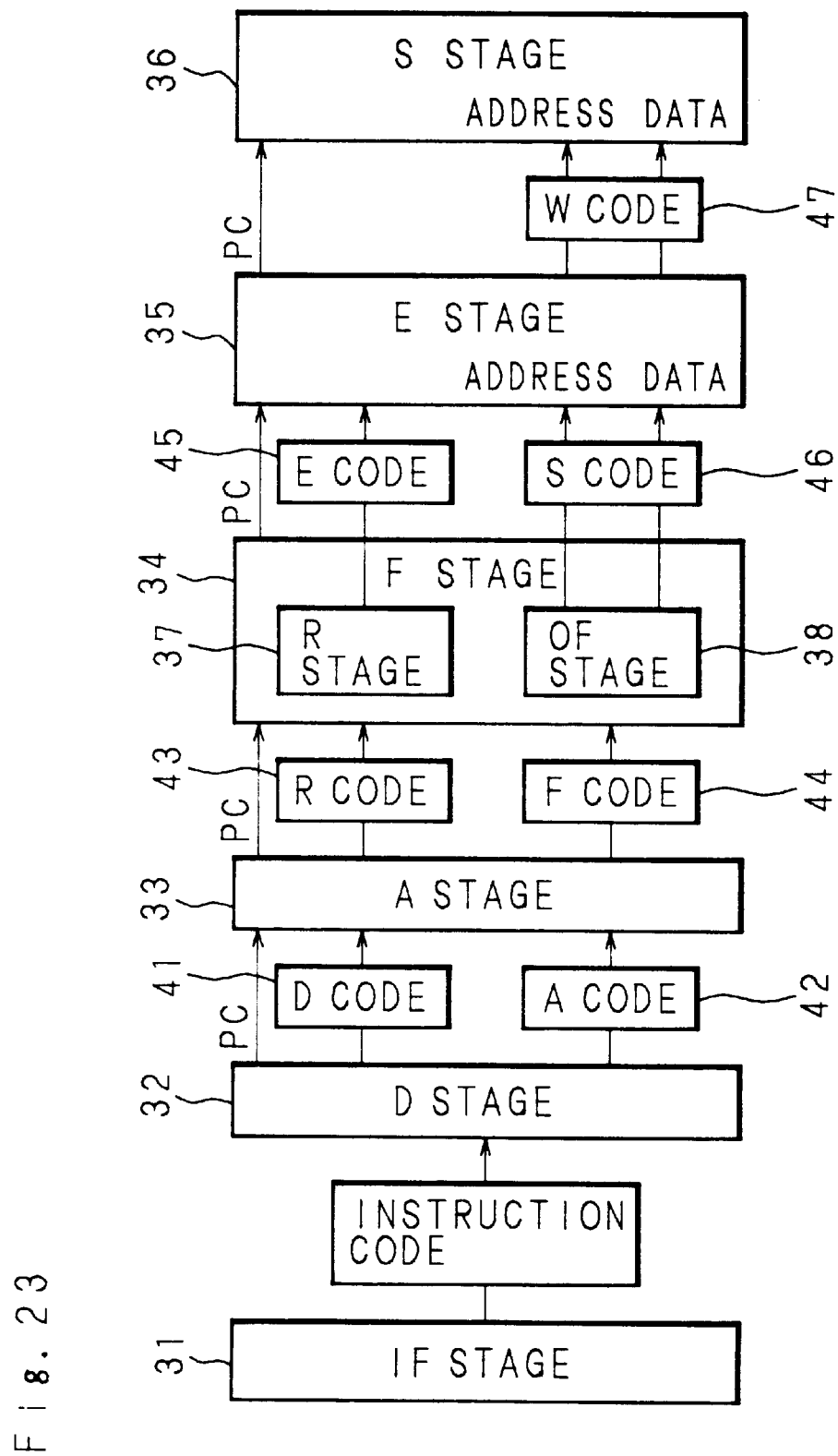
FIG. 23 is a schematic view showing a configuration of an instruction pipeline of a data processor of the present invention.

A configuration of an instruction pipeline of the data processor 100 of the present invention is shown in a schematic view of FIG. 23.

Pipeline processings are executed by a 6-stage configuration of an instruction fetch stage (IF stage) 31 for prefetching the instruction, a decoding stage (D stage) 32 for decoding the instruction, an address generating stage (A stage) 33 for generating the operand address, an operand fetch stage (F stage) 34 for accessing μ-ROM (particularly called an OF stage), and prefetching memory operand (particularly called an F stage), an execution stage (E stage) 35 for executing the instruction and a store stage (S stage) 36 for storing the memory operand.

The IF stage 31 includes a 32-byte instruction prefetch queue, the F stage 34 includes 2-stage operand prefetch queues and the S stage 36 includes 3-stage store buffers.

Respective stages operate independently of the other stages, thus logically 6 stages operate completely independently. The stages except the S stage 36 execute one processing at, at least, one clock. The S stage 36 executes one operand store processing at, at least, two clocks. Thus, in the case where there is no memory operand store processing, ideally, the pipeline processing proceeds sequentially at every one clock.

In the data processor 100 of the present invention, though there are instructions which can not be processed by one basic pipeline processing such as the memory-memory operation and memory indirect addressings, it is so constituted that a balanced pipeline processing can be executed as much as possible even for these processings. In the data processor 100 of the present invention, for the instruction having a plurality of memory operands, the pipeline processing is executed such that one instruction is decomposed into a plurality of pipeline processing units (step codes) in the decoding stage based upon the number of memory operands.

Input/output step codes of the pipeline stages are named as shown in FIG. 23 for conventional sake. The step codes execute processings related to the operation codes, and consists of two groups such as a group which serves as the entry address of the μ-ROM or a parameter for the E stage 35 and a group which serves as the operand to be processed of the E stage 35.

Between from the D stage 32 to the S stage 36, the program counter value of the instruction under processing is delivered subsequently, and between from the A stage 33 to the E stage 35, the stack pointer value is delivered.

Information delivered to the D stage 32 from the IF stage 31 is the instruction code itself. Information delivered to the A stage 33 from the D stage 32 are information (called a D code 41) related to the operation designated by the instruction, information (called an A code 42) related to the operand address generation and the instruction program counter value. Information delivered to the F stage 34 form the A stage 33 are an R code 43 including an entry address of the μ-program routine and a parameter to the μ-program, an F code 44 including operand address and accessing process indicating information, the program counter value and the stack pointer value of the instruction under processing. Information delivered to the E stage 35 from the F stage 34 are an E code 45 including operation control information and literal, an S code 46 including the operand and operand address, the program counter value and stack pointer value of the instruction under processing. The S code 46 is consisting of the address and data. Information delivered to the S stage 36 from the E stage 35 are a W code 47 which is the operation result to be stored and the program counter value of the instruction which has outputted the operation result. The W code 47 is consisting of the address and data.

The E stage 35 is the original stage for executing the instruction. The IF stage 31, D stage 32, A stage 33 and F stage 34 are the stages which execute the pre-processing for executing the instruction, wherein though the instruction code and operand are read, contents of the memory and register are never changed. And hence, the processings in these stages can be canceled on the way.

(5.1) "Instruction fetch stage"

In the instruction fetch stage (If stage) 31, an instruction fetch unit 111 is operated. In the IF stage 31, the instruction is fetched from the built-in instruction cache 51 or the outside, and is inputted to the instruction queue to output the instruction code for the D stage 32 at a 2 to 8-byte unit.

Input of the instruction queue is executed at an aligned 16-byte unit when the built-in instruction cache 51 hits, and executed at an aligned 4-byte unit when misses. Two instruction queues are provided for fetching both the instruction following the conditional branch instruction and the branch destination instruction.

In case of fetching the instruction from the outside at a standard accessing mode, at least, two clocks are necessary for the aligned 4 bytes. At a burst mode, at least, five clocks are necessary of the 16 bytes. When the instruction is fetched from the outside, it is checked whether the fetch destination physical address is in the I/O regions or not. Instruction fetch from the I/O regions is forbidden, so that it becomes EIT.

In case the built-in instruction cache 51 hits, the instruction is fetched at one clock for the aligned 16 bytes. An output unit of the instruction queues is variable at every 2 bytes, and 8 bytes can be outputted at the maximum during one clock.

Conversion of the instruction logical address into the physical address, control of the built-in instruction cache 51 and the instruction TLB, management of the pre-fetch destination instruction address and control of the instruction queue are executed in the IF stage 31.

(5.2) "Instruction decoding stage"

In the instruction decoding stage (D stage) 32, the instruction decoding unit 117 and the PC generating unit 113 are operated.

In the D stage 32, pre-stage decoding of the instruction operation code inputted from the IF stage 31 and decoding of the addressing mode are executed.

In the instruction decoding processing in the D stage 32, a main decoder 1172, a first sub-decoder 1173, a second sub-decoder 1174, an addressing mode decoder 1175 and an extended data processing unit 1176 of the instruction decoding unit 117 are operated.

Decoding is executed once at one clock and 0 to 8-byte instruction codes are consumed at one decoding processing (however, the instruction code is not consumed in the output processing of the step code including the return destination address of the subroutine return instruction). Instructions which can not be decoded by one decoding processing such as the instruction having two memory operands or the instruction using the chained addressing mode are decomposed into the step codes in the D stage 32. Therefore, even when the entire decoding is not finished, the D code 41, A code 42 and instruction PC value are outputted by the decoding processing at each clock.

In the D stage 32, the PC generating unit 113 calculates the instruction PC values based upon the instruction length consumed with the instruction decoding. For the conditional branch instruction, jump instruction (including the subroutine jump instruction) to the absolute address or the PC relative address and subroutine return instruction, the pre-jump processing (D stage jump) is executed in the PC generating unit 113.

In the case of decoding the unconditional jump instruction for pre-jump, it is instructed to the IF stage 31 that the instruction is fetched from the jump destination and inputted to the queue, after canceling the content of instruction queue which is used at present. In the case of decoding the conditional branch instruction which is predicted to branch, it is requested to the IF stage 31 that the queue which is used at present is left as it is, and the instruction is fetched from the branch destination and inputted to the other instruction queue.

At one decoding, the A code 42 which is address calculation information, the D code 41 which is the intermediate decoded result of the operation code and the instruction PC value are outputted to the A stage 33.

(5.3) "Address generating stage"

In the address generating stage (A stage) 33, the instruction decoding unit 117 and the address generating unit 114 are operated.

The A stage 33 decodes the D code 41 transferred from the D stage 32 to output the R code 43, and generates the operand address according to the A code 42 to output the F code 44. The PC value transferred from the D stage 32 is transferred to the F stage 34 as it is. The A stage 33 calculates a stack pointer value of the instruction under processing independently of the instruction execution stage 35 to transfer to the F stage 34.

In the instruction decoding processing in the A stage 33, an A-stage decoding 1177 and a sub-code transfer unit 1178 of the instruction decoder unit 117 are operated. The intermediate decoded result of the operation code outputted from the D stage 32 is further decoded in detail, and the entry address of the μ-ROM and parameter to the μ-program are outputted as the R code 43.

The address generating unit 114 generates an operand address according to the A code 42.

For the register indirect mode and the register relative mode, a value of the general purpose register is referred to through the IX bus 728. A displacement value, an immediate value and an absolute address value are transferred from the instruction decoding unit 117 through the DISP bus 727 as a portion of A code 42. For the memory indirect mode, the operand access unit 112 is accessed. In the PC relative mode, a PC value (APC) of the instruction under processing transferred from the D stage 32 is used. For the stack-pop mode or push mode, the SP value is calculated by exclusive working stack pointer. The calculated SP value is outputted to the F stage 34 together with the F code 44.

For the jump instruction except the absolute jump such as a register indirect jump or a memory indirect jump and the PC relative jump, the address generating unit 114 calculates the jump destination address for pre-jump processing (A stage jump). For the conditional branch instruction which is predicted to branch, the instruction length transferred from the DISP bus 727 and the APC value are added to calculate the address of the following instruction of the branch instruction.

The return destination address calculation of the subroutine jump instruction is also calculated by adding the instruction length transferred from the DISP bus 727 and the APC value. For the conditional branch instruction which is predicted not to branch, the branch destination address is calculated and transferred to the instruction fetch unit 111, whereby it is instructed to the instruction queue which is not used at present, to fetch the instruction from its branch destination address.

In the address generating unit 114, a scoreboard register is provided to detect a data hazard which is generated by conflict between the register and memory for use in the address calculation, and to interlock the pipeline.

In the A stage 33, a data hazard at reading data from the register or memory for registering (write reserve) the destination operand into the scoreboard register and generating the address is also checked. In the scoreboard register, 16 flags are provided for the 16 general purpose registers and one flag is provided for the memory for use in the above-mentioned register and conflict check.

Since the chained addressing mode is used in the data processor 100 of the present invention, the instruction decomposed into plural step codes in the D stage 32 is that, the operand address is calculated in the A stage 33 and degenerated into one step code.

Instructions (LDM, STM, ENTER, EXITD, FLDM, FSTM) showing the register number of the transfer operand are decomposed into the plural step codes in the A stage 33 by the register list. These instructions are decomposed into the instruction which transfers data of one or two registers in the A stage 33, and subjected to pipeline processing in the F stage 34, E stage 35 and S stage 36. The register number to be transferred by the decomposed step codes is obtained by encoding the register list by priority encoder provided in the A-stage decoder 1177.

(5.4) "Operand fetch stage"

In the operand fetch stage (F stage) 34, the IROM unit 118, FROM unit 119 and operand access unit 112 are operated.

The $\mu$-TOM access operation by the IROM 118 and the FROM unit 119 for the R code 43 and the operation in the operand access unit 112 are executed under the independent control. In case of dealing with these operations separately, the $\mu$-ROM access processing of the IROM unit 118 and the FROM unit 119 is specified as an R stage 37, and the processing of the operand access unit 112 is specified as an OF stage 38.

The R stage 37 inputs the R code 43 and outputs the E code 45. The OF stage 38 inputs the F code 44 and outputs the S code 46. Though the F code 44 is not queued, the R code 42 is queued up to two, and though the E code 45 is not queued, the S code 46 is queued up to two.

The $\mu$-ROM access processing which is the processing of the R stage 37 is the $\mu$-ROM access and $\mu$-instruction decoding processing for creating the E code 45 which is the execution control code used in execution in the next E stage 45 for the R code 43.

In case one processing for the R code 43 is decomposed into two or more $\mu$-program steps, the IROM unit 118 and the FROM unit 119 are used in the E stage 35, and the next R code 43 is in $\mu$-ROM access waiting. $\mu$-ROM access for the R code 43 is executed when $\mu$-ROM access is not executed in the E stage 35. Since many integer operation instructions are completed in one $\mu$-program step and many floating-point operation instructions are completed in one $\mu$-program step in the data processor 100 of the present invention, in fact, $\mu$-ROM access for the R code 43 is executed subsequently in many cases.

In the processing of the R stage 37, only the IROM unit 118 operates for the instruction which does not use the floating-point operation unit 116, thus the FROM unit 119 can execute the other processing. Therefore, it is possible to start the next integer operation instruction in an overlapping fashion before the floating-point operation instruction processing is finished. In the operand fetch stage 34, the logical address of the F code 44 is translated into the physical address by the data TLB 1122, and the built-in data cache is accessed by the physical address to fetch the operand, which is combined with the logical address of the F code 44 and is outputted as the S code 46.

In one F code 44, an 8-byte boundary may be crossed, but the operand fetch below 8 bytes is designated. The F code 44 also includes designation of whether or not to access the operand, and in the case of transferring the operand address itself calculated in the A stage 33 or the immediate value to the E stage 35, the operand is not fetched and the content of the F code 44 is transferred as the S code 46. Since up to two queuings are possible for the S code 46, up to two pre-fetching are possible for the operand.

In the case of fetching the operand from the outside in the standard access mode, at least, two clocks are needed per aligned 8 bytes. In the burst mode, at least, 5 clocks are needed for 32 bytes. When fetching the operand from the outside, it is checked whether the fetch destination physical address is in the I/O regions or not. Operand is not pre-fetched from the I/O regions. In this case, the operand is fetched only after all of the preceding instructions are executed and the instruction for accessing the I/O regions is surely executed. In the instruction following the conditional destination instruction, the operand is not fetched until the preceding conditional branch instruction was executed. This is for restraining the operand pre-fetch of the instruction which can not be executed logically.

When the built-in data cache hits, the operand is fetched at one clock per 8 bytes.

Conversion of the operand logical address into the physical address, control of the built-in data cache 52 and instruction TLB, management of the pre-fetch destination operand address and control of queues of the S code 46 are executed in the OF stage 38.

(5. 5) "Execution stage"

In the execution stage (E stage) 35, the integer operation unit 115 and the floating-point operation unit 116 are operated by the E code 45 and the S code 46 as inputs.

This E stage 35 is the instruction execution stage, and all processings executed in the stages before the F stage 34 are the pre-processings for the E stage 35. In case the jump is executed or the EIT processing is started in the E stage 35, the processings executed between the IF stage 31 and the F stage 34 are all invalidated. The E stage 35 is controlled by the $\mu$-program and the instruction is executed by executing a series of $\mu$-instruction from the entry address of the $\mu$-program routine indicated in the R code 43.

In the E code 45, there are a code (particularly called an EI code) controlling the integer operation unit 115 and a code (particularly called an EF code) for controlling the floating-point operation unit 116, the EI code and the EF code can be outputted independently. In the case of outputting the EI code and the EF code at a time, the integer operation unit 115 and the floating-point operation unit 116 are operated in parallel in the E stage 35. For example, when executing the floating-point operation instruction in which the destination operand is the floating-point register by the floating-point operation unit 116, which is separated from the integer operation unit 115 from the second µ-step operation, the floating-point operation unit 116 is operated independently of the integer operation unit 115 in parallel. In all instructions including the floating-point operation instruction, the integer operation unit 115 executes, at least, one µ-instruction (even in the floating-point operation instruction, the integer operation unit 115 always operates at the first one clock).

In the integer operation as well as the floating-point operation, reading of the µ-ROM and execution of the µ-instruction are executed in pipeline processings. Since the conditional branch of the µ-program is executed by a Y decoder (a decoder for selecting the aimed µ-instruction from plural instruction read out simultaneously from the µ-ROM) of the µ-ROM, even when the conditional branch is generated the µ-program is executed even without a gap of one clock. In the E stage 35, cancellation of reservation of writing into the scoreboard register which was made in the A stage 33, rewriting the branch prediction table when the branch prediction in the D stage 32 is wrong and checking whether the pre-return address is correct or not are executed.

Various interruptions are accepted directly in the E stage 35 at intervals of the instruction and the necessary processings are executed by the µ-program. Other processings of the various EITs are also executed by the µ-program in the E stage 35.

When it is necessary to store the operation result in the memory, the E stage 35 outputs both the W code 47 and the program counter value of the instruction which executes storing processing to the S stage 36. Storing the operand in the memory is executed in order designated logically by the program irrespective of the integer operation result and the floating-point operation result. In the case of storing data in the memory from the floating-point operation unit 116, the integer operation unit 115 will not execute the all following instructions until the instruction is finished, or the instruction execution stage moves to the store stage 36.

(5.6) "Store stage"

In the store stage (S stage) 36, the operand access unit 112 is operated.

The store stage 36 translates the logical address of the W code 47 into the physical address by the data TLB 1122, and stores data of the W code 47 in the built-in data cache by the address. Simultaneously, the W code 47 and the program counter value are inputted to store buffers for storing process of data of the W code 47 in the external memory by using the physical address outputted from the data TLB 1122. The store buffers are in three stages, thereby store requests may queued up to there. Storing the operand in the external memory from the store buffers is executed, at least, once per two clocks.

The operation of the S stage 36 is executed in the operand access unit 112, the address translation processing and replacement processing of the built-in data cache when the data TLB 1122 and the built-in data cache have missed are also executed.

When the EIT is detected in the operand store processing, the EIT is informed to the E stage 35, while holding the W code 47 and the program counter value in the store buffer. When the EIT is generated in the store buffer, entry of the data cache which has hit is already rewritten, so that it is difficult to specify whether it is used in the following instruction. The entry of the data cache which has hit is never invalidated automatically in hardwares by the EIT of the store buffer.

(5.7) "Pipeline control"

Each of the pipeline stages includes an input latch and an output latch, and basically operates independently of the other stage. Each stage transfers the processing result, when the preceding processing is finished, to the input latch of the following stage from the output latch, and start the next processing when input signals necessary for the next processing are all gathered in the input latch of its own stage.

That is, each stage starts the next processing when the input signals for the next processing outputted from the proceeding stage are all valid, and the output latch is emptied by transferring the present processing result to the input latch of the succeeding stage. In other words, the input signals must be all ready at timing immediately before each stage starting the operation. When the input signals are not ready, the stage assumes a wait state (input waiting).

When transferring to the input latch of the following stage from the output latch, the input latch of the following stage must be in a vacant state, even when the input latch of the following stage is not vacant, the pipeline stage assumes the wait state (output waiting). When the cache or TLB misses, or data interference is generated between the instructions which are under processing in the pipeline, plural clocks are required for one stage processing, thus the pipeline processing is delayed.

(6) "Detailed operation of Operand access unit 112"

(6.1) "Configuration of Operand access unit 112"

Figure 24:
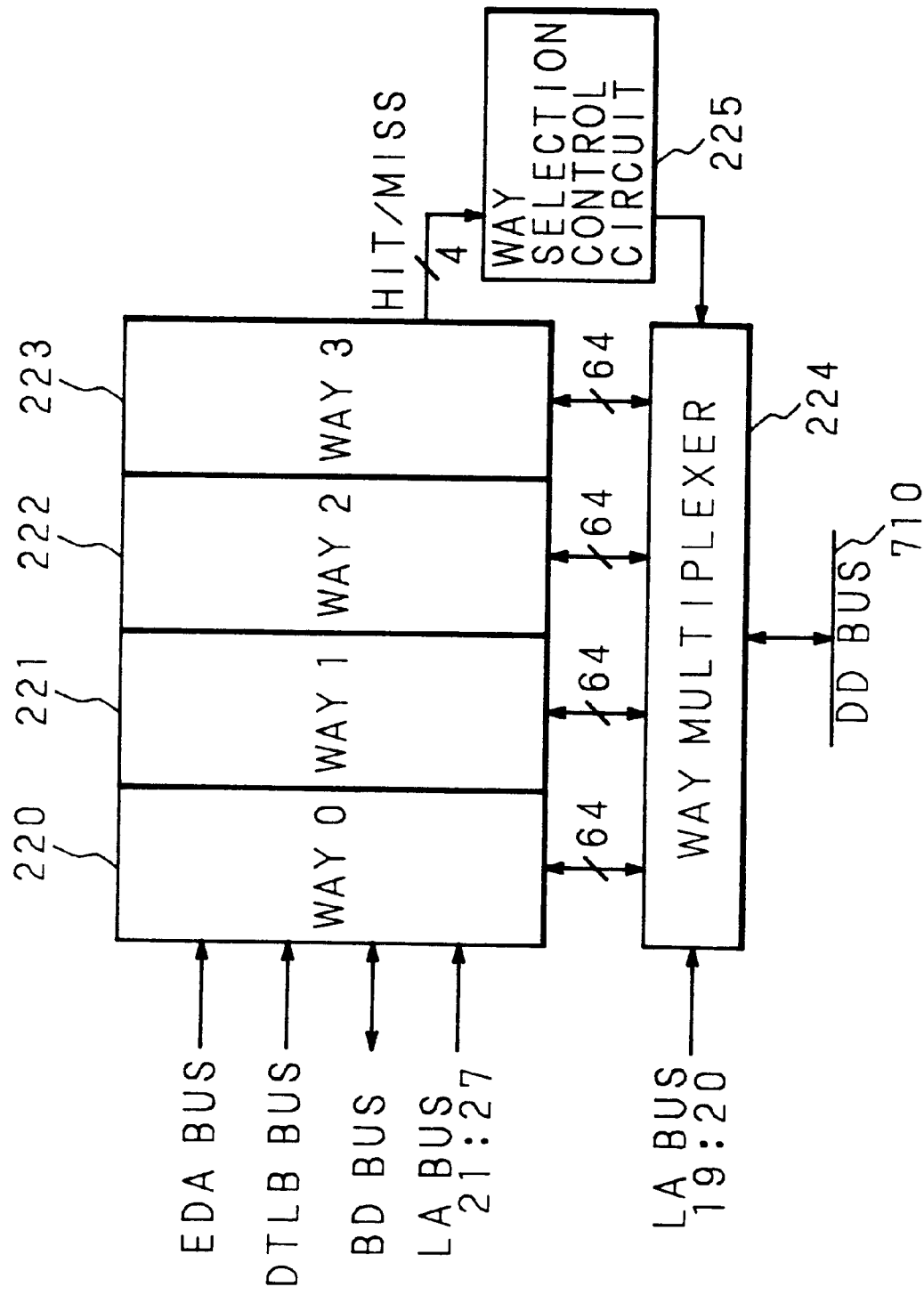
FIG. 24 is a schematic view showing a way configuration of a data buffer of an operand access unit of a data processor of the present invention.

FIG. 24 is a schematic view showing a way configuration of a data buffer 52 of the operand access unit 112.

Since the data buffer 52 operates as the 4-WAY data cache, it is constituted by four memory blocks of WAY0 220, WAY1 221, WAY2 222 and WAY3 223. When accessing the data buffer 52 from the DD bus 710, either one is selected and accessed via a WAY multiplexer 224. In case the data buffer 52 operates as the data cache, the WAY multiplexer 224 selects the WAY0 220, WAY1 221, WAY2 222 and WAY3 223 according to hit/miss or LRU algorithm by a WAY selection control circuit 225. In case the data buffer 52 operates as a context saving control space memory, the WAY multiplexer 224 selects the WAY0 220, WAY1 221, WAY2 222 and WAY3 223 according to address bit 19:20 transferred from the LA bus 742.

Figure 25:
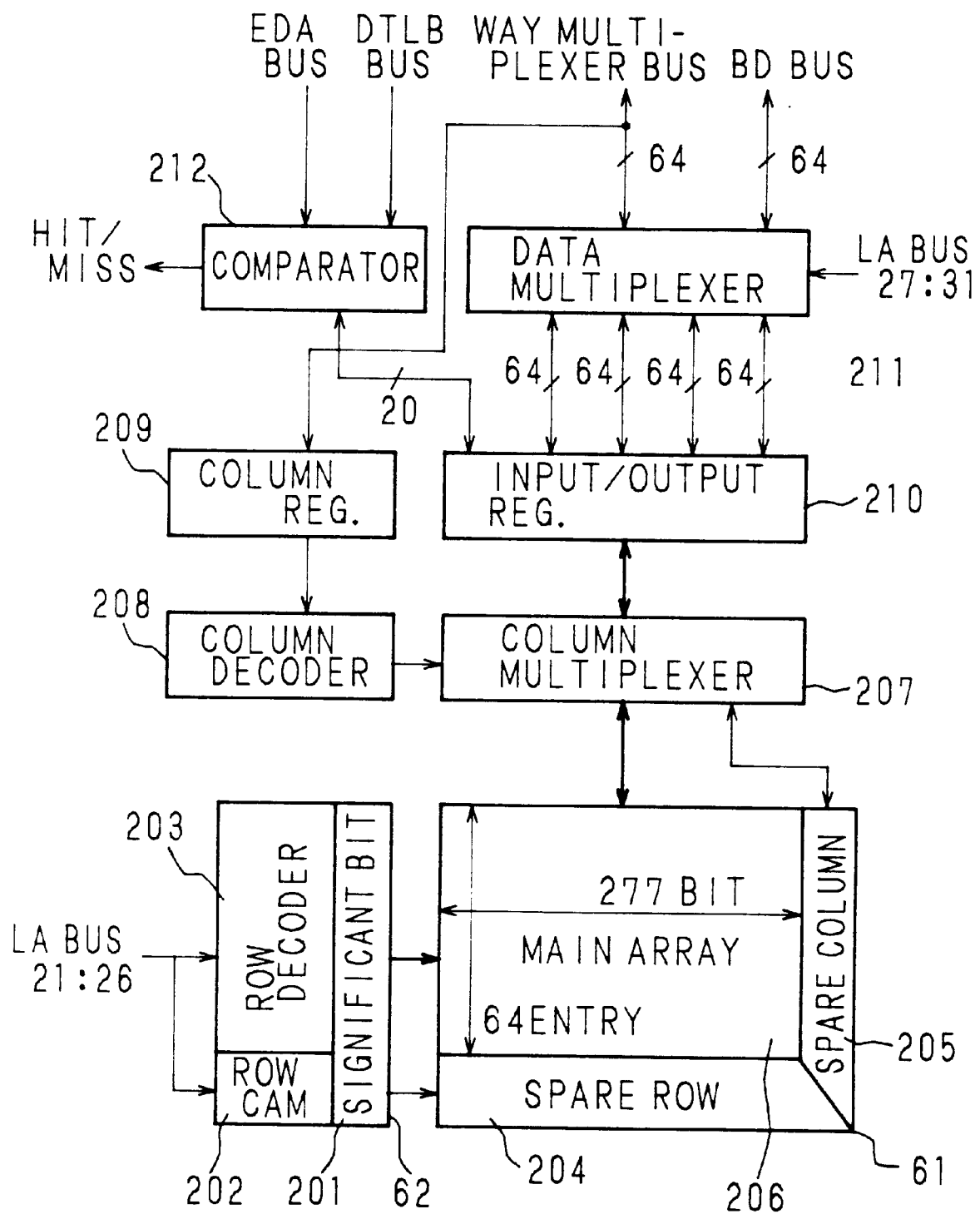
FIG. 25 is a block diagram showing a detailed configuration of way blocks of a data buffer of an operand access unit of a data processor of the present invention.

FIG. 25 is a block diagram showing a detailed configuration of the way blocks WAY0 220, WAY1 221, WAY2 222 and WAY3 223. The four way blocks WAY0 220, WAY1 221, WAY2 222 and WAY3 223 have the same configuration shown in FIG. 25.

Each way block is constituted by a memory unit 61 consisting of a spare column 205, a spare row 204 and a main array 206, a row decoding unit 62 which decodes the row address of the memory unit 61, a column multiplexer 207, an input/output register 210, a data multiplexer 211, a comparator 212, a column register 209 and a column decoder 208.

The main array 206 comprises 64 entries, each of the entries is 277 bits. Respective entries comprise, a tag unit consisting of a 1-bit valid bit and 20-bit tag address, and a data unit of 8×32 bytes=256 bits. On bit lines of the column corresponding to the valid bit, there are clocked NOR logic of the all entries, and the bit line corresponding to the valid bit outputs "0" in case "1" is not outputted from any entries, or any entries are not accessed, and outputs "1" when "1" is outputted from any one entry.

The data multiplexer 211 is a circuit for selecting the aimed 8 bytes or byte data therein from the way unit of 32-byte/block configuration.

In the comparator 212, the operation for comparing the tag address and the address inputted from the DTLB when the data buffer 52 operates as the data cache to judge hit/miss, and the operation for transferring the tag address transferred from the EDA bus 743 transferring the tag address transferred from the EDA bus 743 to the input/output register 210 are executed.

The spare row 204 is a redundant circuit for replacing a defective entry. The spare column 205 is a redundant circuit for replacing a defective bit. By the spare row 204 and the spare column 205, it is possible to operate as same as the case wherein there is no failure as the whole memory unit 61, even when the main array 286 is partly defective.

In the row decoding unit 62, a row decoder 203 which decodes the entry address of the main array 206, and a significant bit 201 and a row CAM 202 for accessing the spare row 204 by the address of the defective entry inputted from bits 21:27 of the LA bus 742 in case the defective entry is replaced with the spare row 204 are included.

The significant bit 201 indicates whether the entries of the main array 206 and the entry of the spare row 204 are valid or invalid. The row CAM 202 is an associative memory circuit, and judges whether the same address as the stored content is inputted from bits 21:27 of the LA bus 742 or not. In case there is not failure in the main array 206 and the spare row 204 is not used, all significant bits 201 corresponding to the 64 entries of the main array 206 show "1", and the significant bit corresponding to the spare row shows "0". When the main array 206 is partly defective and, therefore, the defective entry is replaced with the spare row 204, the significant bit 201 corresponding to the defective entry shows "0" and the significant bit 201 corresponding to the spare row 204 shows "1". At this time, the address of the defective entry is stored in the row CAM 202, thus when the defective entry address is inputted from bits 21:27 of the LA bus 742, in lieu of the defective entry of the main array 206 the spare row 204 is accessed.

The column register 209 holds the number of replaced column, in case a defective bit column of the main array 206 is replaced with the spare 205. The content of the column register 209 is decoded by the column decoder 208, and the column multiplexer 207 connects the spare 205 to the input/output register 210 in lieu of the defective column. The column multiplexer 207 is a selector for replacing the column of the main array 206 of the column number outputted from the column decoder 208 with the spare 205.

(6.2) "Operation at Data Reading for Logical Space"

Entry of the DTLB 1122 is specified by the low-order 4 bits in the high-order 20 bits which are subjected to the address translation in the logical address outputted from the integer operation unit 115 to the AA bus 731. From the DTLB 1122, four pairs of the logical address tag (16 bits) and the physical address (20 bits) are outputted because of 4-way construction of the DTLB 1122. At this time, when the high-order 16 bits of the logical address and one of the logical tags whose value is "1" are coincided, it is regarded that the DTLB 1122 has hit, thus the physical address corresponding to the logical address tag outputted from the DTLB 1122 is effective.

Also, in the case where the data buffer 52 operates as the built-in data cache, the entry of the data buffer 52 is specified by the low-order bits (12 bits) which indicate the page offset in the logical address and are not translated into the physical address. From the specified entry of the data buffer 52, four pairs of the physical address tag (20 bits) and data (32 bytes) are outputted. At this time, when effective physical address outputted from the DTLB 1122 and one of physical address tags whose value is "1" are coincided, it is regarded that the data buffer 52 has hit, thus the data corresponding to coincided physical address tag is effective.

In the case where the DTLB 1122 misses, by accessing an address translation table in the external memory of the data processor 100 of the present invention by the DAT mechanism 1121, the logical address is translated into the physical address and the entry of the DTLB 1122 is updated. After updating the entry of the DTLB 1122 entry, the DTLB 1122 is accessed again and hits.

In the case where the DTLB 1122 hits but the data buffer 52 which operates as the built-in data cache misses, the entry of the data buffer 52 is updated.

When the DTLB 1122 misses, the data buffer 52 does not hit even when the physical address read from the DTLB 1122 and the physical address tag of the data buffer 52. In this case, hit or miss of the data buffer 52 is judged after the DTLB 1122 entry has been updated and the DTLB 1122 has hit.

In the case where the data buffer 52 operates as the control space memory, the data buffer 52 is not accessed by accessing of the logical space. At accessing for the logical space, fetching of data from outside is executed by outputting the physical address translated by the DTLB 1122 to the outside of the data processor 100 of the present invention.

(6.3) "Operation at Data Writing for Logical Space"

Data write operation for the operand access unit 112 is similar to the data read operation with respect to accessing of the DTLB 1122.

In the case where the data buffer 52 operates as a built-in data cache, though the write operation of the data buffer 52 resembles the data read operation, data is not read out from the data buffer 52. In the data write operation, data are written in the entry which is hit when the data buffer52 has hit. At a miss, data are not written in the entry of the data buffer 52 and the entry is also not updated.

The data buffer 52 of the data processor 100 of the present invention operates as the data cache by write through controlling, and store data is outputted to the outside whenever the data buffer 52 hits or misses at data write operation.

In the case where the data buffer 52 operates as the memory for control space, the data buffer 52 is not accessed to the logical space at operand write operation. In this case, physical addresses translated in the DTLB 1122 are outputted to the outside of the data processor 100 of the present invention, and store data are outputted to the outside.

For storing processing of data to the outside, 2 clock cycles are necessary at a minimum, which is slower than the storing operation speed of the E stage 35 of the data processor 100 of the present invention. Accordingly, the store data is registered once in the store buffer together with the physical address and the logical address of the storing destination, and then the store buffer performs the storing operation. The PC value of the instruction which executes the storing operation and is registered in the store buffer is the PC value calculated in the PC generating unit 113.

(6.4) "Operation at Accessing control Space"

In the case where the data buffer 52 operates as a memory of the control space whose addresses are H'FFFFE000 through H'FFFFFFFF, accessing to the control space whose addresses are H'FFFFE000 through H'FFFFFFFF is carried out for the data buffer 52. When accessing the control space, address translation is not carried out, and the DTLB 1122 is not operated. And the data buffer 52 operates as the random access memory (RAM) whose address area is within H'FFFFE000 through H'FFFFFFFF. In the memory unit 61 of the data buffer 52, physical address tag and valid bit are not used but data unit is used. At reading operation, the content of the data buffer 52 is read according to the address inputted from the AA bus 731 through the input/output register 210 and the data multiplexer 211, and is transferred via the DD bus 710 to the integer operation unit 115. While, at writing operation, the data inputted via the DD bus 710 according to the address inputted from the AA bus 731 is written in the data buffer 52.

When accessing the control space whose address area is in the area excepting for the address H'FFFFE000 through H'FFFFFFFF, it is executed for the external of the data processor 100 of the present invention. Accessing the control space of either the data buffer 52 or the external is judged in the operand access unit 112 according to the high order 20 bits of the control space address.

(7) "External Access Operation"

(7.1) "Input/Output Signal Line"

Figure 26:
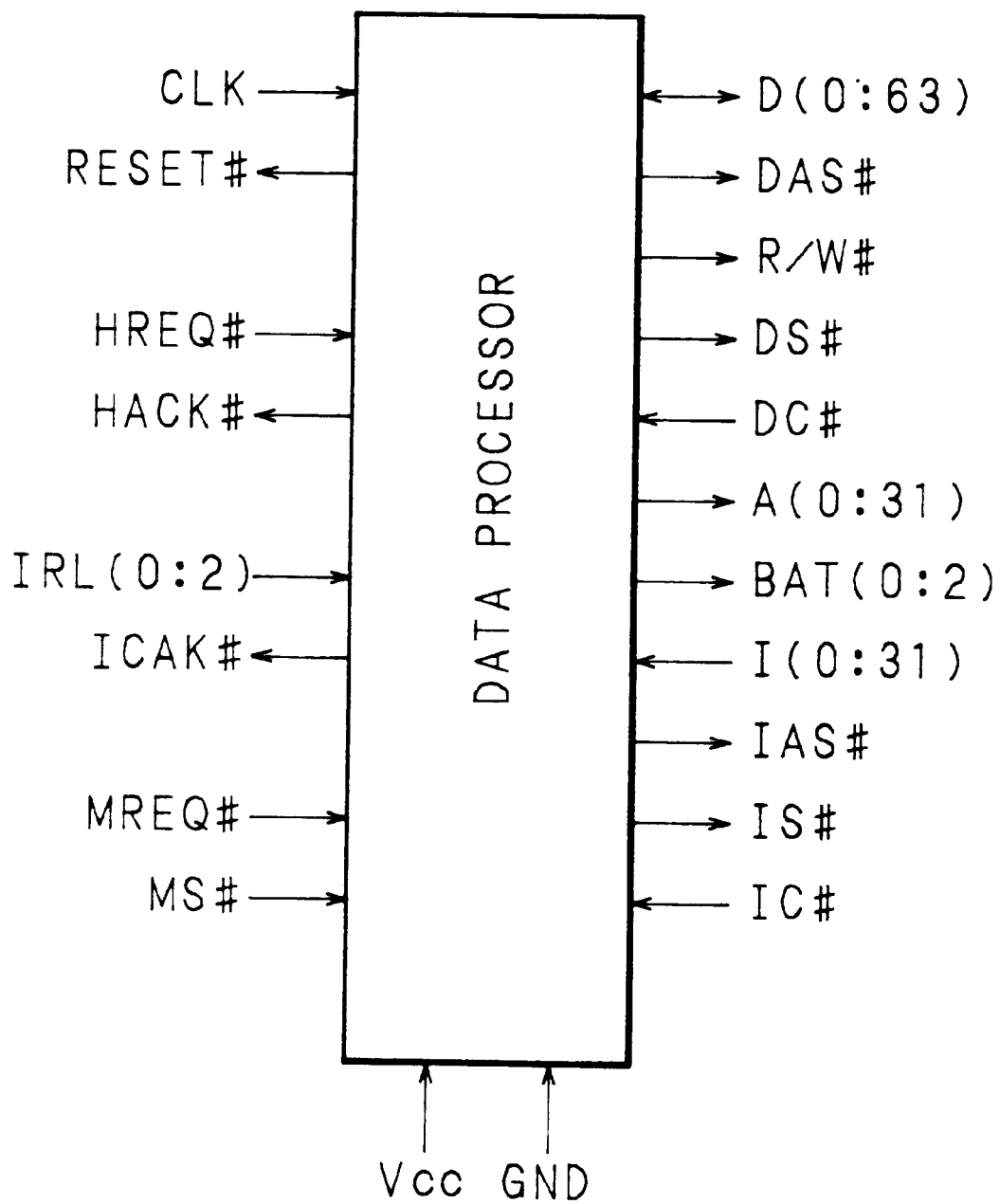
FIG. 26 is a schematic view showing input/output signals of a data processor of the present invention.

FIG. 26 is a schematic view showing the input/output signals of the data processor 100 of the present invention.

To and from the data processor 100 of the present invention, besides a power source Vcc and ground GND, 64 data pins (D0:63), 32 address pins (A0:31), 32 instruction pins (I0:31) and an input clock CLK, various control signals are inputted and outputted.

In both cases of instruction access and data access, the physical address is outputted to the address pins. The CLK is an external input clock which has a same frequency as an operation clock of the data processor 100 of the present invention.

Data address strobe DAS# (# represents a low active signal) indicates that the data address outputted to the address pin is effective.

Read write R/W# discriminates whether a bus cycle at the data pin is the input or output.

Data strobe DS# indicates that the data processor 100 of the present invention has completed data input preparation, or that data is outputted from the data processor 100 of the present invention.

DC# is a signal which notices the data processor 100 of the present invention to complete a data access cycle.

BAT(0:2) shows the kind of the address outputted to the address pin.

Instruction address strobe IAS# indicates that the instruction address outputted to the address pin is effective.

Instruction strobe IS# indicates that the data processor 100 of the present invention has completed instruction input preparation.

IC# is a signal which notices the data processor 100 of the present invention to allow completion of an instruction access cycle.

Hold request HREQ# is a signal which requests the bus to the data processor 100 of the present invention, and HACK# is a signal which indicates that the data processor 100 of the present invention has accepted the hold request HREQ# and given the bus to the other device.

IRL(0:2) is an external interruption request signal.

IACK# is a signal which indicates that the data processor 100 of the present invention has accepted the external interruption and performing an interruption vector access cycle.

MREQ# is a signal which requests address output right to the address bus, and MS# is a signal which indicates the timing that the data processor 100 of the present invention samples the value of the address pin for bus snoop.

(7.2) "Access of External Devices"

In an example of the system shown in FIG. 1 using the data processor 100 of the present invention, the data processor 100 of the present invention and the data caches 107, 108 are connected also at the BAT(0:2), DAS#, R/W#, DS#, DC#, MREQ# and MS# besides the data bus 102 connected to the data pins and the address bus 101 connected to the address pins. The data processor 100 of the present invention and the instruction cache 106 are connected also at the BAT(0:2), IAS#, IS# and IC# besides the instruction bus 103 and the address bus 101 connected to the instruction pins. The CLK is a clock fed to the entire system and deciding the basic timing of the system.

At the time of bus access in a standard access mode, the data access using the data bus 102 and the instruction access using the instruction bus 103 are performed respectively for the external memory having a sufficient high speed, at the speed of once in two cycles of the external input clock CLK.

At the time of bus access in a quad access mode, the data access using the data bus 102 and the instruction access using the instruction bus 102 are performed respectively for the external memory having a sufficient high speed, at the speed of four times in five cycles of the external input clock CLK.

The address bus 101 is utilized for accessing both the data caches 107, 108 and the instruction cache 106.

(8) "Various Control Registers"

(8.1) "Configuration of Processor Status Word (PSW)"

Figure 27:
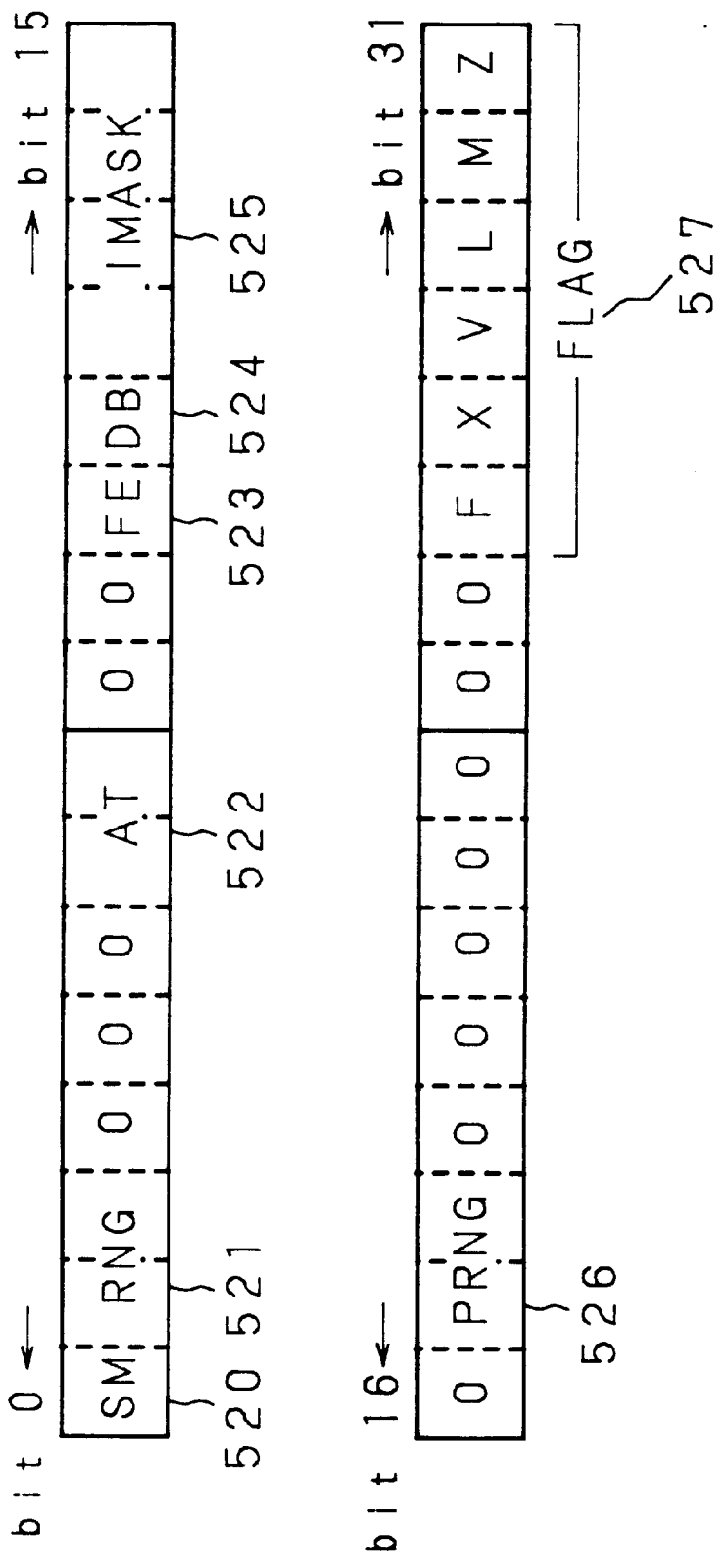
FIG. 27 is a schematic view showing a configuration of processor status word (PSW) in an integer operation unit of a data processor of the present invention.

FIG. 27 is a schematic view showing the configuration of the processor status word (PSW) in the integer operation unit 115 of the data processor 100 of the present invention.

In FIG. 27, an SM bit 520 shows whether a stack pointer for interruption processing is in use or a stack pointer for ring 0 is in use at the ring 0.

An RNG field 521 shows the ring number in which the program is executed.

An AT field 522 shows the modes of address translation and memory protection.

An FE bit 523 shows the starting mode of the floating-point operation trap.

A DB bit 524 shows the debug environment. When DB=1, a debug support mechanism is ON, and in the case where the debug condition is satisfied, the self-debug trap is started. When DB=0, the debug support mechanism is OFF, and the self debug trap is not started even when the debug condition is satisfied.

An IMASK field 525 shows the mask level of external interruption. When the external interruption having higher priority than the mask level shown by the IMASK field 525 is inputted to the data processor 100 of the present invention, the interruption processing is started.

A PRNG field 526 shows the ring number of the ring which had called the present ring.

An FLAG field 527 shows flags related to the integer operation.

The PSW is cleared to all zero at resetting. The PSW is also able to be read the content and to be written the designated content respectively by the LDC instruction and STC instruction.

(8.2) "Buffer Memory Control Register"

Figure 28:
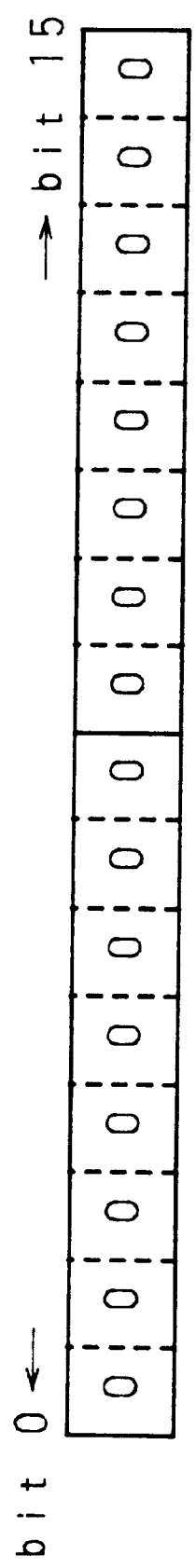
FIG. 28 is a schematic view showing a configuration of a buffer memory control register which controls a built-in data buffer and a built-in instruction cache of a data processor of the present invention.
Figure 28:
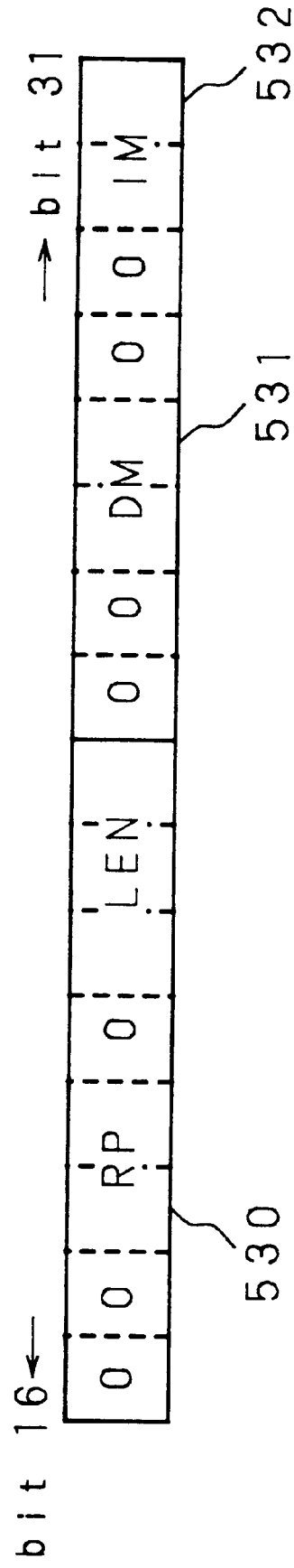

FIG. 28 is a schematic view to illustrate construction of a buffer memory control register which controls the built-in data buffer 52 and built-in instruction cache 51 of the data processor 100 of the present invention.

In FIG. 28, a DM field 531 designates a field to control the built-in data buffer 52, having the following meanings:

DM=00: do not operate the data buffer 52.

DM=01: operate the data buffer 52 as the memory of the control space whose addresses are H'FFFFE000 through H'FFFFFFFF.

DM=10: operate the data buffer 52 as the data cache of write-through control.

DM=11: not defied.

An RP field 530 designates a field to control while the data buffer 52 is operated as the data cache, having the following meanings:

RP=00: make the data cache frozen state.

RP=01: not defined.

RP=10: not defined.

RP=11: operate the data cache in the line size of 32 bytes.

An IM field 532 is a field to control the built-in instruction cache 51, having the following meanings:

IM=00: do not operate the instruction cache.

IM=01: not defined.

IM=10: not defined.

IM=11: operate the instruction cache as an instruction cache in the line size of 16 bytes.

(8.3) "Purge Specifying Register"

Figure 29:
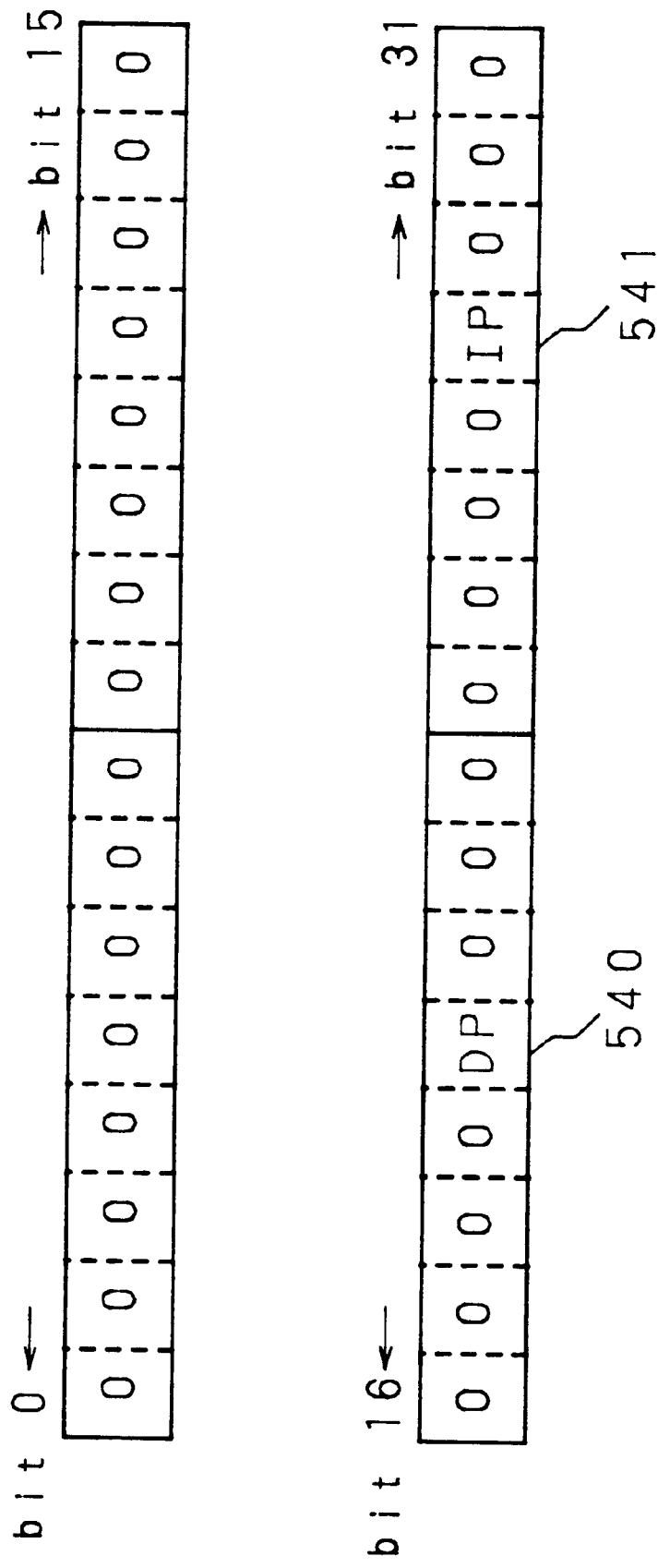
FIG. 29 is a schematic view showing a configuration of a purge designation register which controls the purging operation of a built-in data buffer and a built-in instruction cache of a data processor of the present invention.

FIG. 29 is a schematic view to illustrate construction of a purge specifying register to control purge operation of the built-in data buffer 52 and built-in instruction cache 51 of the data processor 100 of the present invention.

In the figure, each of DS bit 540 and IP bit 541 control the purge operation of the built-in data buffer 52 and built-in instruction cache 51, and when "1" is written in each of those bits, the content of the buffer memory corresponding to the each of those bits is purged. And when "0" is written in each of those bits, the content of the buffer memory corresponding to each of those bits is not to be purged. Further, when the value of this register is read, all the bits become "0".

DP=0: do not purge the whole entries of the data buffer 52.

DP=1: purge the whole entries of the data buffer 52.

IP=0: do not purge the whole entries of the built-in instruction cache 51.

IP=1: purge the whole entries of the built-in instruction cache 51.

(9) "Reset Sequence"

Figure 30:
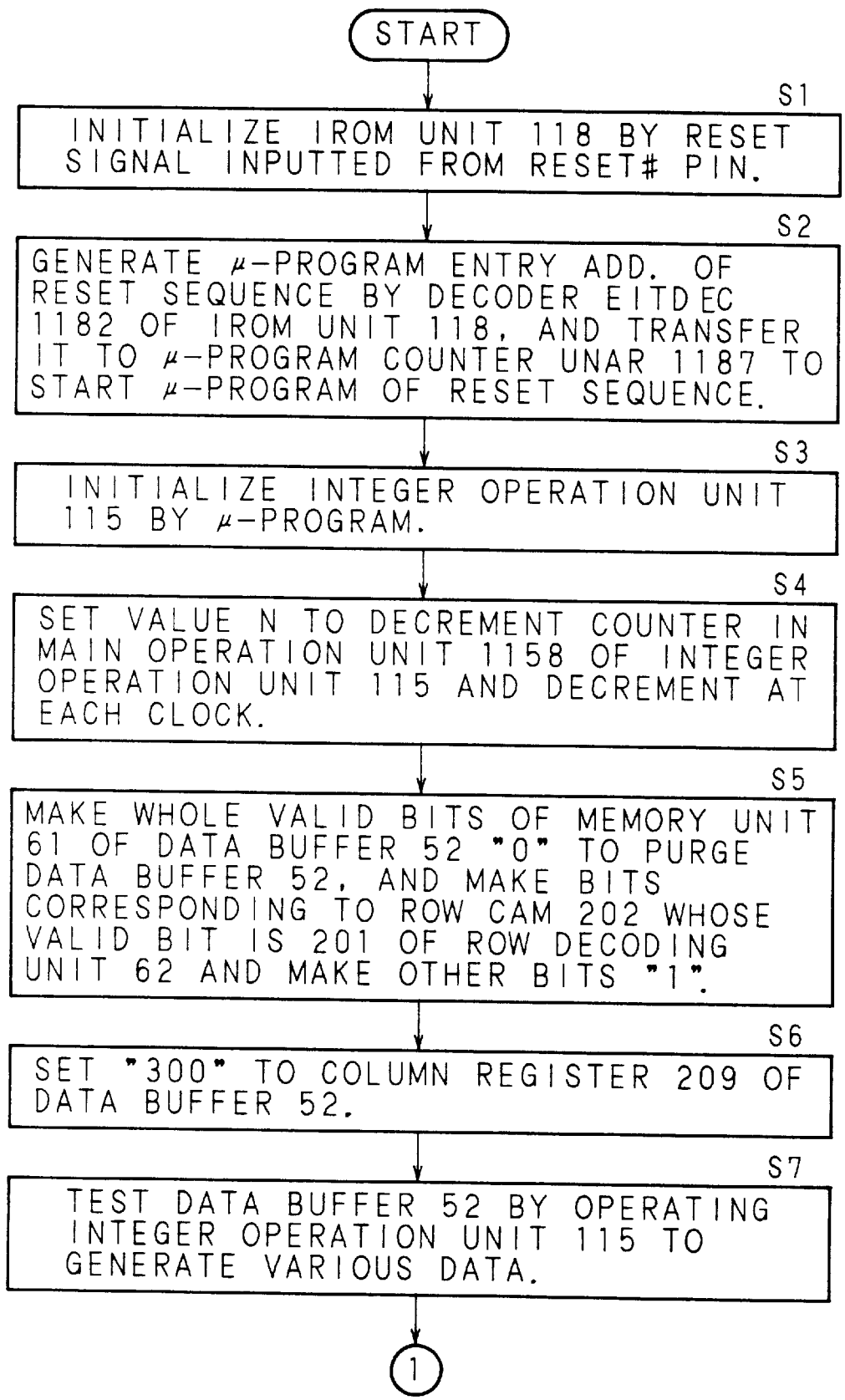
FIG. 30 is a flow chart of a reset sequence of a data processor of the present invention.
Figure 31:
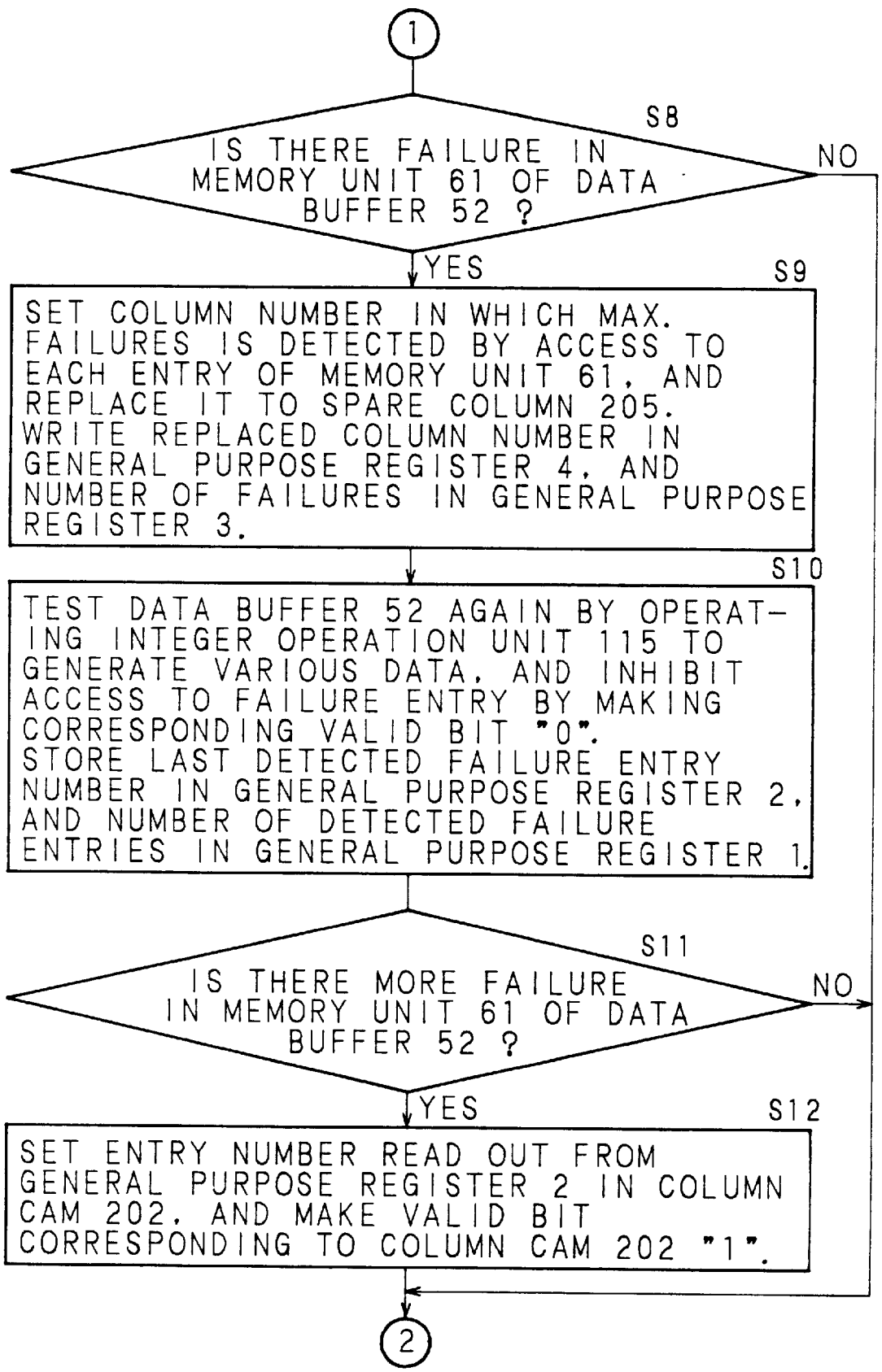
FIG. 31 is a flow chart of a reset sequence of a data processor of the present invention.
Figure 32:
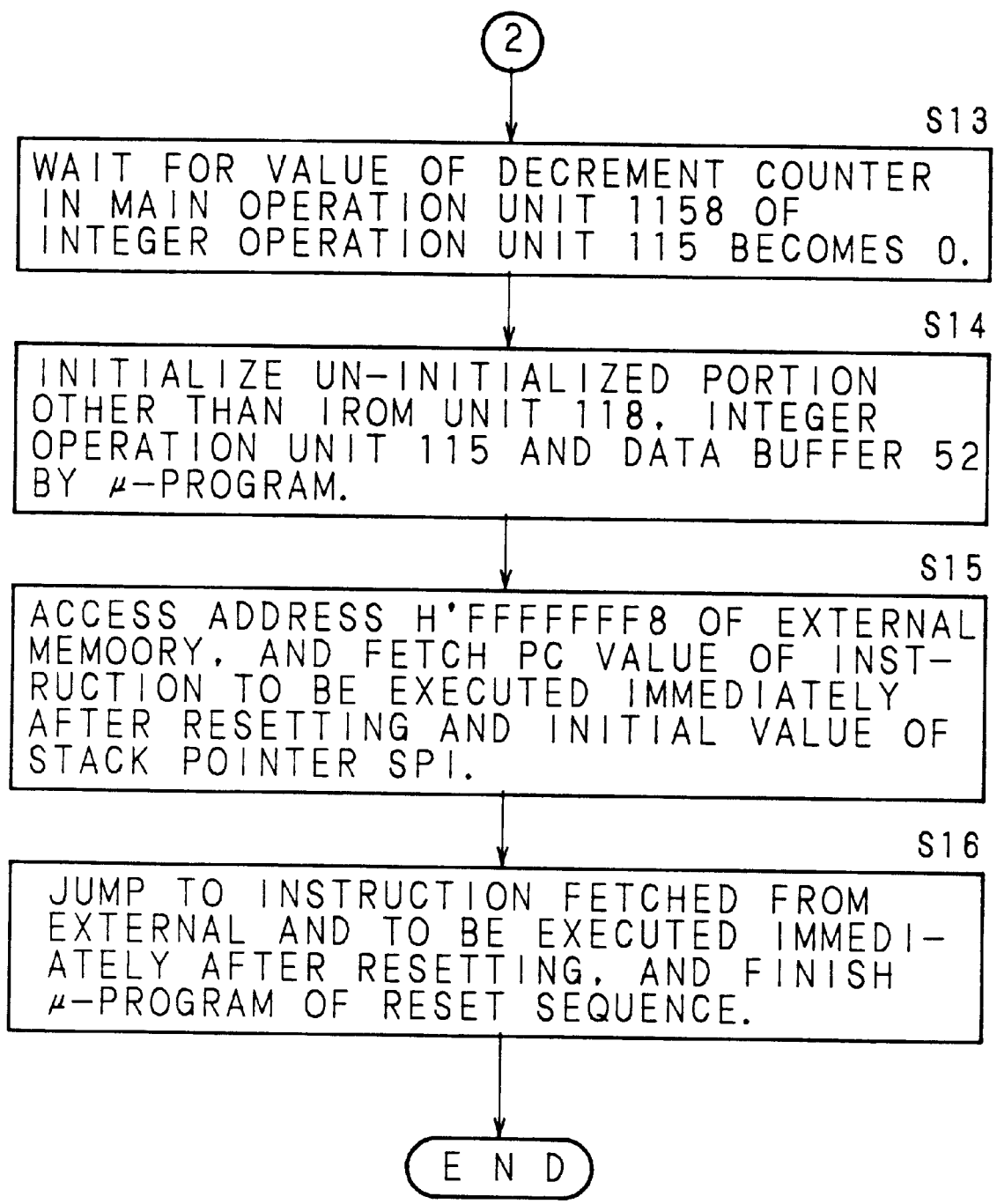
FIG. 32 is a flow chart of a reset sequence of a data processor of the present invention.

FIG. 30, FIG. 31 and FIG. 32 are flow charts showing reset sequence of the data processor 100 of the present invention.

When the RESET# pin is asserted and a reset interruption is inputted, the IROM unit 118 is initialized (Step S1).

The decoder EITDEC 1182 of the IROM unit 118 generates the entry address of the μ-program of the reset sequence, and by transferring its value to the μ-program UNAR1187, the μ-program processing of the reset sequence is started (Step S2).

Control signal is sent from the IROM unit 118 according to the μ-program to initialize the integer operation unit 115 (Step S3).

A max length value N of a reset processing time is set in a decrement counter in the main operation unit 1158 of the integer operation unit 115, and the decrement counter is decremented for every clock (Step S4). The max length value N may be a value above the logical clock of the max execution time, necessary for executing diagnosis of the data buffer 52 and relieving defective portions in the μ-program of the reset sequence.

All valid bits of the memory unit 61 of the data buffer 52 are invalidated "0" to purge the data buffer, and only the bit corresponding to the row CAM 202 in the significant bit 201 of the row decoding unit 62 is invalidated "0", other bits are validated "1" (Step S5). By this Step S5, the data buffer 52 is set to the state wherein the failure relief related to the row is not executed.

A value "300" which is larger than the number of columns of the memory unit 61 is set in the column register 209 of the data buffer 52, and all columns of the column multiplexer 207 are switched to the main array side (Step S6). By the Step S6, the data buffer 52 is set to the state wherein the failure relief related to the column is not executed.

By operating the integer operation unit 115 to generate various test data such as all "0" or all "1", and writing them into and read out from the data buffer 52, which is tested by checking whether write data and read data are coincided (Step S7). At this time, the defective column number and the number of defective bits are stored in a working register of the integer operation unit 115 as judging information of the column relief.

In the case of failure in the data buffer 52, the processing proceeds to Step S9, and in the case of no failure proceeds to Step S13 (Step S8).

In case the failure is found by the test in Step S8, the most defective column number is set in the column register 209 and replaced with the spare column 205, the replaced column number is stored in a general purpose register 4 and the number of failures of the replaced column is stored in a general purpose register 3 (Step S9). By the Step S9, the column with most defective bits is relieved by the spare column 205.

For the memory unit 61 whose defective column is relieved by operating the integer operation unit 115, same test as the Step S7 is executed again, and the significant bits 201 corresponding to the defective entry are all invalidated "0" to write the number of defective entry into a general purpose register 1, and the defective entry number which is found at last is written into a general purpose register 2 of the integer operation unit 115 (Step S10).

In case there is still failure in the data buffer 52 whose column has been relieved, the processing proceeds to Step S12, and in case there is no failure the processing proceeds to Step S13 (Step S11).

In case the failure is found by the test in Step S10, the entry number set in the register 2 is set in the spare row 204, and the significant bit 201 corresponding to the row CAM 202 is validated "1" to replace one of the defective entries with the spare row 204 (Step S12). Though one of the entries whose failure is found in Step S10 is relieved by the spare row 204, access to the other entries whose failure is found is forbidden by invalidation of the significant bit 20. And hence, in case the valid bit of the memory unit 61 stays as "0" and the data buffer 52 operates as the data cache, it never becomes the valid entry.

For fixing the number of execution clocks of the reset sequence independently of the content of diagnosis and relief of the data buffer 52, the processing proceeds to the next step after waiting the value of the decrement counter in a main operation unit 1158 of the integer operation unit 115 to become zero (Step S13).

By the μ-program, uninitialized portion except the data buffer 52 of the IROM unit 118 and the integer operation unit 115 are initialized (Step S14).

Immediately after accessing the resetting a "H'FFFFFFF8" address of the external memory, 8-byte data consisting of a PC value of the instruction to be executed and an initial value of the stack pointer SPI is fetched (Step S15). This access is the first access to other than the data processor 100 of the present invention, and the number of clocks till execution of this step after the input of the reset interruption is constant regardless of the content of failures and relief of the data buffer 52.

An initial value of the SPI fetched from the outside is set in the SPI, and the PC value of the instruction immediately after reset is transferred to the PC generating unit 113 and the instruction fetch unit 111 from the integer operation unit 115 to jump to the instruction which is to be executed immediately after reset, thereby the µ-program of the reset sequence is finished (Step S16).

As shown in the flow charts of FIG. 30, FIG. 31 and FIG. 32, the data processor 100 of the present invention diagnoses and replaces the defective portions of the data buffer 52 with a spare circuit at the reset processing by the µ-program. The reset sequence is always executed at the same number of clocks regardless of failures in the data buffer 52. Thus, the data processor 100 of the present invention is that, external product specifications is exactly same in the case where there is no failure in the data buffer 52, and the case where there is the failure which is relieved by the spare circuit. However, since information related to the failure found in the reset sequence is stored in the general purpose registers 1, 2, 3 and 4 which are independent of the product specifications, it is possible for the LSI designer to know the existent of true failure when necessary, by reading out the content of the registers by the program immediately after reset.

In the case of using the data buffer 52 as the data cache, when the failure still remains even when some failures in the data buffer are relieved partly by the spare circuit, since access to the defective entry is forbidden the valid bit of the entry can not be turned into "1". Thus, the data buffer 52 operates falsely as the data cache whose number of entries is reduced, and the data processor 100 of the present invention never operates incorrectly, though a data cache hit ratio differs from the case where there is no failure or the case where the failures are all relieved by the spare circuit.

(10) "Other embodiments of the present invention"

In the aforesaid embodiment, though an example where in one spare row 204 and one spare column 205 are provided in the data buffer 52 to relieve failures has been described, possibility of relief may improved by increasing the number of spare rows and spare columns. It is also possible to relieve the failures by providing the spare also possible to relieve the failures by providing the spare row and spare column for the built-in instruction cash 51 besides the data buffer 52.

In the aforesaid embodiment, though the processing time of the reset sequence is always fixed irrespective of existence of failures in the data buffer 52, by deciding the number of execution clocks of the reset sequence by the counter in the main operation unit of the integer operation unit 115, it may so described that the µ-program itself which executes reset processing is always completed at the same processing time irrespective of existence of the failures.

Furthermore, in the aforesaid embodiment, though an example wherein failures in the data buffer 52 are relieved in the reset sequence by using the µ-program has been described, the failures in the data buffer 52 may be relieved by the initialization program immediately after reset stored in a bootstrap memory of the system. In this case, though it is necessary to define the difference in operation due to existent of the failures in product specifications of the data processor unit, as a total system in which the data processor and the initialization program are combined, product specifications in unchanged as far as the failures can be relieved by the spare circuit.

In a first invention of a memory apparatus and a data processor of the present invention, failures in the memory can be relieved without physical processings such as a laser trimming. Since the failures are always diagnosed and relieved from the beginning during the reset operation which is always executed after turning on the power, a non-volatile memory is not necessary and it is also not necessary to operate in a special mode to relieve the failures. And hence, it is possible to relieve the failures simply at low cost.

In a second invention of a memory apparatus and a data processor of the present invention, since it operates entirely similarly in the case where there is no failures in all of the memory bits and in the case where a state of no failure is realized as the whole memory by relieving the failure, in either cases products are good to meet product specifications and rejects are few. In case the data processor is realized on a single chip LSI, since it was difficult to repair the defective memory partially, the effect of the present invention is linked directly to improvement of yields of the LSI, and it is specially effective in providing the data processor at low cost.

In a third invention of a memory apparatus and a data processor of the present invention, the result of failure relief can be read out by the program after reset, thus it is possible to know a potential trend of failures to further improve yields of the data processors which are to be manufactured thereafter. Since initial values are not defined as product specifications for general purpose registers, the data processors whose failures are relieved are all good products as the product specifications regardless of the content of failure relief information, and there is no deterioration in yields of the products due to the failure relief.

In a fourth invention of a memory apparatus and a data processor of the present invention, the processing time of the reset routine can be fixed while giving freedom to the content of µ-program, thus the failure relief can be accomplished by the highly efficient and compact µ-program.

In a fifth invention of a memory apparatus and a data processor of the invention, even in the case where the defective entries are more than the number of reserved spare entries, though there may be a difference in the number of usable entries, the data cache which always operates correctly can be realized in good yield as the data cache and the whole system can be realized at low cost.

In a sixth invention of a memory apparatus and a data processor of the present invention, it is possible to relieve failures in the memory unit by replacing the defective column with an inexpensive circuit, without physical processing such as a laser trimming or using a non-volatile memory.

In a seventh invention of a memory apparatus and a data processor of the present invention, it is possible to relieve failures in the memory unit by replacing the defective column with an inexpensive circuit, without physical processing such as a laser trimming or using a non-volatile memory.

As this invention may be embodied in several forms without departing from the spirit of essential characteristics thereof, the present embodiment is therefore illustrative and riot restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A memory apparatus, comprising:
   a) a buffer memory mechanism, having:
      a memory unit comprising a plurality of entries and a spare entry, each entry including a valid bit, a tag field and a data field, said valid bits, tag fields and data fields each having a value,
      a control memory connected to said memory unit, wherein said control memory stores values of access enabling bits corresponding to each of said entries of said memory unit, and
      a hit or miss judging unit which determines whether said data field value of one of said entries is valid or invalid according to said associated valid bit and tag field values when said corresponding access enabling bit is a first value, and determines that one of said entries is invalid irrespective of said data field value when said corresponding access enabling bit is a second value;
   b) an operation mechanism connected to said buffer memory mechanism, having a register and an operation circuit, said operation mechanism capable of writing data into and reading data from said buffer memory mechanism for operation between the data; and
   c) a diagnosis circuit, said diagnosis circuit including:
      means for diagnosing failures in said entries of said memory unit,
      means for setting said access enabling bits corresponding to the entries in which no failure is diagnosed to said first value, and for setting said access enabling bits corresponding to the entries in which a failure is diagnosed to said second value, so as to invalidate said entries in which a failure is diagnosed; and
      means for replacing one of said entries in which a failure is diagnosed with said spare entry.

2. A data processor, comprising:
   a) a buffer memory mechanism, having:
      a memory unit comprising a plurality of entries and a spare entry each entry, including a valid bit, a tag field and a data field, and
      a control memory connected to said memory unit, wherein said control memory stores values of access enabling bits corresponding to each of said entries of said memory unit, and
   b) an operation mechanism connected to said buffer memory mechanism, having a register and an operation circuit, said operation mechanism capable of writing data into and reading data from said buffer memory mechanism for operation between the data;
      wherein said operation mechanism includes:
         means for diagnosing failures in the entries of said memory unit,
         means for invalidating said entries in which a failure is diagnosed, by setting said access enabling bits corresponding to said entries in which no failure is diagnosed to a first value, and by setting said access enabling bits corresponding to said entries in which a failure is diagnosed to a second value; and
         means for replacing one of said entries in which a failure is diagnosed with said spare entry.

3. A method of relieving failures in a memory unit having a plurality of entries and a spare entry, each entry including a valid bit, a tag field and a data field, said memory unit coupled to a control memory, wherein said control memory stores values of access enabling bits corresponding to each of said entries of said memory unit, the method comprising the steps of:
   diagnosing failures in the entries of said memory unit;
   invalidating entries in which a failure is diagnosed; and
   replacing one of said entries in which a failure is diagnosed with said spare entry.

4. The method of claim 3, wherein said step of invalidating entries in which a failure is diagnosed includes the steps of:
   setting said access enabling bits corresponding to said entries in which no failure is diagnosed to a first value; and
   setting said access enabling bits corresponding to said entries in which a failure is diagnosed to a second value.

* * * * *